US012796387B2

(12) United States Patent
Mitsuyoshi et al.

(10) Patent No.: US 12,796,387 B2
(45) Date of Patent: Nov. 10, 2026

(54) SUBSTRATE PROCESSING APPARATUS

(71) Applicant: SCREEN Holdings Co., Ltd., Kyoto (JP)

(72) Inventors: Ichiro Mitsuyoshi, Kyoto (JP); Tomoki Inoue, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 43 days.

(21) Appl. No.: 19/047,170

(22) Filed: Feb. 6, 2025

(65) Prior Publication Data

US 2025/0259874 A1 Aug. 14, 2025

(30) Foreign Application Priority Data

Feb. 8, 2024 (JP) ................................ 2024-018107

(51) Int. Cl.

| | |
|---|---|
| ***H10P 72/50*** | (2026.01) |
| ***B08B 3/04*** | (2006.01) |
| ***H10P 72/30*** | (2026.01) |

(52) U.S. Cl.

CPC ................ *H10P 72/50* (2026.01); *B08B 3/04* (2013.01); *H10P 72/3211* (2026.01)

(58) Field of Classification Search

CPC .. H10P 72/50; H10P 72/3211; H10P 72/3302; H10P 72/3412; H10P 72/0456; H10P 72/3312; H10P 72/3402; B08B 3/04

See application file for complete search history.

(56) References Cited

U.S. PATENT DOCUMENTS 7,260,448 B2 * 8/2007 Goto ................... H10P 72/0606 700/218
9,624,046 B2 * 4/2017 Mitsuyoshi ............ B65G 25/04
(Continued)

FOREIGN PATENT DOCUMENTS

EP 2584597 B1 * 8/2019 .......... H10P 72/3412
JP H-07-183357 * 7/1995
(Continued)

OTHER PUBLICATIONS

JP H-07-183357 translation (Year: 1995).*
Office Action dated Oct. 31, 2025 for corresponding Korean Patent Application No. 10-2025-0016100.

*Primary Examiner* — Michael E Barr
(74) *Attorney, Agent, or Firm* — OSTROLENK FABER LLP

(57) ABSTRACT

A substrate processing apparatus including: an attitude changing mechanism configured to change attitudes of the substrates between a horizontal holding attitude and a vertical holding attitude; a pusher mechanism including a pusher member configured to combine a second substrate group and a first substrate group to hold a plurality of the substrates aligned at a narrow interval; a pitch converter configured to receive the plurality of the substrates aligned at the narrow interval and align, at a narrow pitch, the plurality of the substrates aligned; a substrate processor configured to collectively process the plurality of the substrates aligned at the narrow pitch; and a main transport mechanism configured to collectively transport the plurality of the substrates aligned at the narrow pitch to the substrate processor, in which the pitch converter is disposed on the main transport mechanism side of the pusher mechanism.

21 Claims, 30 Drawing Sheets

(56) References Cited

U.S. PATENT DOCUMENTS

| | | | | |
|---|---|---|---|---|
| 10,395,961 | B2 * | 8/2019 | Miyamoto .......... | H10P 72/0608 |
| 2010/0068014 | A1 | 3/2010 | Mitsuyoshi et al. | |

FOREIGN PATENT DOCUMENTS

| | | | |
|---|---|---|---|
| JP | 2003-174075 | A | 6/2003 |
| JP | 2007-242980 | A | 9/2007 |
| JP | 2010-093230 | A | 4/2010 |
| KR | 10-2010-0031458 | A | 3/2010 |
| KR | 10-2013-0103382 | A | 9/2013 |

* cited by examiner

SUBSTRATE PROCESSING APPARATUS

BACKGROUND OF THE INVENTION

(1) Field of the Invention

The present invention relates to a substrate processing apparatus processing substrates. Examples of the substrates include a semiconductor substrate, a substrate for a flat panel display (FPD), a glass substrate for a photomask, a substrate for an optical disk, a substrate for a magnetic disk, a ceramic substrate, and a substrate for a solar cell. Examples of the FPD include a liquid crystal display and an organic electroluminescence (EL) display.

(2) Description of the Related Art

Conventionally, there has been known a substrate processing apparatus that collectively immerses a plurality of substrates in a vertical attitude in a processing liquid for processing. The substrate processing apparatus includes an attitude changing mechanism and a pusher (see, for example, JP 2010-93230 A). The attitude changing mechanism changes attitudes of the substrates between a horizontal attitude and a vertical attitude. The pusher can deliver the plurality of substrates in the vertical attitude to and from the attitude changing mechanism by vertical movement of a lifting retainer.

The pusher combines a substrate group held by the attitude changing mechanism and a substrate group delivered in advance from the attitude changing mechanism to hold the plurality of substrates by the lifting retainer. The combination of the substrate groups performed by the lifting retainer is one kind of pitch conversion. The plurality of substrates held by the lifting retainer is aligned, for example, at a half pitch that is half a substrate holding pitch in a carrier. A used amount of the processing liquid can be reduced by collectively processing the substrates aligned at the half pitch.

SUMMARY OF THE INVENTION

In order to further reduce the used amount of the processing liquid (a chemical liquid and a cleaning liquid) in the substrate processing apparatus, there is a demand for aligning the plurality of substrates at a narrow pitch narrower than the half pitch and collectively processing the plurality of substrates aligned at the narrow pitch.

In such case, it is necessary to combine the substrate group held by the attitude changing mechanism and the substrate group delivered in advance from the attitude changing mechanism to hold the plurality of substrates by the lifting retainer, and then further perform the pitch conversion. Therefore, the time required for the pitch conversion becomes further longer. Accordingly, the conventional apparatus has a problem that the substrates cannot be efficiently processed.

The present invention has been made in view of such circumstances, and an object thereof is to provide a substrate processing apparatus that can efficiently process substrates.

In order to achieve such object, the present invention has the following configuration.

In other words, the substrate processing apparatus according to the present invention is a substrate processing apparatus processing substrates, the substrate processing apparatus including:

an attitude changing mechanism configured to perform attitude changing between a horizontal holding attitude in which a substrate group of the substrates in a horizontal attitude aligned at an equal pitch in a vertical direction is held and a vertical holding attitude in which a substrate group of the substrates in a vertical attitude aligned at the equal pitch in a horizontal direction is held;

a pusher mechanism including a pusher member configured to combine a second substrate group in the vertical holding attitude held by the attitude changing mechanism and a first substrate group in the vertical holding attitude delivered in advance from the attitude changing mechanism to hold a plurality of the substrates aligned at a narrow interval narrower than the equal pitch;

a pitch converter configured to receive the plurality of the substrates aligned at the narrow interval, and align, at a narrow pitch narrower than the equal pitch, the plurality of the substrates aligned at the narrow interval;

a substrate processor configured to collectively process the plurality of the substrates aligned at the narrow pitch; and a main transport mechanism configured to collectively transport the plurality of the substrates aligned at the narrow pitch to the substrate processor, in which the pitch converter is disposed on the main transport mechanism side of the pusher mechanism.

In the substrate processing apparatus according to the present invention, the pusher mechanism combines the second substrate group in the vertical holding attitude held by the attitude changing mechanism and the first substrate group in the vertical holding attitude delivered in advance from the attitude changing mechanism to hold the plurality of the substrates aligned at the narrow interval narrower than the equal pitch. A process of making the plurality of the substrates aligned at the narrow interval from the substrate group at the equal pitch is referred to as first-stage pitch conversion. The pitch converter receives the plurality of the substrates aligned at the narrow interval, and aligns, at the narrow pitch narrower than the equal pitch, the plurality of the substrates aligned at the narrow interval. A process of making the plurality of the substrates aligned at the narrow pitch from the plurality of the substrates aligned at the narrow interval is referred to as second-stage pitch conversion. In the present invention, the second-stage pitch conversion is not performed by the pusher mechanism, but is performed by the pitch converter disposed on the main transport mechanism side of the pusher mechanism. In other words, the second-stage pitch conversion is performed at a position where throughput is not reduced. This makes it possible to efficiently process the substrates.

Further, in the substrate processing apparatus according to the present invention, it is preferable that the plurality of the substrates aligned at the narrow interval is a plurality of the substrates aligned at an unequal pitch where a first interval narrower than the equal pitch and a second interval narrower than the equal pitch and wider than the first interval are alternately repeated, the equal pitch is equal to a sum of the first interval and the second interval, and the plurality of the substrates aligned at the narrow pitch is a plurality of the substrates aligned at the first interval repeated. In this way, the second-stage pitch conversion is performed slowly because the second interval at the unequal pitch formed by the first-stage pitch conversion is narrowed to the first interval. Accordingly, the second-stage pitch conversion can be slowly performed at a position where throughput of the first-stage pitch conversion is not reduced.

Further, in the substrate processing apparatus according to the present invention, it is preferable that the plurality of the substrates aligned at the narrow interval is a plurality of the substrates aligned at a first narrow pitch narrower than the equal pitch, and the plurality of the substrates aligned at the narrow pitch is a plurality of the substrates aligned at a second narrow pitch narrower than the first narrow pitch. In this way, the second-stage pitch conversion is performed slowly because the first narrow pitch formed by the first-stage pitch conversion is narrowed to the second narrow pitch. However, the second-stage pitch conversion is performed at the position where the throughput is not reduced. This makes it possible to efficiently process the substrates.

Further, in the substrate processing apparatus according to the present invention, it is preferable that the substrate processing apparatus includes:

a traverse mechanism configured to cause a traverse holder collectively holding the plurality of the substrates aligned at the narrow interval and received from the pusher member to traverse along a traverse path between a substrate transfer position and a substrate delivery position, in which the substrate transfer position is a position where the plurality of the substrates aligned at the narrow interval is collectively delivered between the pusher member and the traverse holder, the substrate delivery position is a position where the plurality of the substrates aligned at the narrow pitch is collectively delivered between the pitch converter and the main transport mechanism, the pitch converter moves up and down along the substrate delivery position to deliver the plurality of the substrates aligned at the narrow interval to and from the traverse holder, and the pitch converter is disposed at the substrate delivery position. This makes it possible to separate a position of the pitch converter that performs the second-stage pitch conversion from the pusher mechanism that performs the first-stage pitch conversion. In other words, the second-stage pitch conversion is performed at the position where the throughput of the first-stage pitch conversion is not reduced. This makes it possible to efficiently process the substrates.

Further, in the substrate processing apparatus according to the present invention, the pitch converter is preferably disposed below the traverse path. This makes it possible to perform an operation in the traverse holder and an operation in the pitch converter at the same time, partially at the same time, or at approximately the same timing.

Further, in the substrate processing apparatus according to the present invention, it is preferable that the substrate processing apparatus includes:

a traverse mechanism configured to cause a traverse holder collectively holding the plurality of the substrates aligned at the narrow interval and received from the pusher member to traverse along a traverse path between a substrate transfer position and a substrate delivery position; and an intermediary mechanism configured to raise and lower, along the substrate delivery position, an intermediary holder collectively holding the plurality of the substrates aligned at the narrow pitch, in which the substrate transfer position is a position where the plurality of the substrates aligned at the narrow interval is collectively delivered between the pusher member and the traverse holder, the substrate delivery position is a position where the plurality of the substrates aligned at the narrow pitch is collectively delivered between the intermediary holder and the main transport mechanism, the pitch converter moves up and down along the substrate delivery position to deliver the plurality of the substrates aligned at the narrow interval to and from the traverse holder, the intermediary holder moves up and down along the substrate delivery position to deliver the plurality of the substrates aligned at the narrow pitch to and from the pitch converter, and the pitch converter is disposed at the substrate delivery position. This makes it possible to separate the position of the pitch converter that performs the second-stage pitch conversion from the pusher mechanism that performs the first-stage pitch conversion. In other words, the second-stage pitch conversion is performed at the position where the throughput of the first-stage pitch conversion is not reduced. This makes it possible to efficiently process the substrates.

Further, in the substrate processing apparatus according to the present invention, the pitch converter is preferably disposed at a position below the intermediary holder. This makes it possible to perform an operation in the pitch converter and an operation in the intermediary holder at the same time, partially at the same time, or at approximately the same timing.

Further, in the substrate processing apparatus according to the present invention, the pitch converter is preferably disposed below the traverse path. This makes it possible to perform the operation in the traverse holder, the operation in the pitch converter, and the operation in the intermediary holder at the same time, partially at the same time, or at approximately the same timing.

Further, in the substrate processing apparatus according to the present invention, it is preferable that the substrate processing apparatus includes:

a first traverse mechanism configured to cause, to traverse along a first traverse path, a first traverse holder collectively holding the plurality of the substrates aligned at the narrow interval and received from the pusher member; and a second traverse mechanism configured to cause, to traverse along a second traverse path, a second traverse holder collectively holding the plurality of the substrates aligned at the narrow interval and to be delivered to the pusher member, in which the pitch converter includes:

a first pitch converter configured to receive the plurality of the substrates aligned at the narrow interval, and align, at the narrow pitch, the plurality of the substrates aligned at the narrow interval; and a second pitch converter configured to receive the plurality of the substrates aligned at the narrow pitch, and align, at the narrow interval, the plurality of the substrates aligned at the narrow pitch. The two-stage pitch conversion is performed separately for the pusher mechanism and the pitch converter. In addition, the pitch conversion is performed separately for the first pitch converter and the second pitch converter before and after the processing in the substrate processor. In this way, the throughput is not reduced. This makes it possible to efficiently process the substrates.

Further, in the substrate processing apparatus according to the present invention, it is preferable that the first traverse path is a path between a substrate transfer position and a substrate carry-in position, the second traverse path is a path between a substrate carry-out position and a substrate transfer position, the first traverse path and the second traverse path are provided at positions apart from each other in a lateral direction, the first pitch converter is disposed at the substrate carry-in position, and the second pitch converter is disposed at the substrate carry-out position. The first traverse path and the second traverse path are provided at positions apart from each other in the lateral direction. Therefore, a height of the substrate processing apparatus is suppressed. The first pitch converter and the second pitch converter perform the pitch conversion at positions apart from each other in the lateral direction. In this way, since the first pitch converter and the second pitch converter do not interfere with each other, respective pitch conversion can be performed at the same time, partially at the same time, or at approximately the same timing. Therefore, the throughput can be improved. As a result, the substrates can be efficiently processed.

Further, in the substrate processing apparatus according to the present invention, it is preferable that the first pitch converter receives the plurality of the substrates aligned at the narrow interval from the first traverse holder to carry the plurality of the substrates aligned at the narrow pitch into the main transport mechanism. This makes it possible to efficiently carry the substrates into the first traverse holder, the first pitch converter, and the main transport mechanism.

Further, it is preferable that the substrate processing apparatus according to the present invention includes:

an intermediary mechanism configured to raise, along the substrate carry-in position, an intermediary holder collectively holding the plurality of the substrates aligned at the narrow pitch, in which the substrate transfer position is a position where the plurality of the substrates aligned at the narrow interval is collectively carried from the pusher member to the first traverse holder, the substrate carry-in position is a position where the plurality of the substrates aligned at the narrow pitch is collectively carried from the intermediary holder to the main transport mechanism, the first pitch converter moves up along the substrate carry-in position to carry in the plurality of the substrates aligned at the narrow interval from the first traverse holder, the intermediary holder moves up along the substrate carry-in position to carry in the plurality of the substrates aligned at the narrow pitch from the pitch converter, and the first pitch converter is disposed at the substrate carry-in position. This makes it possible to efficiently perform the pitch conversion by the first pitch converter during substrate carry-in processing performed in the first traverse holder, the first pitch converter, the intermediary holder, and the main transport mechanism.

Further, in the substrate processing apparatus according to the present invention, the first pitch converter is preferably disposed below the intermediary holder. This makes it possible to perform an operation in the first pitch converter and an operation in the intermediary holder at the same time, partially at the same time, or at approximately the same timing.

Further, in the substrate processing apparatus according to the present invention, the first pitch converter is preferably disposed below the first traverse path. This makes it possible to perform an operation in the first traverse holder, an operation in the first pitch converter and an operation in the intermediary holder at the same time, partially at the same time, or at approximately the same timing.

Further, in the substrate processing apparatus according to the present invention, it is preferable that the second pitch converter receives the plurality of the substrates aligned at the narrow pitch from the main transport mechanism to carry out the plurality of the substrates aligned at the narrow interval to the second traverse holder, and is disposed at the substrate carry-out position. This makes it possible to efficiently perform the pitch conversion by the second pitch converter during substrate carry-out processing.

Further, in the substrate processing apparatus according to the present invention, the second pitch converter is preferably disposed below the second traverse path. This make it possible to perform an operation in the second pitch converter and an operation in the second traverse holder at the same time, partially at the same time, or at approximately the same timing.

Further, in the substrate processing apparatus according to the present invention, the second pitch converter is preferably disposed above the first pitch converter. This makes it possible to perform the operation in the first pitch converter and the operation in the second pitch converter at the same time, partially at the same time, or at approximately the same timing.

Further, in the substrate processing apparatus according to the present invention, the second pitch converter is preferably disposed above the intermediary holder. This makes it possible to perform the operation in the first pitch converter, the operation in the intermediary holder, and the operation in the second pitch converter at the same time, partially at the same time, or at approximately the same timing.

Further, in the substrate processing apparatus according to the present invention, it is preferable that the first traverse path and the second traverse path cross each other at a predetermined angle, the pusher mechanism is disposed at a position where the first traverse path and the second traverse path cross each other at the predetermined angle, and the first pitch converter and the second pitch converter are disposed apart from each other at the predetermined angle. This makes it possible to separate the first pitch converter and the second pitch converter from each other at positions where interference is less likely to occur.

Further, in the substrate processing apparatus according to the present invention, it is preferable that the substrate processing apparatus includes:

a traverse mechanism configured to cause a traverse holder collectively holding the plurality of the substrates aligned at the narrow interval and received from the pusher member to traverse along a traverse path between a substrate transfer position and a substrate delivery position, in which the pitch converter is included in the traverse mechanism. This makes it possible to suppress the height of the substrate processing apparatus as the pitch converter is integrated with the traverse mechanism.

Further, in the substrate processing apparatus according to the present invention, it is preferable that the first pitch converter is included in the first traverse mechanism, and the second pitch converter is included in the second traverse mechanism. This makes it possible to suppress the height of the substrate processing apparatus as the first pitch converter is integrated with the first traverse mechanism and the second pitch converter is integrated with the second traverse mechanism.

With the substrate processing apparatus according to the present invention, it is possible to perform other processing before or after the processing in the substrate processor while performing the pitch conversion. This makes it possible to efficiently process the substrates.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS DETAILED DESCRIPTION

Example 1

Figure 1:
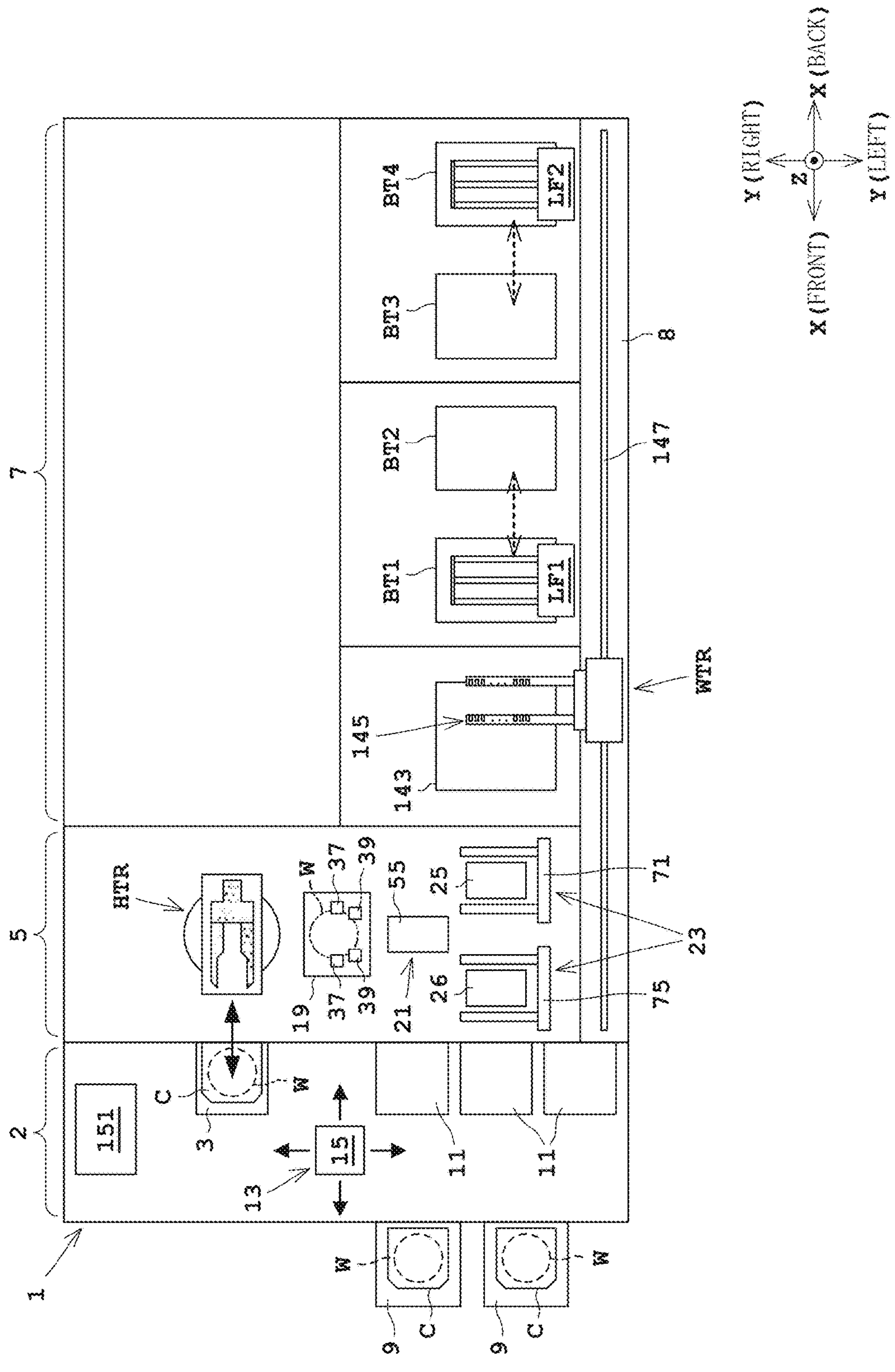
FIG. 1 is a plan view illustrating a schematic configuration of a substrate processing apparatus according to Example 1.
Figure 2:
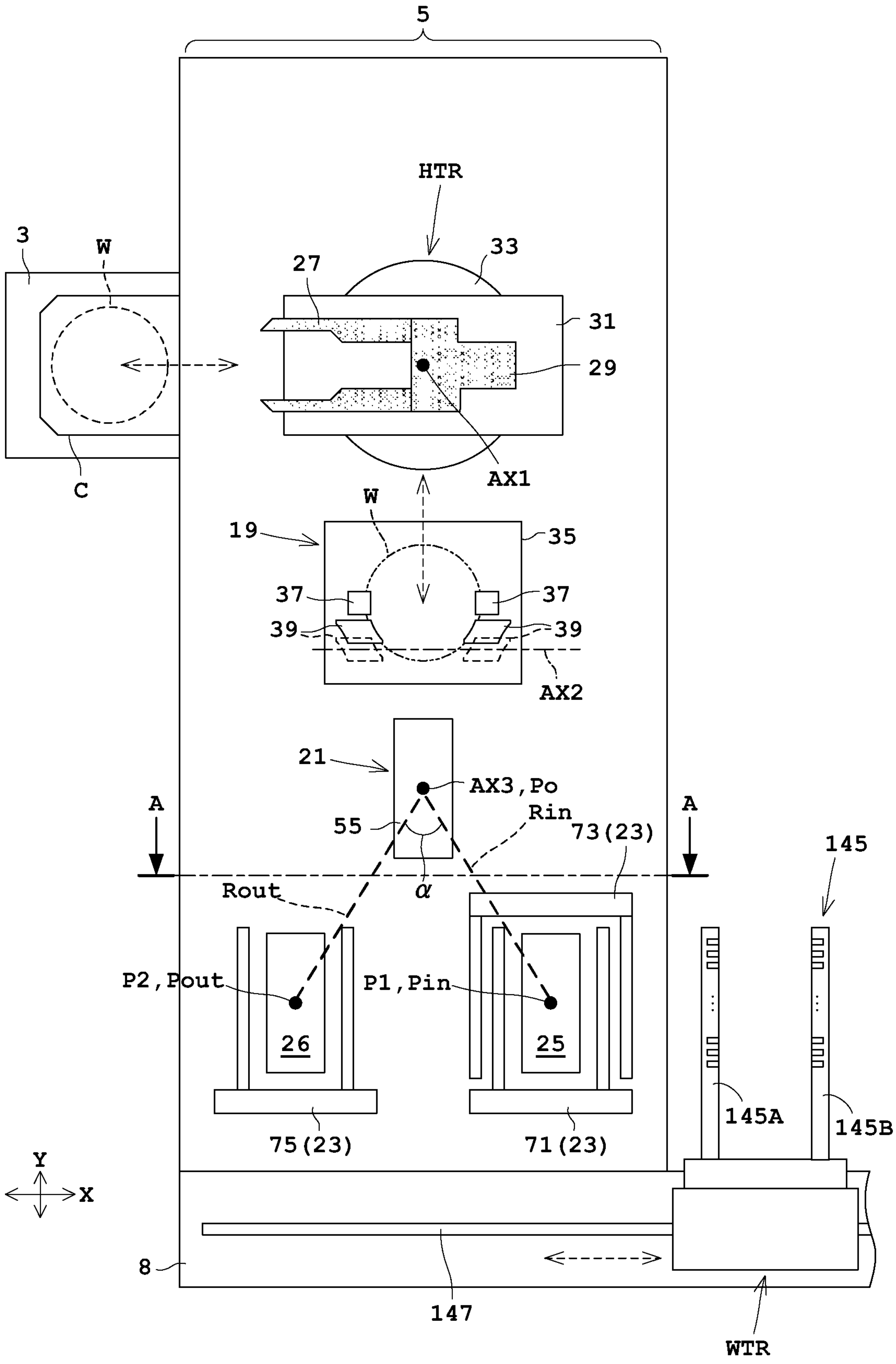
FIG. 2 is a plan view illustrating configurations of a transfer block and a periphery thereof.

Hereinafter, Example 1 of the present invention will be described with reference to the drawings. FIG. 1 is a plan view illustrating a schematic configuration of a substrate processing apparatus 1 according to Example 1. FIG. 2 is a plan view illustrating configurations of a transfer block 5 and a periphery thereof.

In the present description, for convenience, a direction where the transfer block 5 and a processing block 7 are arranged is referred to as a "front-back direction X". The front-back direction X is horizontal. In the front-back direction X, for example, a direction from the processing block 7 toward the transfer block 5 is referred to as "front". A direction opposite to the front is referred to as "back". A horizontal direction orthogonal to the front-back direction X is referred to as a "width direction Y". One side in the "width direction Y" is appropriately referred to as a "right side". A side opposite to the right side is referred to as a "left side". A direction perpendicular to the horizontal direction is referred to as a "vertical direction Z". In each of the drawings, front, back, right, left, top, and bottom are appropriately illustrated for reference.

<1. Configuration of Substrate Processing Apparatus>

Refer to FIG. 1. The substrate processing apparatus 1 processes substrates W. The substrate processing apparatus 1 is a batch-type substrate processing apparatus that collectively processes a plurality of (for example, 50, 75, or 100) substrates W. The substrate processing apparatus 1 performs, for example, chemical liquid processing, cleaning processing, drying processing, and the like on the substrates W. The substrate processing apparatus 1 includes a stocker 2, a placement shelf 3, a transfer block 5, a processing block 7, and a batch substrate transport region 8.

<1-1. Stocker>

The stocker 2 accommodates at least one carrier C. The stocker 2 is adjacent to a front side of the transfer block 5. The carrier C stores a plurality of (for example, 25) substrates W at a predetermined interval (for example, 10 mm) in a horizontal attitude. In other words, the carrier C stores N (for example, 25) substrates W aligned at a reference pitch in the horizontal attitude. Note that N is a natural number of 2 or more. Note that, at the reference pitch, a reference interval TN9 (for example, 10 millimeters (mm)) is repeated. In other words, in a case where the reference interval TN9 is 10 mm, the reference pitch is 10 mm. The N substrates W in the carrier C are aligned in the vertical direction Z or a thickness direction of each of the substrates W. As the carrier C, for example, a front opening unify pod (FOUP) is used, but the carrier C is not limited thereto.

The stocker 2 includes a plurality of (for example, two) load ports 9. The two load ports 9 are disposed in the width direction Y. In the present example, the two load ports 9 are used for carrying in and carrying out the carrier C. Further, the stocker 2 includes at least one storage shelf 11 and a carrier transport robot 13. The carrier C is placed on the storage shelf 11.

The carrier transport robot 13 transports the carrier C among the two load ports 9, the storage shelf 11, and the placement shelf 3. The carrier transport robot 13 includes, for example, a grip 15 that grips a protrusion provided on an upper face of the carrier C. The carrier transport robot 13 can move the grip 15 in the horizontal direction (the front-back direction X and the width direction Y) and the vertical direction Z. The carrier transport robot 13 is driven by one or more electric motors.

The placement shelf 3 is disposed in a region of the stocker 2. The placement shelf 3 is adjacent to the front side of the transfer block 5. The carrier C is placed on the placement shelf 3.

<1-2. Transfer Block>

Refer to FIGS. 1 and 2. The transfer block 5 includes a substrate handling mechanism (robot) HTR, an attitude changer 19, a pusher mechanism 21, a delivery mechanism 23, and two pitch converters 25, 26.

Figure 3:
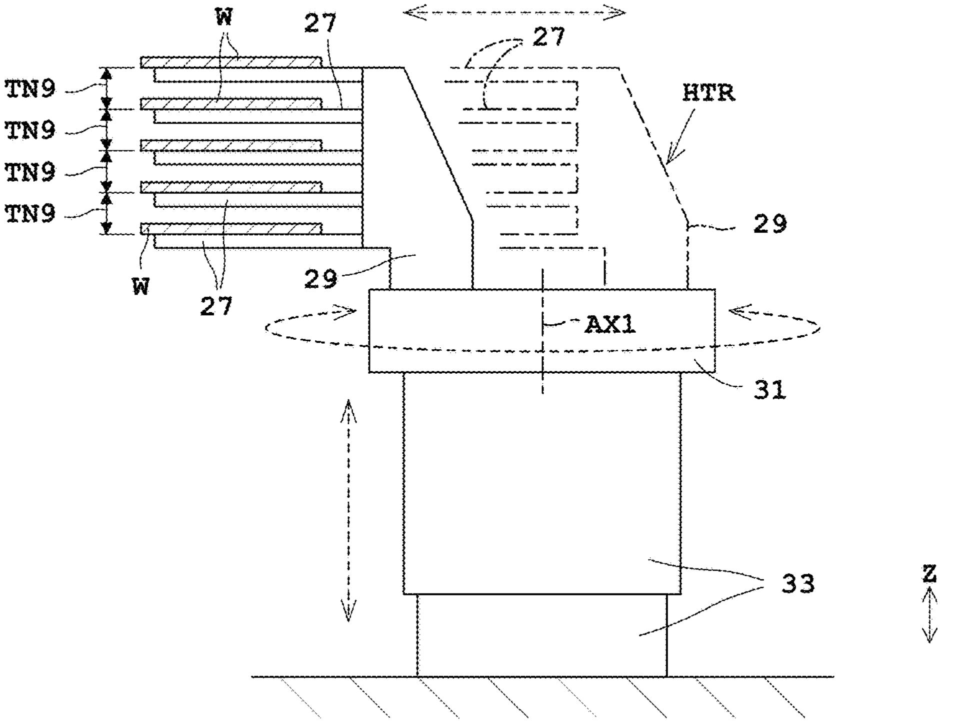
FIG. 3 is a side view illustrating a substrate handling mechanism.

The substrate handling mechanism HTR is disposed behind the placement shelf 3. The substrate handling mechanism HTR transports the plurality of (for example, 25) substrates W in the horizontal attitude between the carrier C placed on the placement shelf 3 and the attitude changer 19. As illustrated in FIG. 3, the substrate handling mechanism HTR includes a plurality of (for example, 25 or 13) hands 27. Each of the hands 27 holds one substrate W. The plurality of (25) hands 27 is arranged at the reference pitch in the vertical direction Z. Therefore, for example, the 25 substrates W held by the 25 hands 27 are aligned at the reference pitch. Note that, at the reference pitch, the reference interval TN9 (for example, 10 mm) is repeated.

Note that, in FIG. 3 and the like, for convenience of illustration, the substrate handling mechanism HTR includes 5 hands 27. Further, a pair of horizontal holders 37 and a pair of vertical holders 39 to be described later hold 5 substrates W. Further, a pusher member 55 to be described later supports 10 substrates W.

The substrate handling mechanism HTR further includes a hand support 29, an advancing/retracting portion 31, and a lifting rotator 33. The hand support 29 supports the plurality of hands 27. The advancing/retracting portion 31 causes the plurality of hands 27 to advance and retract via the hand support 29. The lifting rotator 33 rotates the advancing/retracting portion 31 about a vertical axis AX1 to change a direction of the hands 27. The lifting rotator 33 is fixed to a floor face. Note that the advancing/retracting portion 31 and the lifting rotator 33 each include the electric motor. Further, the substrate handling mechanism HTR may include a movable hand (not illustrated) for transporting only one substrate W, separately from the hands 27.

Figure 4:
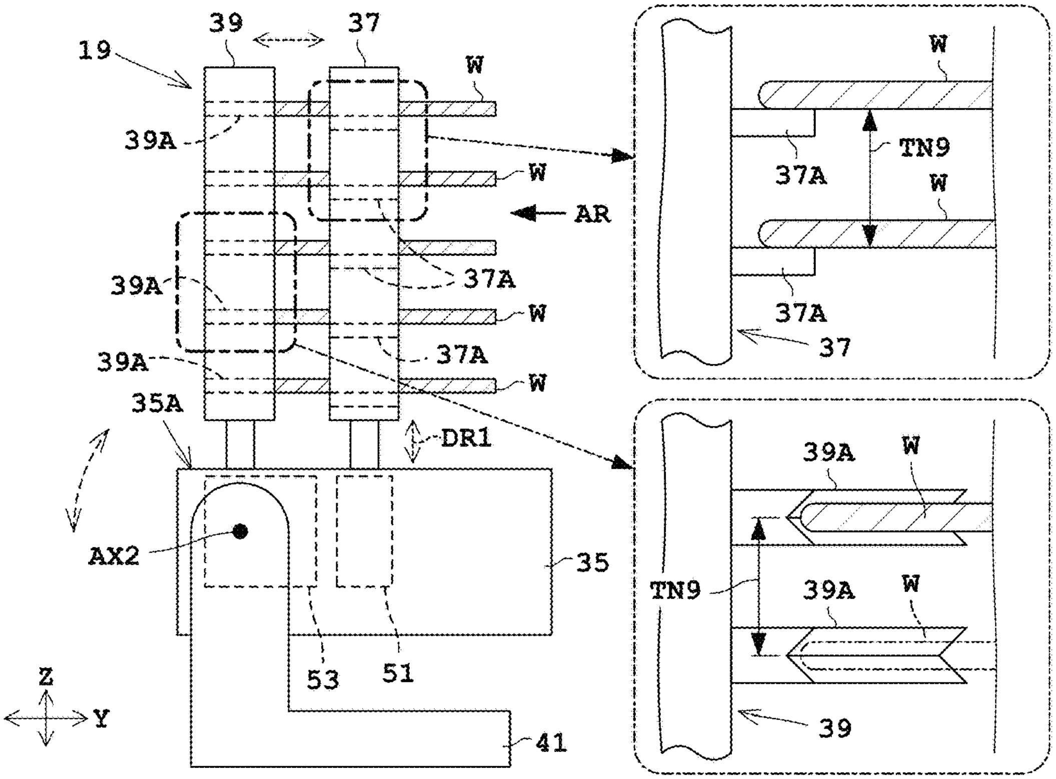
FIG. 4 is a side view illustrating an attitude changer.

The attitude changer 19 changes the plurality of (for example, 25) substrates W between the horizontal attitude and a vertical attitude. The attitude changer 19 is disposed on a left side of the substrate handling mechanism HTR. As illustrated in FIG. 4, the attitude changer 19 includes a support base 35, the pair of horizontal holders 37, the pair of vertical holders 39, and a rotation driver 41.

The support base 35 is rotatably supported about a horizontal axis AX2 extending in the front-back direction X. The pair of horizontal holders 37 and the pair of vertical holders 39 are provided to extend at a right angle from a support face 35A. When the plurality of substrates W is in the horizontal attitude, the pair of horizontal holders 37 holds the plurality of substrates W. In other words, when the plurality of substrates W is in the horizontal attitude, the plurality of substrates W is placed on the pair of horizontal holders 37. Further, when the plurality of substrates W is in the vertical attitude, the pair of vertical holders 39 holds the plurality of substrates W.

The pair of horizontal holders 37 and the pair of vertical holders 39 are both disposed in the front-back direction X (see FIG. 2). Further, when the pair of horizontal holders 37 holds the plurality of substrates W in the horizontal attitude, the pair of vertical holders 39 is disposed closer to the pusher mechanism 21 than the pair of horizontal holders 37. The pair of horizontal holders 37 has a plurality of pairs (for example, 25 pairs, 38 pairs, or 50 pairs) of shelves 37A arranged at the reference pitch in a direction DR1 where the pair of horizontal holders 37 extends. The pair of vertical holders 39 has a plurality of pairs (for example, 25 pairs, 38 pairs, or 50 pairs) of holding grooves 39A arranged at the reference pitch in the direction DR1 where the pair of vertical holders 39 extends.

Further, the attitude changer 19 further includes an axial moving portion 51 and an accommodation moving portion 53. The axial moving portion 51 moves the pair of horizontal holders 37 by a preset minute distance in the direction DR1 where the pair of horizontal holders 37 extends. The accommodation moving portion 53 moves the pair of vertical holders 39 close to or away from the pair of horizontal holders 37. For example, when the pair of horizontal holders 37 holds the plurality of substrates W in the horizontal attitude, the accommodation moving portion 53 can move the pair of vertical holders 39 in the width direction Y. The rotation driver 41 changes the plurality of substrates W held by the pair of horizontal holders 37 and the pair of vertical holders 39 between the horizontal attitude and the vertical attitude.

Note that the rotation driver 41 includes, for example, the electric motor. The axial moving portion 51 and the accommodation moving portion 53 each include an air cylinder or an electric actuator. The electric actuator includes the electric motor.

Figure 5:
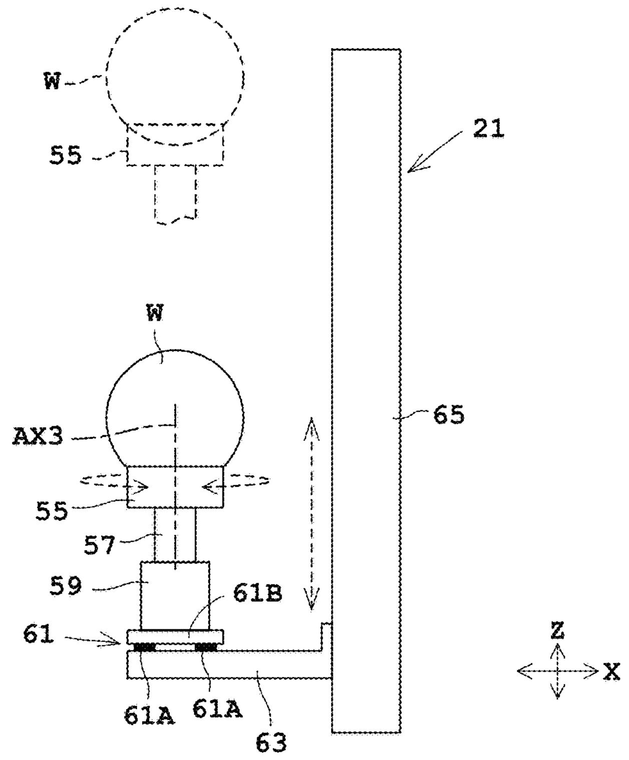
FIG. 5 is a side view illustrating a pusher mechanism.

The pusher mechanism 21 is disposed on a left side of the attitude changer 19. As illustrated in FIG. 5, the pusher mechanism 21 includes a pusher member 55, a rotation shaft 57, a pusher rotator 59, a pusher horizontal moving portion 61, a lifting base 63, and a pusher lifting portion 65.

Figure 6:
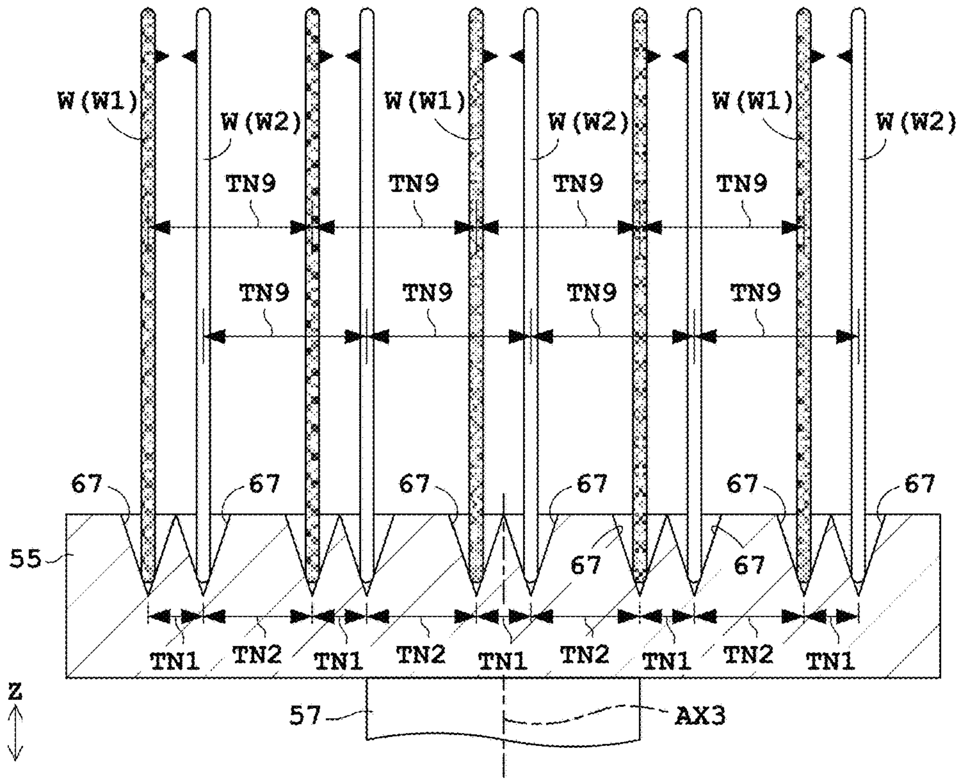
FIG. 6 is a side view illustrating a pusher member in a longitudinal cross section.

The pusher member 55 holds the plurality of substrates W arranged at a narrow interval narrower than the reference pitch at which the reference interval TN9 is repeated. For example, as illustrated in FIG. 6, the pusher member 55 holds, in the vertical attitude, the plurality of (for example, 50, 75, or 100) substrates W aligned at an unequal pitch where a first interval TN1 (for example, 3.333 mm) and a second interval TN2 (for example, 6.666 mm) are alternately repeated. As illustrated in FIG. 6, the pusher member 55 holds, in the vertical attitude, the plurality of (for example, 50, 75, or 100) substrates W aligned at the unequal pitch where the first interval TN1 (for example, 3.333 mm) and the second interval TN2 (for example, 6.666 mm) are alternately repeated. The second interval TN2 is an interval wider than the first interval TN1 (second interval TN2>first interval TN1). Note that the first interval TN1 is also referred to as the narrow interval, and the second interval TN2 is also referred to as a wide interval.

As illustrated in FIG. 6, the pusher member 55 includes a plurality of (for example, 50, 75, or 100) vertical holding grooves 67 for holding the plurality of substrates W in the vertical attitude. For example, the plurality of vertical holding grooves 67 is arranged at the unequal pitch where the first interval TN1 and the second interval TN2 are alternately repeated. A sum of the first interval TN1 (for example, 3.333 mm) and the second interval TN2 (for example, 6.666 mm) is the reference interval TN9 (for example, 10 mm).

Refer to FIG. 5. A lower face of the pusher member 55 is connected to an upper end of the rotation shaft 57. The pusher rotator 59 rotates the pusher member 55 and the rotation shaft 57 about a vertical axis AX3 passing through the rotation shaft 57. Accordingly, the plurality of substrates W supported by the pusher member 55 in the vertical attitude is rotated about the vertical axis AX3. The pusher rotator 59 includes, for example, the electric motor. The pusher rotator 59 is provided below the pusher member 55. Further, the pusher rotator 59 is attached to an upper face of the lifting base 63 via the pusher horizontal moving portion 61.

The pusher horizontal moving portion 61 includes two guide rails 61A each extending in the width direction Y, a slider 61B, and the electric motor that is not illustrated. The two guide rails 61A are provided on the upper face of the lifting base 63. The slider 61B is moved in the width direction Y along the two guide rails 61A. The slider 61B is driven by the electric motor. The pusher lifting portion 65 raises and lowers the lifting base 63 in the vertical direction Z. Accordingly, the pusher member 55 is raised and lowered. The pusher lifting portion 65 includes, for example, the electric actuator.

Refer to FIG. 2. The two pitch converters 25, 26 are disposed on a main transport mechanism WTR side of the pusher mechanism 21, that is, on a left side of the pusher mechanism 21. Further, if the two pitch converters 25, 26 are disposed in the vertical direction Z, the substrate processing apparatus 1 becomes unnecessarily high. In this regard, the two pitch converters 25, 26 are disposed in the front-back direction X. In other words, the first pitch converter 25 is disposed behind the second pitch converter 26 in plan view. Therefore, it is possible to suppress the substrate processing apparatus 1 to be unnecessarily high. For example, the delivery mechanism 23 transports the plurality of substrates W aligned at the unequal pitch between the pusher member 55 and the two pitch converters 25, 26.

The first pitch converter 25 and the second pitch converter 26 are arranged apart from each other at a predetermined angle α around a substrate transfer position Po of the pusher mechanism 21. In other words, the first pitch converter 25 is located at a substrate carry-in position Pin apart from the second pitch converter 26 by the predetermined angle α. The second pitch converter 26 is located at a substrate carry-out position Pout apart from the first pitch converter 25 by the predetermined angle α. Further, a first traverse path Rin along which the first pitch converter 25 to be described later traverses and a second traverse path Rout along which the second pitch converter 26 traverses cross each other at the predetermined angle α. The pusher mechanism 21 is disposed at a position where the first traverse path Rin and the second traverse path Rout cross each other at the predetermined angle α. In this way, the first pitch converter 25 and the second pitch converter 26 are separated from each other at positions where interference is less likely to occur. Note that the substrate transfer position Po, the substrate carry-in position Pin, and the second traverse path Rout are positions when the transfer block 5 is viewed in plan view as illustrated in FIG. 2.

Figure 7:
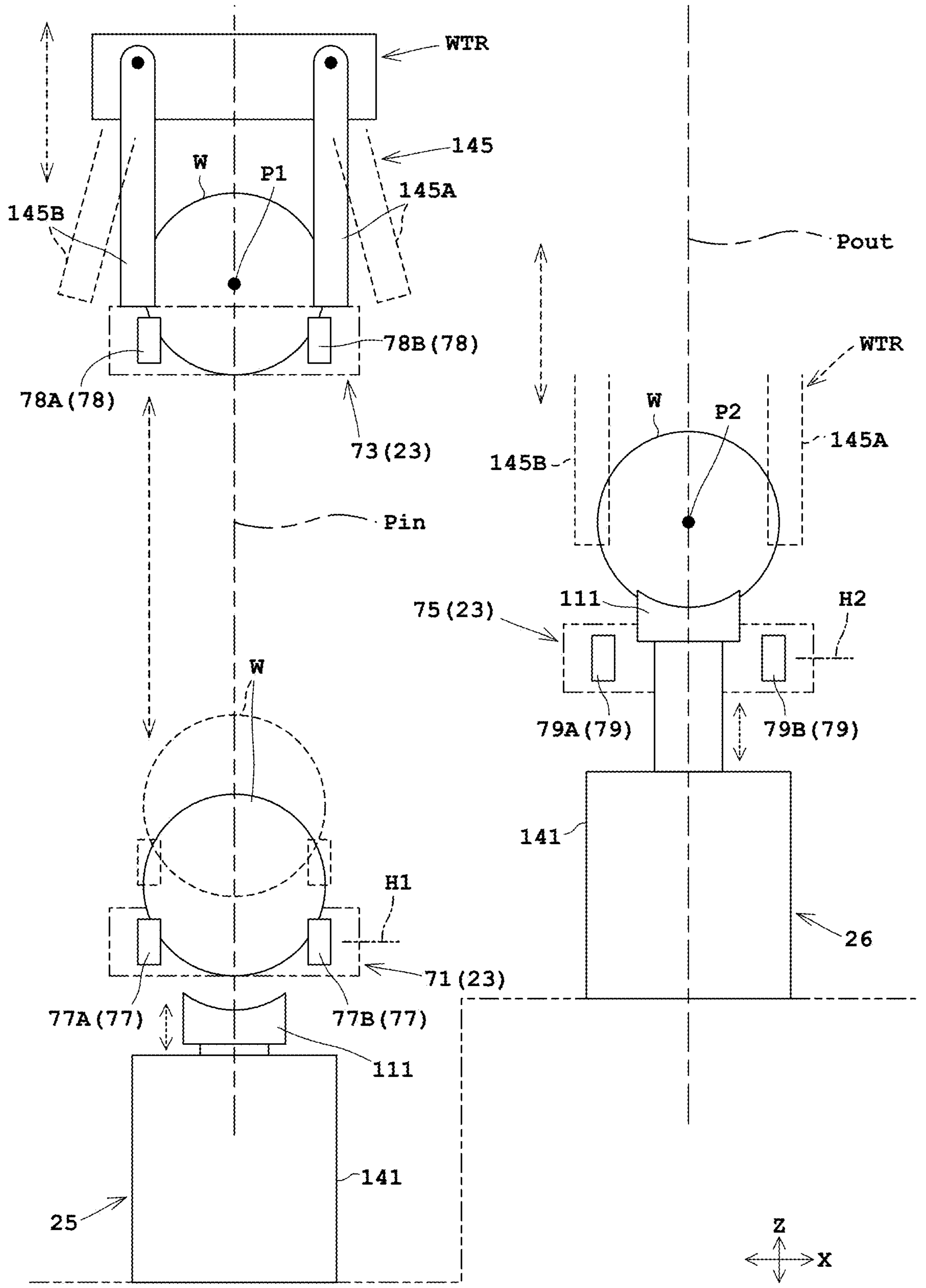
FIG. 7 is a side view illustrating a delivery mechanism, two pitch converters, and the like when viewed as indicated by arrows A-A in FIG. 2.

Refer to FIGS. 2 and 7. FIG. 7 is a side view illustrating the delivery mechanism 23, the two pitch converters 25, 26, and the like when viewed as indicated by arrows A-A in FIG. 2. The delivery mechanism 23 includes a carry-in mechanism 71, an intermediary mechanism 73, and a carry-out mechanism 75. The carry-in mechanism 71 transports the plurality of substrates W aligned at the unequal pitch from the pusher member 55 to the first pitch converter 25. The intermediary mechanism 73 transports the plurality of substrates W aligned at a narrow pitch from the first pitch converter 25 to a first delivery position P1. The carry-out mechanism 75 transports the plurality of substrates W aligned at the unequal pitch from the second pitch converter 26 to the pusher member 55. The carry-in mechanism 71, the intermediary mechanism 73, and the carry-out mechanism 75 include a chuck 77, a chuck 78, and a chuck 79, respectively.

As illustrated in FIG. 7, the carry-in mechanism 71 is disposed at a carry-in height position H1 along the substrate carry-in position Pin. The carry-in mechanism 71 is disposed, for example, on a lifting portion 141 side of the second pitch converter 26 along the substrate carry-in position Pin. The chuck 78 of the intermediary mechanism 73 is provided at a position above the first pitch converter 25 along the substrate carry-in position Pin. Further, the chuck 78 of the intermediary mechanism 73 is disposed between the carry-in height position H1 and the first delivery position P1 along the substrate carry-in position Pin. The first delivery position P1 is a position higher than the carry-in height position H1 and a carry-out height position H2 along the substrate carry-in position Pin. The carry-out mechanism 75 is disposed at the carry-out height position H2 higher than the carry-in height position H1 along the substrate carry-out position Pout. The carry-in mechanism 71 and the carry-out mechanism 75 each are configured such that the carry-out mechanism 75 and the plurality of substrates W held by the carry-out mechanism 75 do not interfere with the carry-in mechanism 71 and the plurality of other substrates W held by the carry-in mechanism 71. The substrate carry-in position Pin and the substrate carry-out position Pout are provided at positions sufficiently separated in the front-back direction X. Note that, as illustrated in FIG. 7, the substrate carry-in position Pin may be indicated by a two-dot chain line extending in the vertical direction Z. Further, the substrate carry-out position Pout may also be indicated by the one-dot chain line extending in the vertical direction Z.

Figure 8:
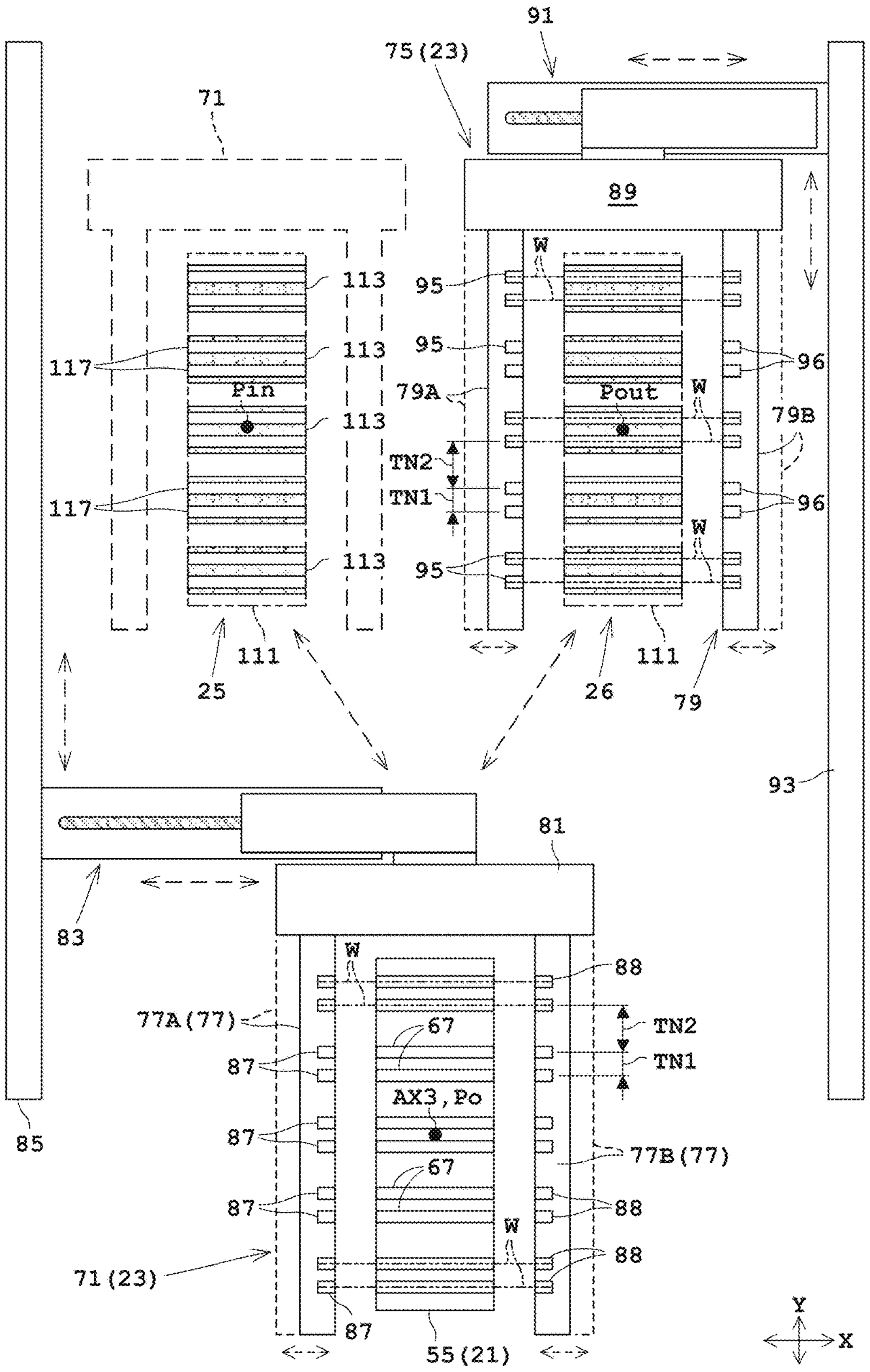
FIG. 8 is a plan view mainly illustrating a carry-in mechanism and a carry-out mechanism.

FIG. 8 is a plan view mainly illustrating the carry-in mechanism 71 and the carry-out mechanism 75. The carry-in mechanism 71 is disposed at the substrate carry-in position Pin behind the carry-out mechanism 75. The carry-out mechanism 75 is disposed at the substrate carry-out position Pout before the carry-in mechanism 71. In other words, the carry-in mechanism 71 is disposed at the substrate carry-in position Pin close to the processing block 7 side, and the carry-out mechanism 75 is disposed at the substrate carry-out position Pout close to the stocker 2 side. The carry-in mechanism 71 includes the chuck 77, an opening/closing portion 81, a front-back moving portion 83, and a widthwise moving portion 85.

The chuck 77 holds the plurality of substrates W aligned at the unequal pitch in the vertical attitude. The chuck 77 includes a pair of chuck members 77A, 77B each extending in the width direction Y. The pair of chuck members 77A, 77B includes a plurality of pairs (for example, 50 pairs, 75 pairs, or 100 pairs) of holding grooves 87, 88 arranged at the unequal pitch. Note that, at the unequal pitch, the first interval TN1 (for example, 3.333 mm) and the second interval TN2 (for example, 6.666 mm) are alternately arranged. The first chuck member 77A is provided with the plurality of holding grooves 87 arranged at the unequal pitch. Further, the second chuck member 77B is provided with a plurality of holding grooves 88 arranged at the unequal pitch.

The opening/closing portion 81 supports two chuck members 77A, 77B to be movable in the front-back direction X. Further, the opening/closing portion 81 opens and closes the two chuck members 77A, 77B in the front-back direction X. Specifically, the opening/closing portion 81 brings the two chuck members 77A, 77B close to or away from each other. When the opening/closing portion 81 closes the chuck 77, the chuck 77 can hold the plurality of substrates W in the vertical attitude. On the other hand, when the opening/closing portion 81 opens the chuck 77, the chuck 77 can pass, in the vertical direction Z, the plurality of substrates W in the vertical attitude between the two chuck members 77A, 77B. The opening/closing portion 81 includes the air cylinder or the electric actuator that drives the two chuck members 77A, 77B.

The front-back moving portion 83 is disposed closer to two pitch converters 25, 26 than the widthwise moving portion 85. The front-back moving portion 83 horizontally moves the chuck 77 and the opening/closing portion 81 in the front-back direction X. The widthwise moving portion 85 horizontally moves the chuck 77, the opening/closing portion 81, and the front-back moving portion 83 in the width direction Y. In other words, it is possible for the front-back moving portion 83 and the widthwise moving portion 85 to move the chuck 77 in the front-back direction X and the width direction Y (a two-dimensional direction). Accordingly, it is possible for the carry-in mechanism 71 to move the chuck 77 between the substrate transfer position Po and the substrate delivery position (the substrate carry-in position Pin and the substrate carry-out position Pout) to be described later. Movement in an oblique direction such as the first traverse path Rin and the second traverse path Rout described above is implemented by simultaneously performing movement in the front-back direction X and movement in the width direction Y. The front-back moving portion 83 includes, for example, the air cylinder or the electric actuator. The widthwise moving portion 85 includes the electric actuator.

The carry-out mechanism 75 includes the chuck 79, an opening/closing portion 89, a front-back moving portion 91, and a widthwise moving portion 93. The chuck 79 is configured similarly to the chuck 77. Specifically, the chuck 79 includes a pair of chuck members 79A, 79B each extending in the width direction Y. The pair of chuck members 79A, 79B includes a plurality of pairs (for example, 50 pairs, 75 pairs, or 100 pairs) of holding grooves 95, 96 arranged at the unequal pitch. The front-back moving portion 91 is disposed closer to the two pitch converters 25, 26 than the widthwise moving portion 93. In addition, the opening/closing portion 89, the front-back moving portion 91, and the widthwise moving portion 93 are configured similarly to the opening/closing portion 81, the front-back moving portion 83, and the widthwise moving portion 85, respectively.

Figure 9:
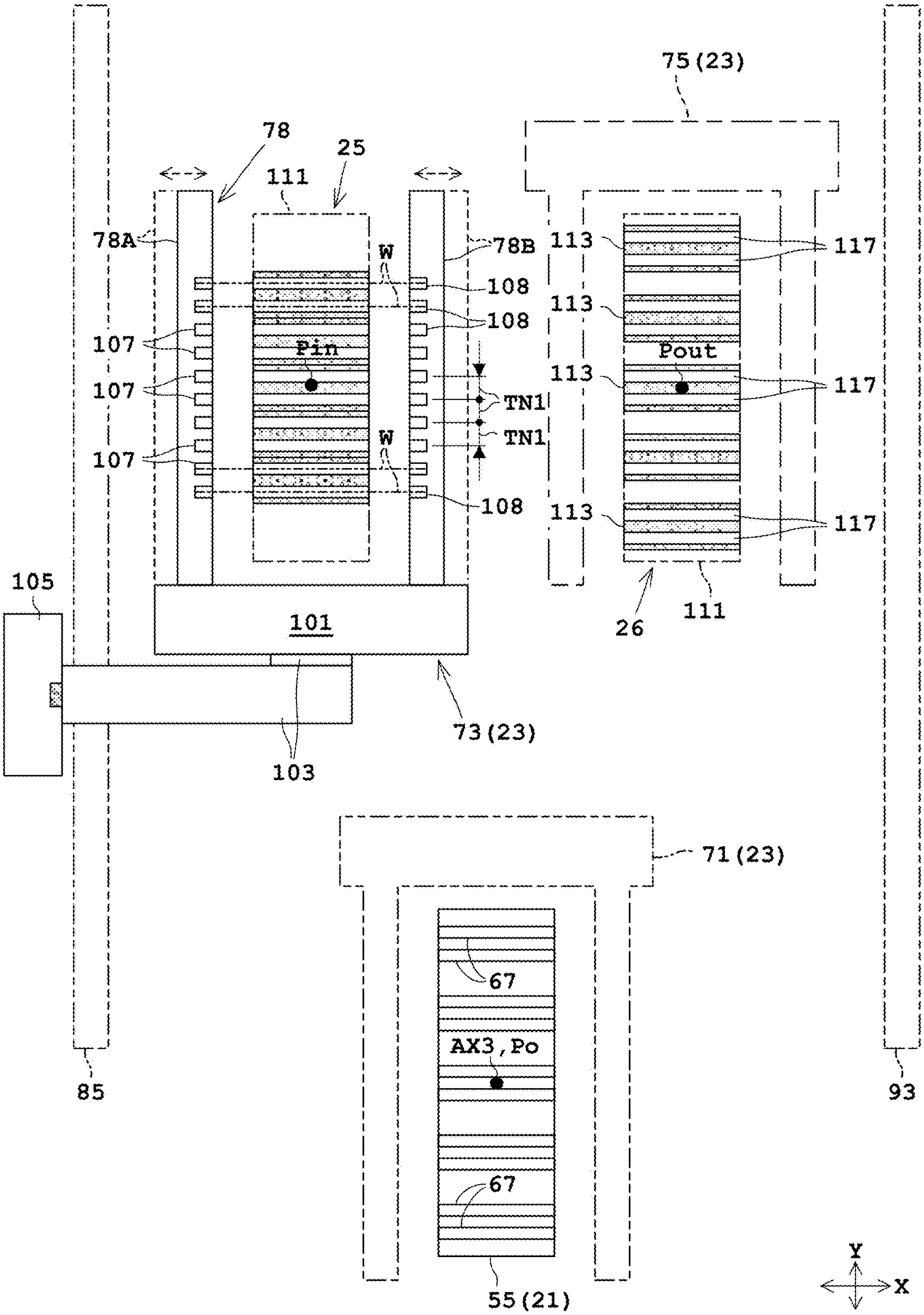
FIG. 9 is a plan view mainly illustrating an intermediary mechanism.

FIG. 9 is a plan view mainly illustrating the intermediary mechanism 73. The intermediary mechanism 73 is disposed at the same substrate carry-in position Pin as the carry-in mechanism 71. The intermediary mechanism 73 includes the chuck 78, an opening/closing portion 101, an arm 103, and a lifting portion 105. The chuck 78 includes a pair of chuck members 78A, 78B each extending in the width direction Y. The pair of chuck members 78A, 78B includes a plurality of pairs (for example, 50 pairs, 75 pairs, or 100 pairs) of holding grooves 107, 108 arranged at the narrow pitch (for example, 3.333 mm (⅓ pitch)). Specifically, the first chuck member 78A is provided with a plurality of holding grooves 107 arranged at the narrow pitch in the width direction Y. Further, the second chuck member 78B is provided with a plurality of holding grooves 108 arranged at the narrow pitch.

The opening/closing portion 101 is provided on a right side (the pusher mechanism 21 side) of the chuck 78. In addition, the opening/closing portion 101 is configured similarly to the opening/closing portion 81. More specifically, the opening/closing portion 101 supports the pair of chuck members 78A, 78B to be movable in the front-back direction X. Further, the opening/closing portion 101 opens and closes the pair of chuck members 78A, 78B in the front-back direction X. When the opening/closing portion 101 closes the chuck 78, the chuck 78 can hold the plurality of substrates W aligned at the narrow pitch in the vertical attitude. On the other hand, when the opening/closing portion 101 opens the chuck 78, the chuck 78 can pass, in the vertical direction Z, the plurality of substrates W in the vertical attitude between the two chuck members 78A, 78B.

The opening/closing portion 101 is attached to the lifting portion 105 via the arm 103 to be movable up and down. The lifting portion 105 raises and lowers the chuck 78 and the opening/closing portion 101 in the vertical direction Z. The lifting portion 105 includes, for example, the electric actuator. This makes it possible for the intermediary mechanism 73 to receive the plurality of substrates W in the vertical attitude aligned at the narrow pitch from the first pitch converter 25 and move the plurality of substrates W to the first delivery position P1 (see FIG. 7) in order to transfer the plurality of substrates W to the main transport mechanism WTR.

Note that the transfer block 5 has two transport paths for transporting the plurality of substrates W between the pusher member 55 (the pusher mechanism 21) and the main transport mechanism WTR. In other words, a first transport path is a path passing through the carry-in mechanism 71, the first pitch converter 25, and the intermediary mechanism 73. Further, a second transport path is a path passing through the second pitch converter 26 and the carry-out mechanism 75. For example, when 50 substrates W are held by the intermediary mechanism 73, the carry-out mechanism 75 can transport 50 substrates W processed in a chemical liquid processing tank BT1 or the like to the pusher member 55. Therefore, 50 substrates W (a processed substrate group) can be smoothly transported.

<1-2-1. Pitch Converter>

Refer to FIGS. 7 and 10 to 13. The two pitch converters 25, 26 each convert the pitches of the plurality of substrates W between the unequal pitch and the narrow pitch. At the unequal pitch, the first interval TN1 (for example, 3.333 mm) and the second interval TN2 (for example, 6.666 mm) wider than the first interval TN1 are alternately repeated. Note that, at the narrow pitch, the first interval TN1 is repeated.

The first pitch converter 25 aligns, at the narrow pitch, the plurality of substrates W aligned at the unequal pitch. In other words, the first pitch converter 25 converts the pitches of the plurality of substrates W before being processed in the processing block 7 into the narrow pitch. On the other hand, the second pitch converter 26 aligns, at the unequal pitch, the plurality of substrates W aligned at the narrow pitch. In other words, the second pitch converter 26 converts the pitches of the plurality of substrates W processed in the processing block 7 into the unequal pitch.

The two pitch converters 25, 26 each include a pitch conversion body 111. The pitch conversion body 111 includes a plurality of (for example, 25, 38, or 50) holding members 113 (113A to 113E) and a moving portion 115.

The plurality of holding members 113 holds the plurality of substrates W aligned at the unequal pitch in the vertical attitude. The plurality of holding members 113 each has two holding grooves 117 that hold two substrates W out of the plurality of substrates W at the first interval TN1 (for example, 3.333 mm). The two holding grooves 117 are separated by the first interval TN1. The two holding grooves 117 of each of the holding members 113 are disposed in the width direction Y. For example, in a case where the pitch converter 25 includes 25 holding members 113, the 25 holding members 113 can hold 50 substrates W. Note that, in FIGS. 10 to 13, for convenience of illustration, the two pitch converters 25, 26 each include five holding members 113.

The moving portion 115 moves the plurality of holding members 113 in an alignment direction (the width direction Y) of the plurality of substrates W to change between an unequal pitch state in which the plurality of substrates W is aligned at the unequal pitch and a narrow pitch state in which the plurality of substrates W is aligned at the narrow pitch. The moving portion 115 includes a base member 119, two guide rails 121, an expansion/contraction mechanism 123, a driver 125, and a connector 127.

The two guide rails 121 support the plurality of holding members 113 to be movable in the alignment direction (the width direction Y). The two guide rails 121 each extend in the width direction Y. The two guide rails 121 are attached to an upper face of the base member 119. Note that a central holding member 113C out of the plurality of holding members 113 is fixed to the base member 119 with, for example, a screw SW. In other words, the central holding member 113C does not move in the width direction Y. Note that the number of the guide rails 121 is not limited to two, and may be one or three or more. In other words, the moving portion 115 may include one or more guide rails 121.

Figure 12:
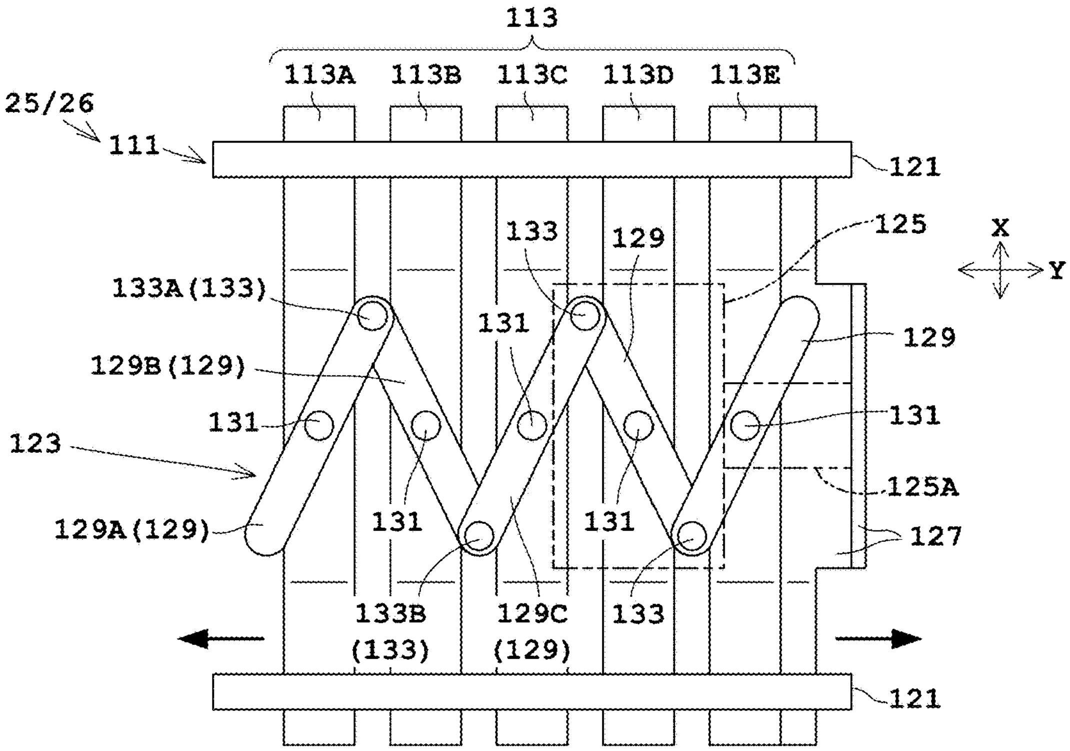
FIG. 12 is a bottom view mainly illustrating an expansion/contraction mechanism of the pitch converter that holds the plurality of substrates aligned at the unequal pitch.
Figure 13:
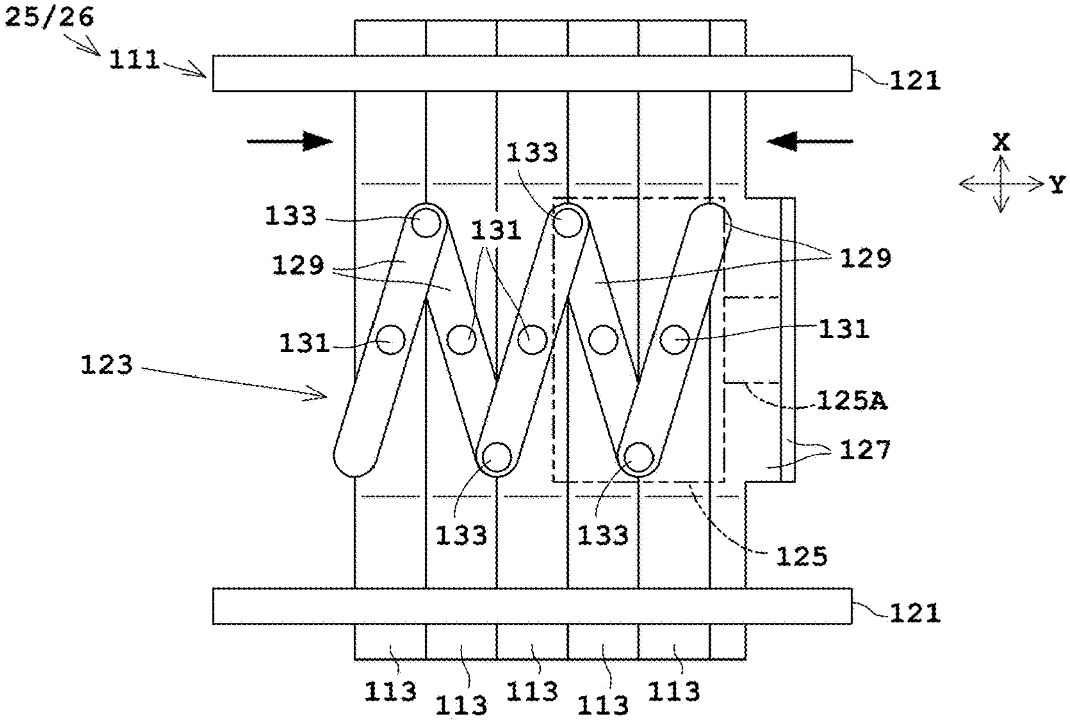
FIG. 13 is a bottom view mainly illustrating an expansion/contraction mechanism of the pitch converter that holds the plurality of substrates aligned at the narrow pitch.

The expansion/contraction mechanism 123 causes the plurality of holding members 113 to expand and contract in the alignment direction (the width direction Y). The expansion/contraction mechanism 123 is connected to each of the holding members 113. The expansion/contraction mechanism 123 includes, for example, a link mechanism. Specifically, the expansion/contraction mechanism 123 is configured in, for example, a lazy tongue type, a zigzag linear type, or a type close thereto. The expansion/contraction mechanism 123 includes, for example, a plurality of (five in FIG. 10 and the like) link members 129, a plurality of (five in FIG. 10 and the like) pins 131, and a plurality of (four in FIG. 10 and the like) joints 133. In FIGS. 12 and 13, for example, the five pins 131 are provided on bottom faces of the five holding members 113. The five link members 129 each are attached to the five pins 131 to be rotatable about a vertical axis. The five pins 131 are respectively located at five central portions of the five link members 129. The four joints 133 each connect ends of two adjacent link members 129.

For example, a first end of a link member 129B is connected to a second end of a link member 129A with a joint 133A. Further, the second end of the link member 129B is connected to a first end of a link member 129C with a joint 133B.

The driver 125 drives the expansion/contraction mechanism 123. The driver 125 is attached to a lower face of the base member 119. The driver 125 causes a rod 125A extending in the width direction Y to extend and contract. The driver 125 includes the air cylinder or the electric actuator. The connector 127 connects a holding member 113E at the side out of the plurality of holding members 113 and a distal end of the rod 125A of the driver 125. Note that the connector 127 passes through an opening 119A of the base member 119.

Figure 10:
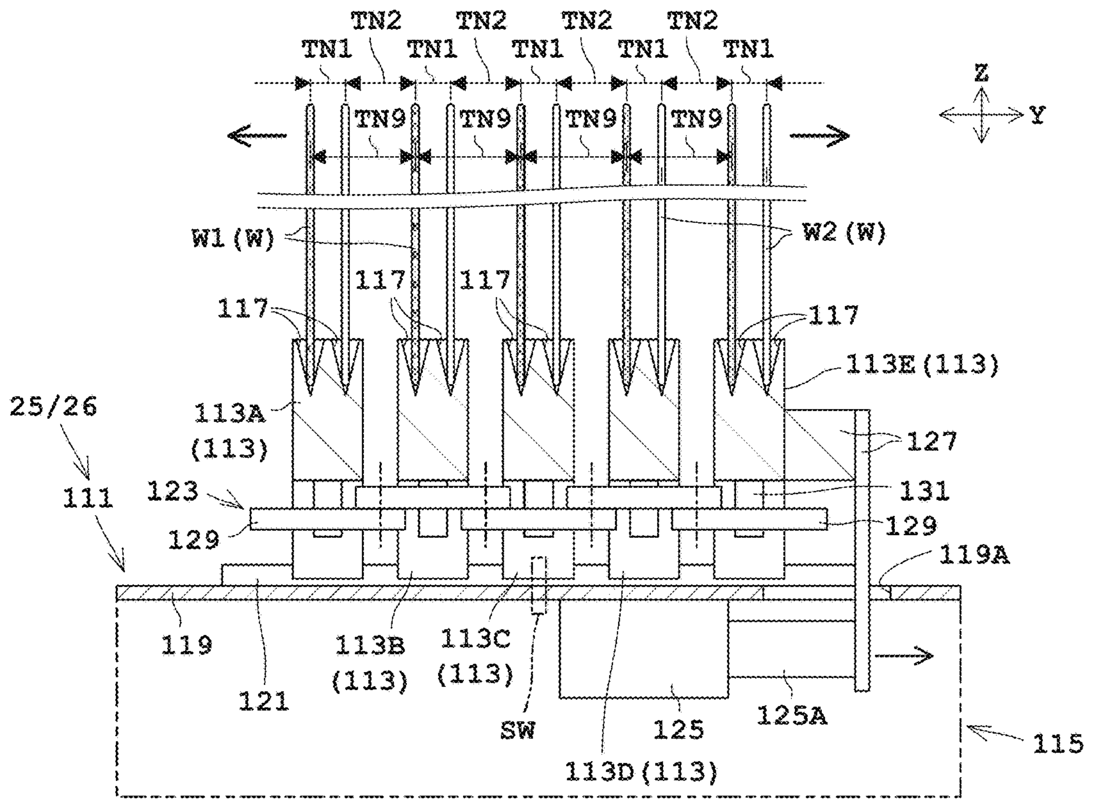
FIG. 10 is a side view illustrating a schematic configuration of a pitch converter that holds a plurality of substrates aligned at an unequal pitch.
Figure 11:
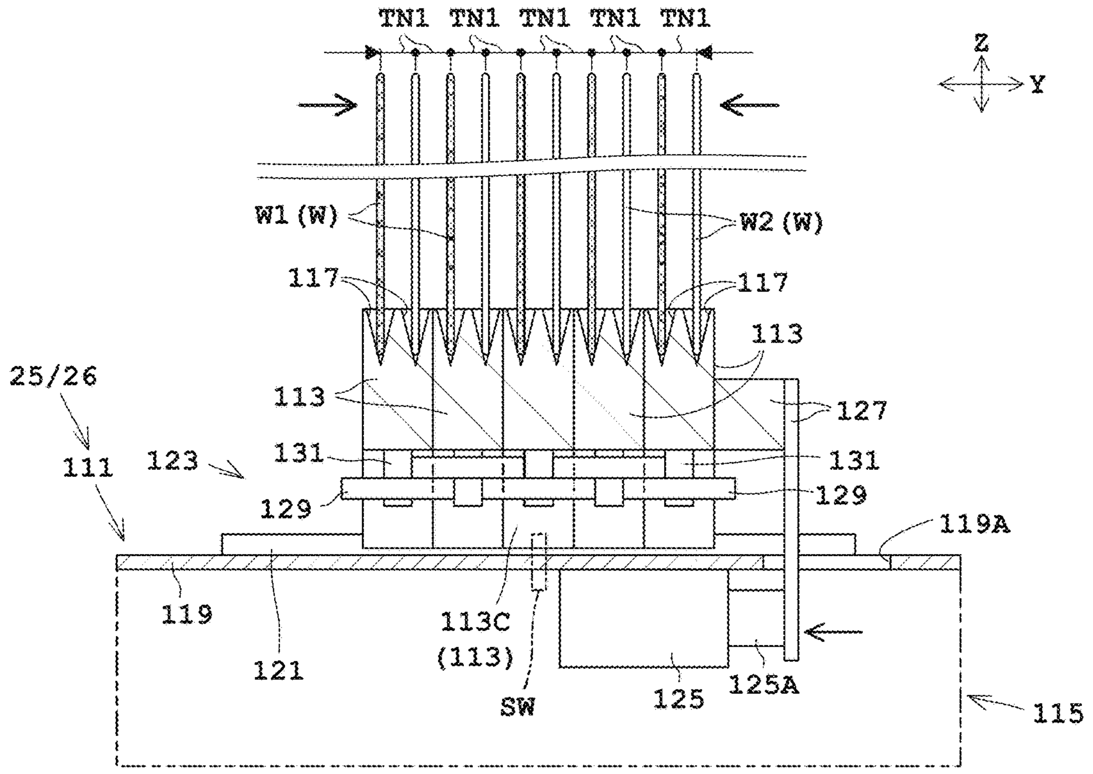
FIG. 11 is a side view illustrating a schematic configuration of a pitch converter that holds the plurality of substrates aligned at a narrow pitch.

In FIGS. 10 and 12, for example, when the rod 125A of the driver 125 extends, the holding member 113E at the side is separated from the central holding member 113C, and other three holding members 113A, 113B, 113D are separated from the central holding member 113 C by the expansion/contraction mechanism 123. Accordingly, the plurality of substrates W is aligned at the unequal pitch. Further, in FIGS. 11 and 13, for example, when the rod of the driver 125 contracts, the holding member 113E at the side approaches the central holding member 113C, and the other three holding members 113A, 113B, 113D are brought close to the central holding member 113C by the expansion/contraction mechanism 123. Accordingly, the plurality of substrates W is aligned at the narrow pitch (the first interval TN1).

As illustrated in FIG. 7, the pitch converters 25, 26 each include the lifting portion 141. The lifting portion 141 raises and lowers the pitch conversion body 111 (the plurality of holding members 113 and the moving portion 115). The lifting portion 141 includes the air cylinder or the electric actuator.

The lifting portion 141 of the first pitch converter 25 raises and lowers the plurality of holding members 113 between an upper position higher than (an upper face of) the chuck 77 of the carry-in mechanism 71 and a lower position lower than the chuck 77. Further, the lifting portion 141 of the second pitch converter 26 raises and lowers the plurality of holding members 113 between an upper position higher than (an upper face of) the chuck 79 of the carry-out mechanism 75 and a lower position lower than the chuck 79.

<1-3. Processing Block>

Refer to FIG. 1. The processing block 7 includes a plurality of (for example, four) batch processing tanks BT1 to BT4 and a dryer 143. The four batch processing tanks BT1 to BT4 and the dryer 143 are disposed in the front-back direction X where the substrate processing apparatus 1 extends. In each of the four batch processing tanks BT1 to BT4, the plurality of (for example, 50, 75, or 100) substrates W is collectively immersed for processing. The four batch processing tanks BT1 to BT4 each store a processing liquid (for example, a chemical liquid or pure water) in which the plurality of substrates W is immersed. Note that the processing block 7 corresponds to the "substrate processor" of the present invention.

The four batch processing tanks BT1 to BT4 include, for example, two chemical liquid processing tanks BT1, BT3 and two cleaning processing tanks BT2, BT4. The chemical liquid processing tank BT1 and the cleaning processing tank BT2 are set as one group, and the chemical liquid processing tank BT3 and the cleaning processing tank BT4 are set as the other group. Note that combination of the chemical liquid processing tanks and the cleaning processing tanks is not limited to this example. Further, the number of the batch processing tanks is not limited to four, and may be one or more.

The two chemical liquid processing tanks BT1, BT3 each perform etching processing using the chemical liquid. For example, the chemical liquid can be a phosphoric acid solution, and is not limited to the phosphoric acid solution. The chemical liquid is heated to a preset temperature. A chemical liquid ejection pipe not illustrated is provided at an inner bottom of each of the chemical liquid processing tanks BT1, BT3. Each of the chemical liquid processing tanks BT1, BT3 stores the chemical liquid supplied from the chemical liquid ejection pipe.

The two cleaning processing tanks BT2, BT4 each perform cleaning processing of washing away the chemical liquid adhering to the plurality of substrates W with a cleaning liquid (a rinse liquid). As the cleaning liquid, for example, pure water such as deionized water (DIW) is used. The cleaning processing tanks BT2, BT4 each store the pure water supplied from a pure water ejection pipe not illustrated.

The processing block 7 includes a lifter LF1 as a dedicated transport mechanism for transferring the substrate W processed with the chemical liquid in the chemical liquid processing tank BT1 to the cleaning processing tank BT2, and a lifter LF2 for transferring the substrate W processed with the chemical liquid in the chemical liquid processing tank BT3 to the cleaning processing tank BT4. Two lifters LF1, LF2 each include a substrate holder that holds, in the vertical attitude, the plurality of substrates W aligned at the narrow pitch in the width direction Y, a lifting portion that raises and lowers the substrate holder, and a horizontal moving portion that moves the substrate holder in the front-back direction X.

The dryer 143 includes a substrate holding mechanism that holds, in the vertical attitude, the plurality of (for example, 50, 75, or 100) substrates W aligned at the narrow pitch in the width direction Y, and a processing chamber that accommodates the plurality of substrates W held by the substrate holding mechanism. The dryer 143 dries the substrates by supplying an organic solvent (for example, isopropyl alcohol) to the substrates W in a reduced-pressure atmosphere or removing liquid components on surfaces of the substrates W by centrifugal force.

<1-4. Batch Substrate Transport Region>

The batch substrate transport region 8 is disposed behind the stocker 2, and is adjacent to left sides of the transfer block 5 and the processing block 7. The batch substrate transport region 8 extends in the front-back direction X. The batch substrate transport region 8 includes the main transport mechanism WTR (a main transport robot). The main transport mechanism WTR transports, in the front-back direction X, the plurality of (for example, 50, 75, or 100) substrates W in the vertical attitude aligned at the narrow pitch in the width direction Y. Further, the main transport mechanism WTR transports the plurality of substrates W among the first delivery position P1, a second delivery position P2, the plurality of (for example, four) batch processing tanks BT1 to BT4, and the dryer 143.

The main transport mechanism WTR includes a chuck 145, a chuck lifting portion (not illustrated), a chuck horizontal moving portion (not illustrated), and a guide rail 147. The chuck 145 holds, in the vertical attitude, the plurality of substrates W in a vertical attitude aligned at the narrow pitch in the width direction Y. The chuck 145 includes a pair of chuck members 145A, 145B each extending in the width direction Y. The pair of chuck members 145A, 145B includes a plurality of pairs (for example, 50 pairs, 75 pairs, or 100 pairs) of holding grooves arranged at the narrow pitch in the width direction Y. The pair of chuck members 145A, 145B is opened and closed by a chuck opening/closing portion not illustrated.

The chuck 145 is movable in the front-back direction X along the guide rail 147. The chuck 145 is moved in the front-back direction X by the chuck horizontal moving portion. The chuck 145 is raised and lowered in the vertical direction Z by the chuck lifting portion. The chuck horizontal moving portion and the chuck lifting portion include, for example, the electric actuator. The chuck opening/closing portion includes, for example, the air cylinder or the electric actuator.

<1-5. Controller>

The substrate processing apparatus 1 includes a controller 151 (see FIG. 1) and a storage (not illustrated). The controller 151 controls each component of the substrate processing apparatus 1. The controller 151 includes one or more processors such as a central processing unit (CPU). The storage includes, for example, at least one of a read-only memory (ROM), a random-access memory (RAM), and a hard disk. The storage stores a computer program necessary for controlling each component of the substrate processing apparatus 1.

<2. Operation of Substrate Processing Apparatus>

Figure 14:
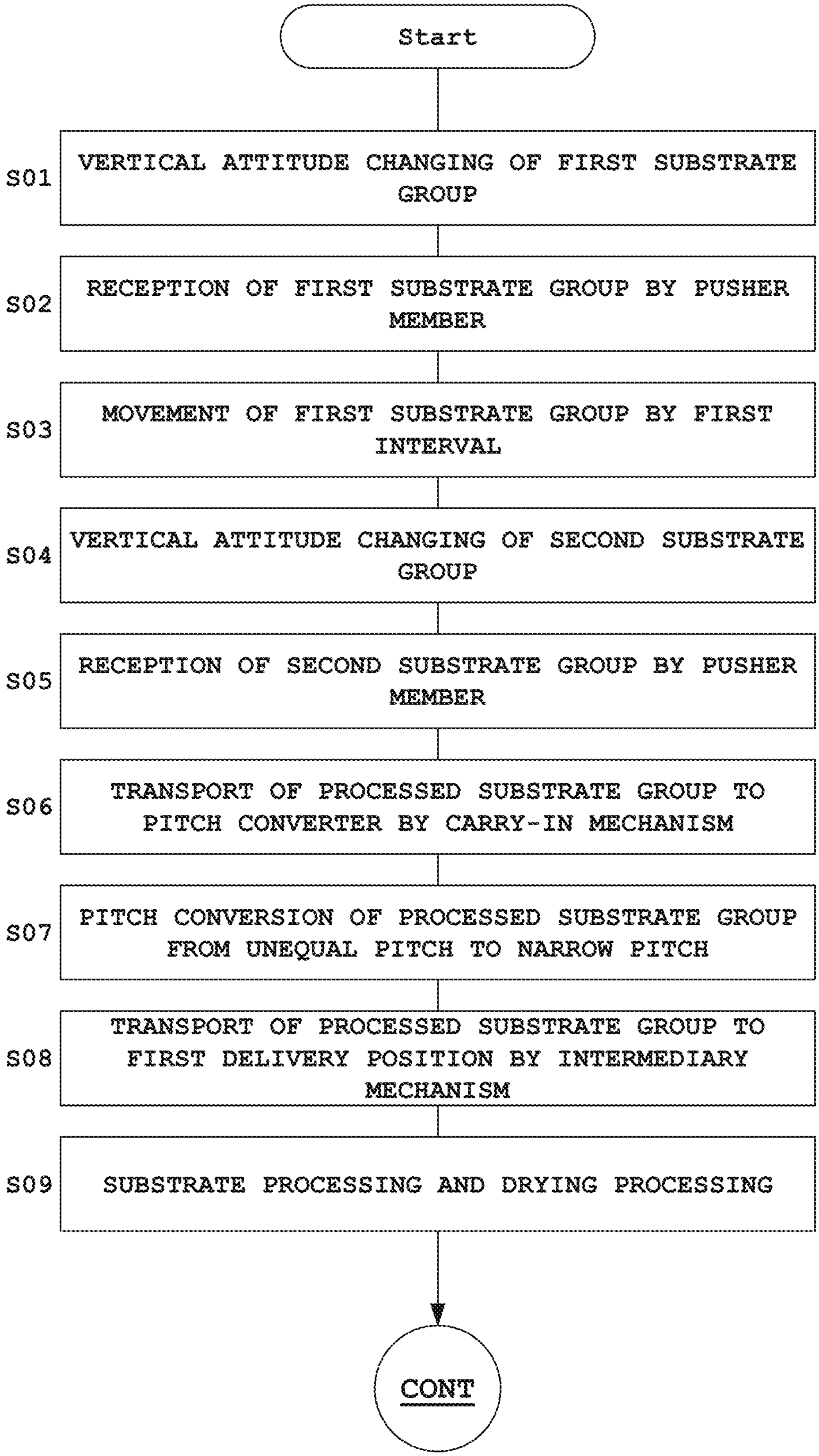
FIG. 14 is a flowchart for explaining an operation of a first half of the substrate processing apparatus.
Figure 21:
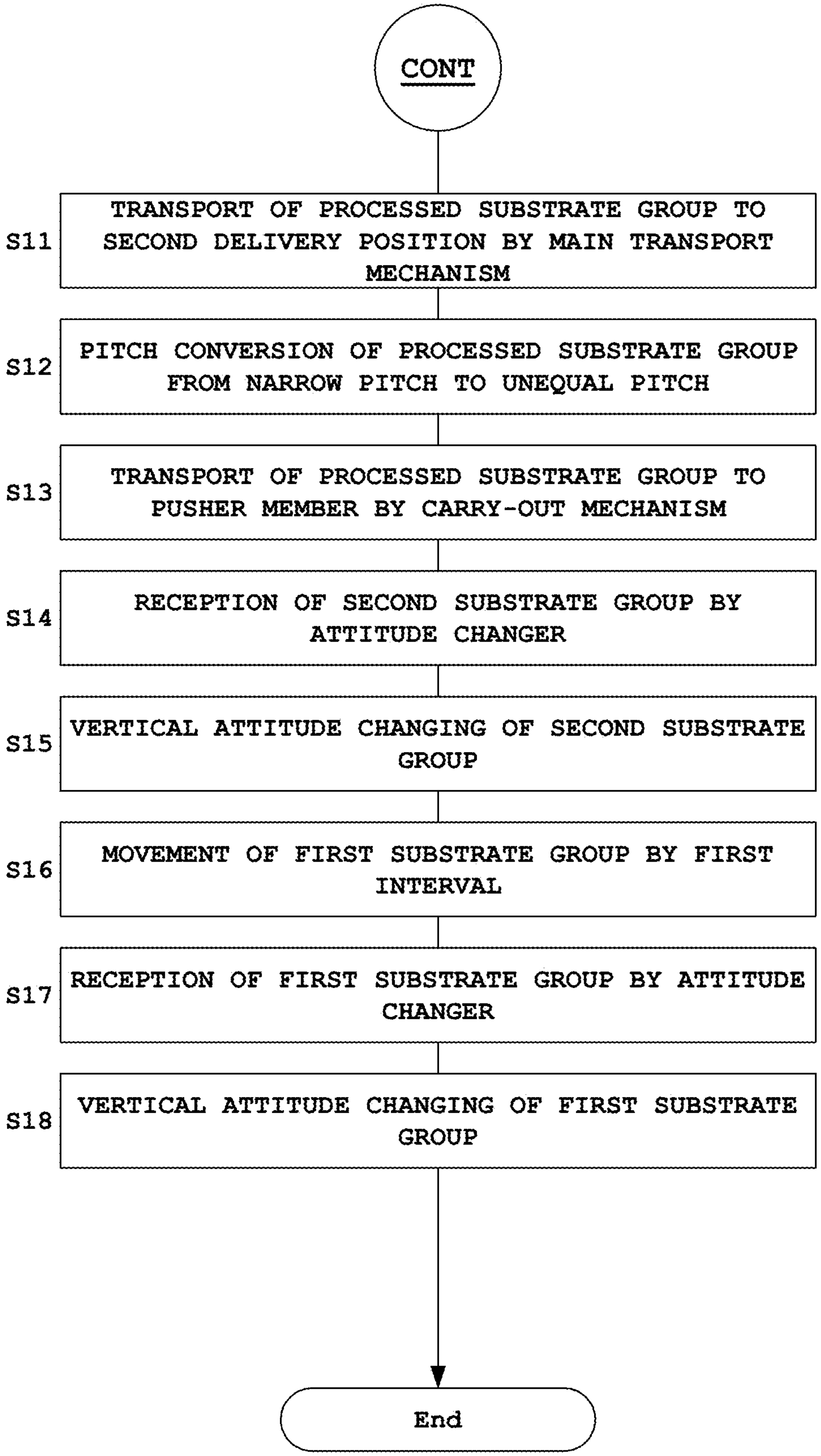
FIG. 21 is a flowchart for explaining an operation of a second half of the substrate processing apparatus.

Next, an operation of the substrate processing apparatus 1 will be described with reference to flowcharts in FIGS. 14 and 21. First, the first half operation from transport of the carrier C to the load ports 9 to drying processing will be described with reference to FIG. 14. Note that, in the present example, the substrate processing apparatus 1 collectively processes 50 substrates W taken out from two carriers C.

Figure 15A:
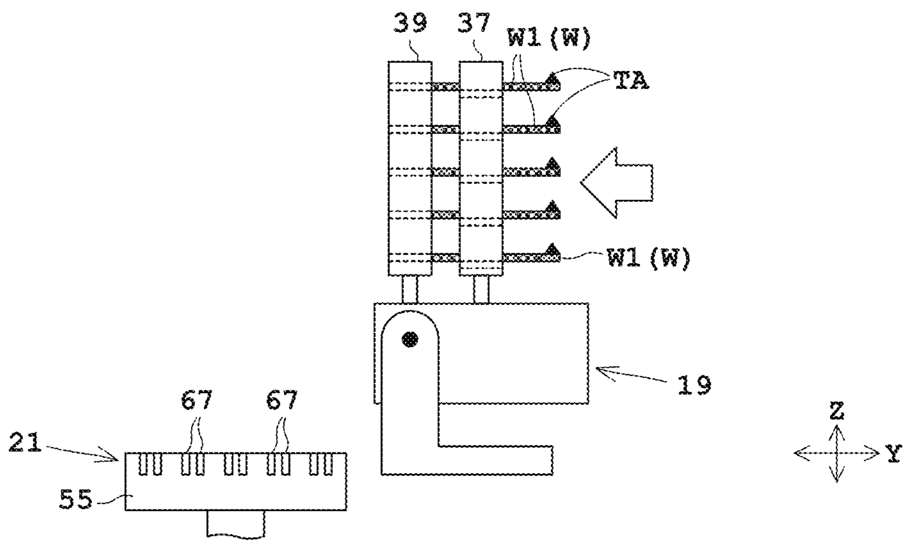
FIGS. 15A, 15B, and 15C are side views for explaining operations of the substrate processing apparatus.

Note that, in FIG. 15A and the like, a reference numeral TA denotes surfaces (device faces or main surfaces) of the substrates W (W1, W2). Note that back faces of the substrates W are faces opposite to front faces of the substrates W. The device faces are faces on which the device is formed or faces on which the device is being formed. Note that, in FIG. 15A and the like, for convenience of illustration, 25 substrates W1 are illustrated as 5 substrates W1, and 25 substrates W2 are illustrated as 5 substrates W2.

[Step S01] Vertical Attitude Changing of First Substrate Group

Refer to FIG. 1. An external transport robot not illustrated sequentially transports the two carriers C to the load ports 9. The carrier transport robot 13 of the stocker 2 transports a first carrier C from one of the load ports 9 to the placement shelf 3. In the first carrier C, for example, the 25 substrates W1 (a first substrate group) aligned at the reference pitch (for example, 10 mm) at which the reference interval TN9 is repeated are stored. The substrate handling mechanism HTR of the transfer block 5 takes out the 25 substrates W1 in the horizontal attitude from the first carrier C placed on the placement shelf 3 with, for example, the 25 hands 27. Then, the substrate handling mechanism HTR transports the 25 substrates W1 taken out to the attitude changer 19. Note that the carrier transport robot 13 moves the empty first carrier C from which the 25 substrates W1 have been taken out from the placement shelf 3 to the storage shelf 11.

Figure 15B:
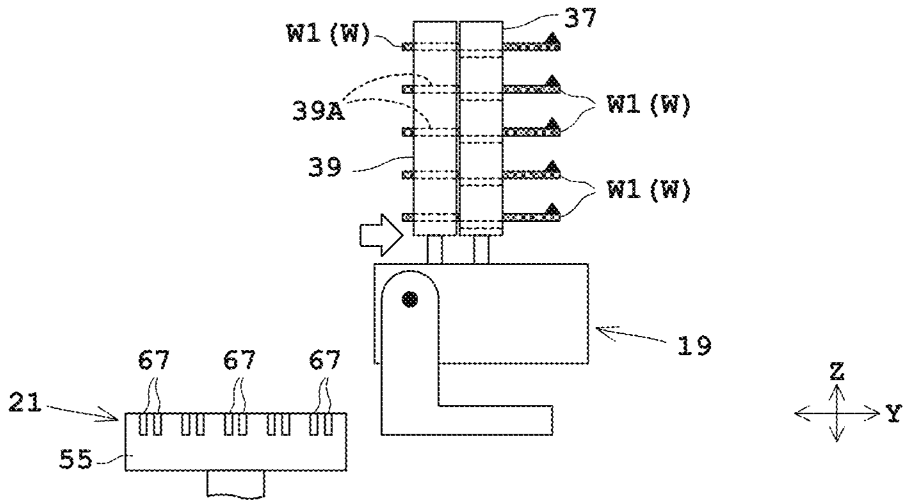

Refer to FIG. 15A. The attitude changer 19 receives the 25 substrates W1 aligned at the reference pitch from the substrate handling mechanism HTR. In the attitude changer 19, the 25 substrates W1 are held (placed) on 25 pairs of shelves 37A of the pair of horizontal holders 37. Refer to FIG. 15B. Thereafter, the accommodation moving portion 53 (see FIG. 4) of the attitude changer 19 brings the pair of vertical holders 39 close to the pair of horizontal holders 37. Accordingly, peripheral edges of the 25 substrates W1 are accommodated and held in the 25 pairs of holding grooves 39A of the pair of vertical holders 39.

Figure 15C:
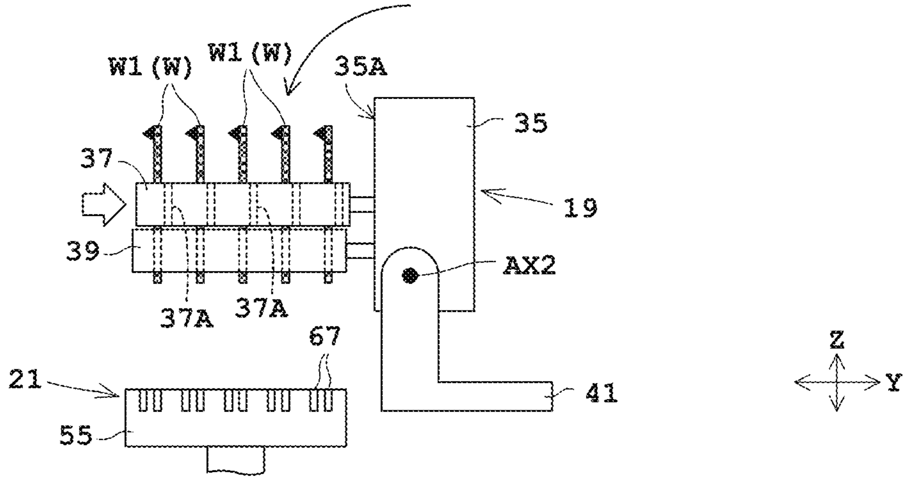

Refer to FIG. 15C. Thereafter, the attitude changer 19 collectively changes the 25 substrates W1 (the first substrate group) held at the reference pitch from the horizontal attitude to the vertical attitude. Specifically, the rotation driver 41 of the attitude changer 19 changes the 25 substrates W1 held by the pair of horizontal holders 37 and the pair of vertical holders 39 from the horizontal attitude to the vertical attitude. Thereafter, the axial moving portion 51 (see FIG. 4) of the attitude changer 19 moves the pair of horizontal holders 37 in a direction where the pair of horizontal holders 37 approaches the support face 35A such that the 25 pairs of shelves 37A of the pair of horizontal holders 37 are separated from the 25 substrates W1 in the vertical attitude.

[Step S02] Reception of First Substrate Group by Pusher Member

Figure 16A:
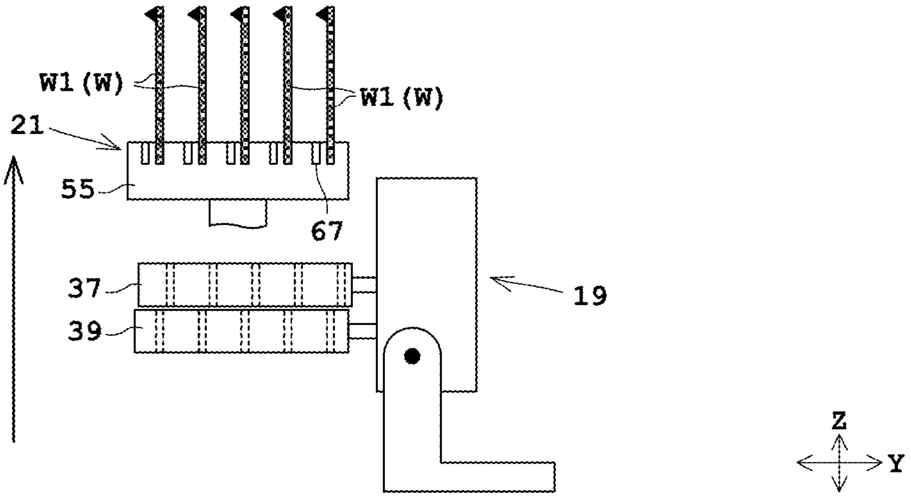
FIGS. 16A, 16B, and 16C are side views for explaining operations of the substrate processing apparatus.

Refer to FIG. 16A. Thereafter, the pusher lifting portion 65 (see FIG. 5) of the pusher mechanism 21 raises the pusher member 55 to a position higher than the pair of horizontal holders 37 and the pair of vertical holders 39. Accordingly, the pusher member 55 receives the 25 substrates W1 (the first substrate group) changed into the vertical attitude. Further, the pusher member 55 holds the 25 substrates W1 aligned at the reference pitch in the vertical attitude. Note that 50 vertical holding grooves 67 are arranged at the unequal pitch.

[Step S03] Movement of First Substrate Group by First Interval

Figure 16B:
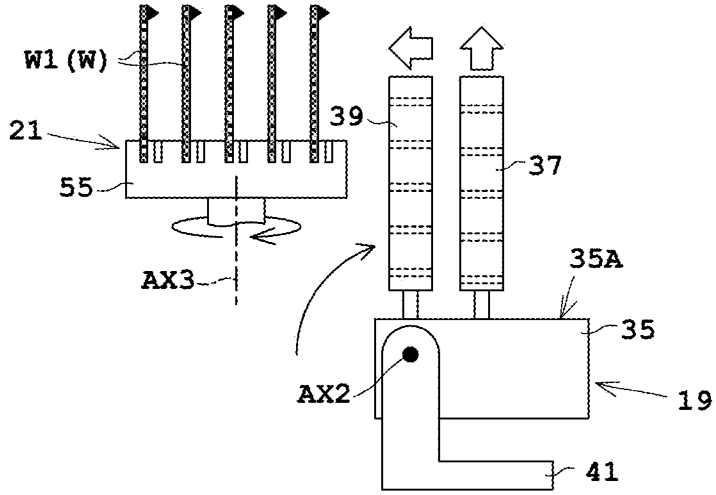

Refer to FIG. 16B. The pusher mechanism 21 moves the 25 substrates W1 held by the pusher member 55 by the first interval TN1 (3.333 mm) in an alignment direction of the 25 substrates W1. Specifically, the pusher rotator 59 (see FIG. 5) of the pusher mechanism 21 rotates the pusher member 55 by 180 degrees about the vertical axis AX3. Accordingly, the 25 substrates W1 held by the pusher member 55 are moved leftward by the first interval TN1. Note that the movement by the first interval TN1 may be performed by rotation of the pusher member 55 by 180 degrees by the pusher rotator 59 and movement of the pusher member 55 in the width direction Y by the pusher horizontal moving portion 61 (see FIG. 5).

Further, the attitude changer 19 rotates the pair of horizontal holders 37 and the like by 90 degrees about the horizontal axis AX2. Accordingly, the pair of horizontal holders 37 and the like are raised. The axial moving portion 51 (see FIG. 4) of the attitude changer 19 moves the pair of horizontal holders 37 in a direction where the pair of horizontal holders 37 is separated from the support face 35A. Further, the accommodation moving portion 53 (see FIG. 4) of the attitude changer 19 moves the pair of vertical holders 39 away from the pair of horizontal holders 37.

[Step S04] Vertical Attitude Changing of Second Substrate Group

The carrier transport robot 13 illustrated in FIG. 1 transports a second carrier C from one of the load ports 9 to the placement shelf 3. Similarly to the first carrier C, for example, the 25 substrates W2 aligned at the reference pitch (10 mm) are stored in the second carrier C. The substrate handling mechanism HTR takes out the 25 substrates W2 in the horizontal attitude from the second carrier C placed on the placement shelf 3 using the 25 hands 27. Then, the substrate handling mechanism HTR transports the 25 substrates W2 taken out to the attitude changer 19. Note that the carrier transport robot 13 moves the empty second carrier C from which the 25 substrates W2 have been taken out from the placement shelf 3 to the storage shelf 11.

Figure 16C:
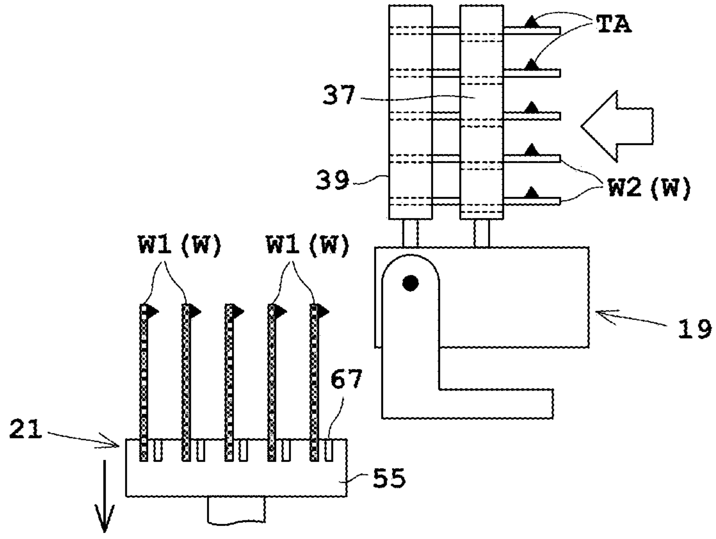
Figure 17A:
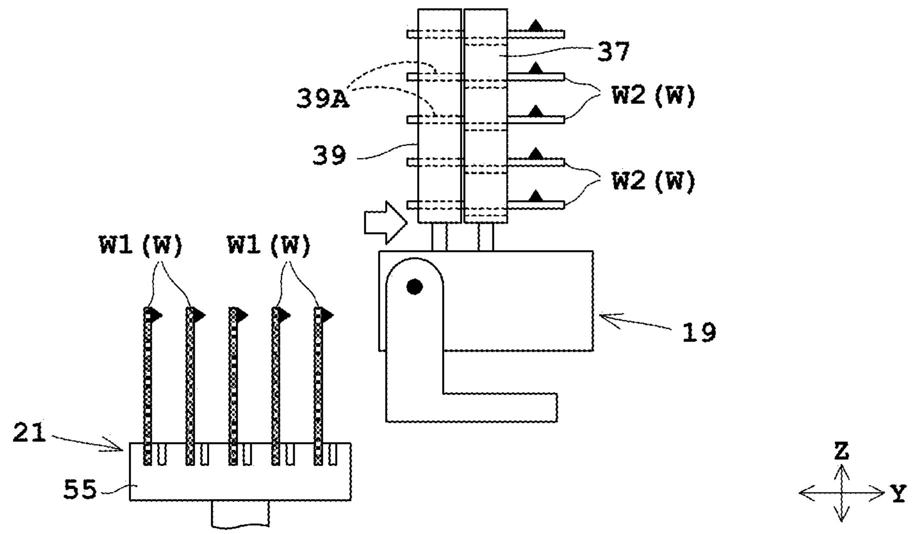
FIGS. 17A, 17B, and 17C are side views for explaining operations of the substrate processing apparatus.

Refer to FIG. 16C. The attitude changer 19 receives the 25 substrates W2 aligned at the reference pitch from the substrate handling mechanism HTR. In the attitude changer 19, the 25 substrates W2 are held on the 25 pairs of shelves 37A of the pair of horizontal holders 37. Refer to FIG. 17A. Thereafter, the accommodation moving portion 53 (see FIG. 4) of the attitude changer 19 brings the pair of vertical holders 39 close to the pair of horizontal holders 37.

Figure 17B:
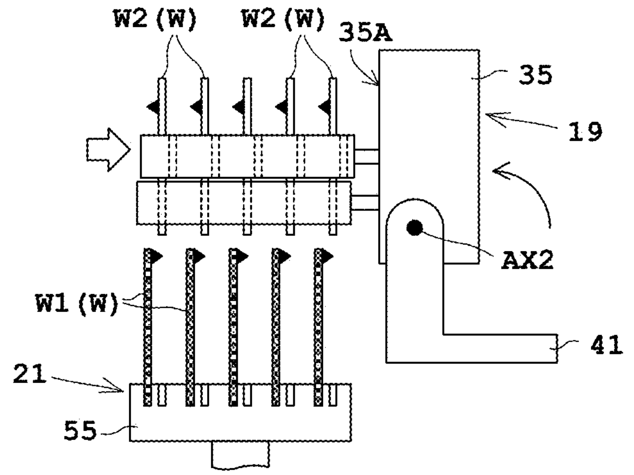

Refer to FIG. 17B. Thereafter, the attitude changer 19 collectively changes the 25 substrates W2 (a second substrate group) held at the reference pitch from the horizontal attitude to the vertical attitude. Thereafter, the axial moving portion 51 (see FIG. 4) of the attitude changer 19 moves the pair of horizontal holders 37 in the direction where the pair of horizontal holders 37 approaches the support face 35A such that the 25 pairs of shelves 37A of the pair of horizontal holders 37 are separated from the 25 substrates W1 in the vertical attitude.

[Step S05] Reception of Second Substrate Group by Pusher Member

Figure 17C:
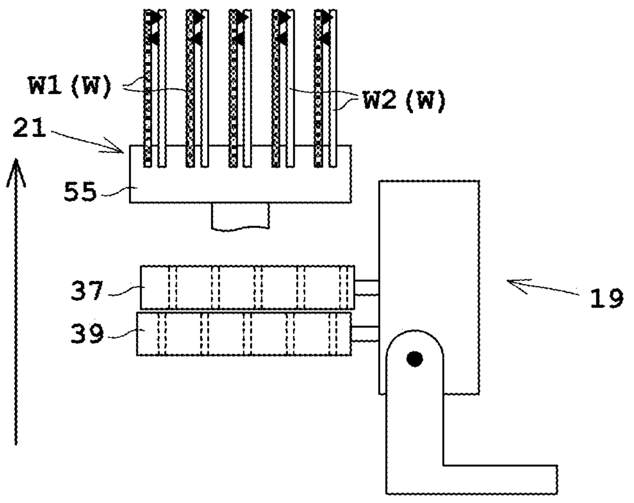

Refer to FIG. 17C. Thereafter, the pusher lifting portion 65 (see FIG. 5) of the pusher mechanism 21 raises the pusher member 55 to the position higher than the pair of horizontal holders 37 and the pair of vertical holders 39. Accordingly, the pusher member 55 receives the 25 substrates W2 (the second substrate group) changed into the vertical attitude. Further, the pusher member 55 holds 50 substrates W (W1, W2) aligned at the unequal pitch. The 50 substrates W are configured by alternately arranging the 25 substrates W1 and the 25 substrates W2.

Further, as illustrated in FIGS. 17B and 17C, the surfaces (the device surfaces or the main surfaces) of the 25 substrates W1 face a predetermined direction (a right side). On the other hand, the surfaces of the 25 substrates W2 face a direction (a left side) opposite to the predetermined direction. In other words, the 50 substrates W are arranged in a so-called face-to-face manner.

Figure 18A:
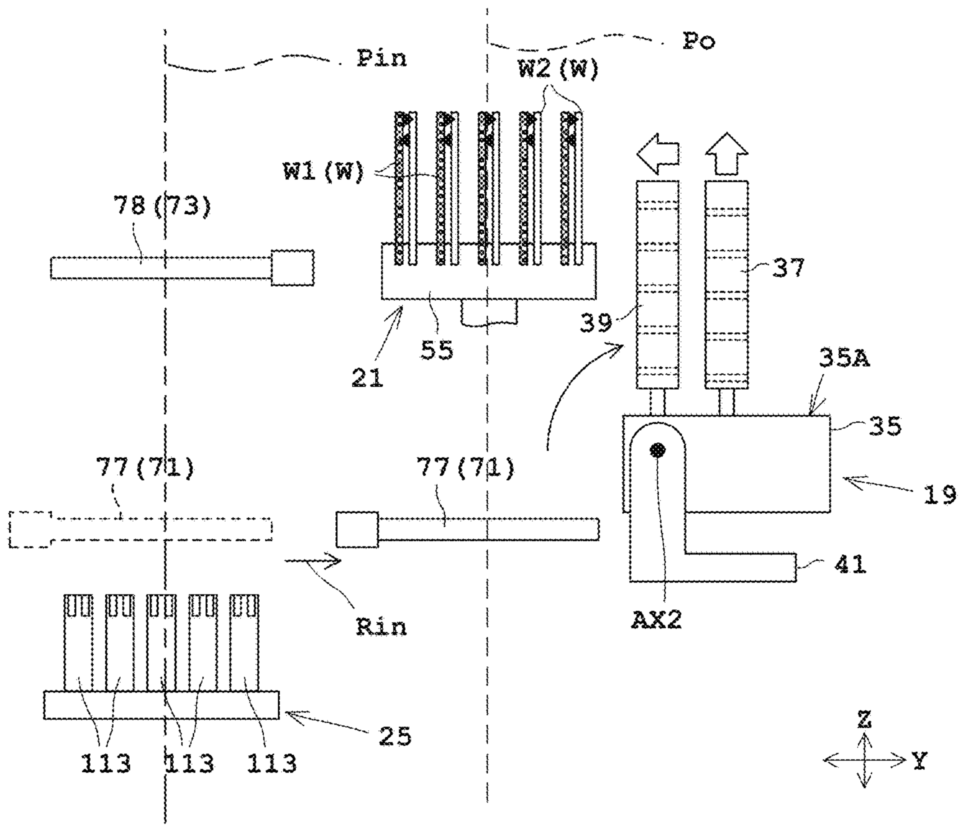
FIGS. 18A and 18B are side views for explaining operations of the substrate processing apparatus.

[Step S06] Transport of Processed Substrate Group to Pitch Converter by Carry-In Mechanism Thereafter, the carry-in mechanism 71 transports the 50 substrates W (a processed substrate group) aligned at the unequal pitch from the pusher member 55 to the first pitch converter 25. This operation will be described in details. Refer to FIG. 18A. First, the attitude changer 19 rotates the pair of horizontal holders 37 and the like by 90 degrees about the horizontal axis AX2. Accordingly, the pair of horizontal holders 37 and the like are raised.

Figure 18B:
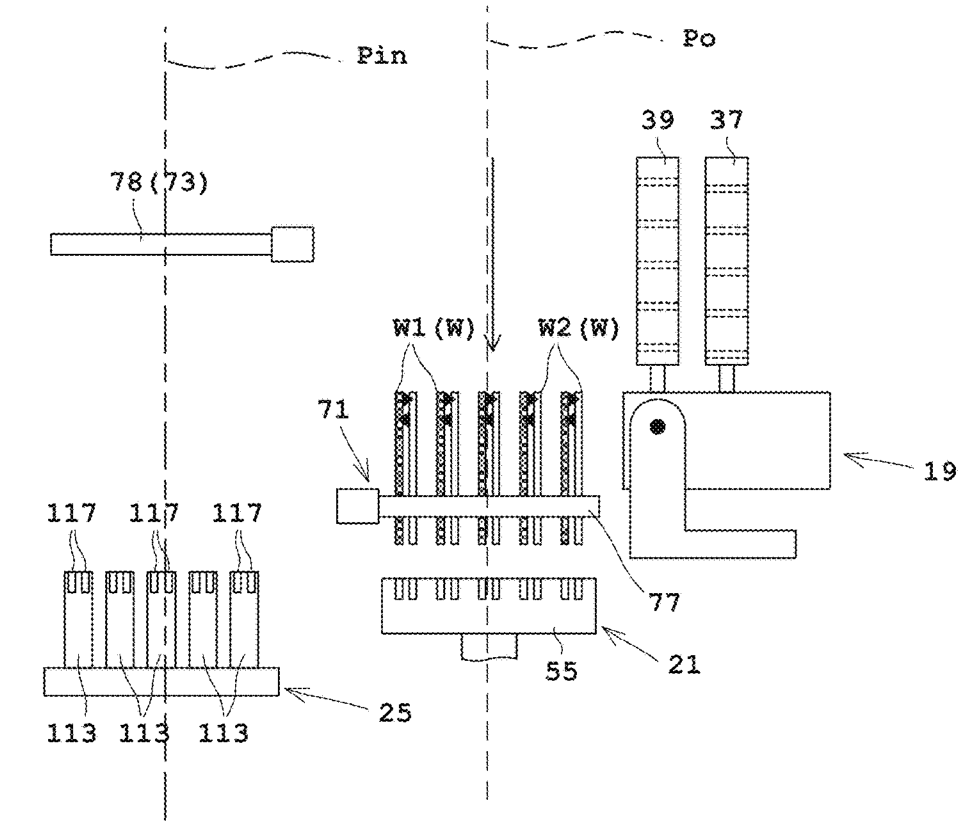

Refer to FIG. 18B. Thereafter, the carry-in mechanism 71 horizontally moves the chuck 77 from the position above the first pitch converter 25 to a position below the pusher member 55. In other words, the carry-in mechanism 71 causes the chuck 77 without holding the substrates W to traverse from the substrate carry-in position Pin to the substrate transfer position Po along the first traverse path Rin. Before the traverse, the first pitch converter 25 is located below the first traverse path Rin. The first pitch converter 25 is located at the substrate carry-in position Pin. The first pitch converter 25 is located below the chuck 77. Further, the pusher member 55 is located at the substrate transfer position Po. The chuck 77 is in a closed state in which the 50 substrates W are held. Thereafter, the pusher mechanism 21 lowers the pusher member 55 that holds the 50 substrates W in the vertical attitude. When the pusher member 55 passes between the pair of chuck members 77A, 77B of the chuck 77, the 50 substrates W are delivered from the pusher member 55 to the chuck 77. The chuck 77 holds the 50 substrates W aligned at the unequal pitch in the vertical attitude.

Figure 19A:
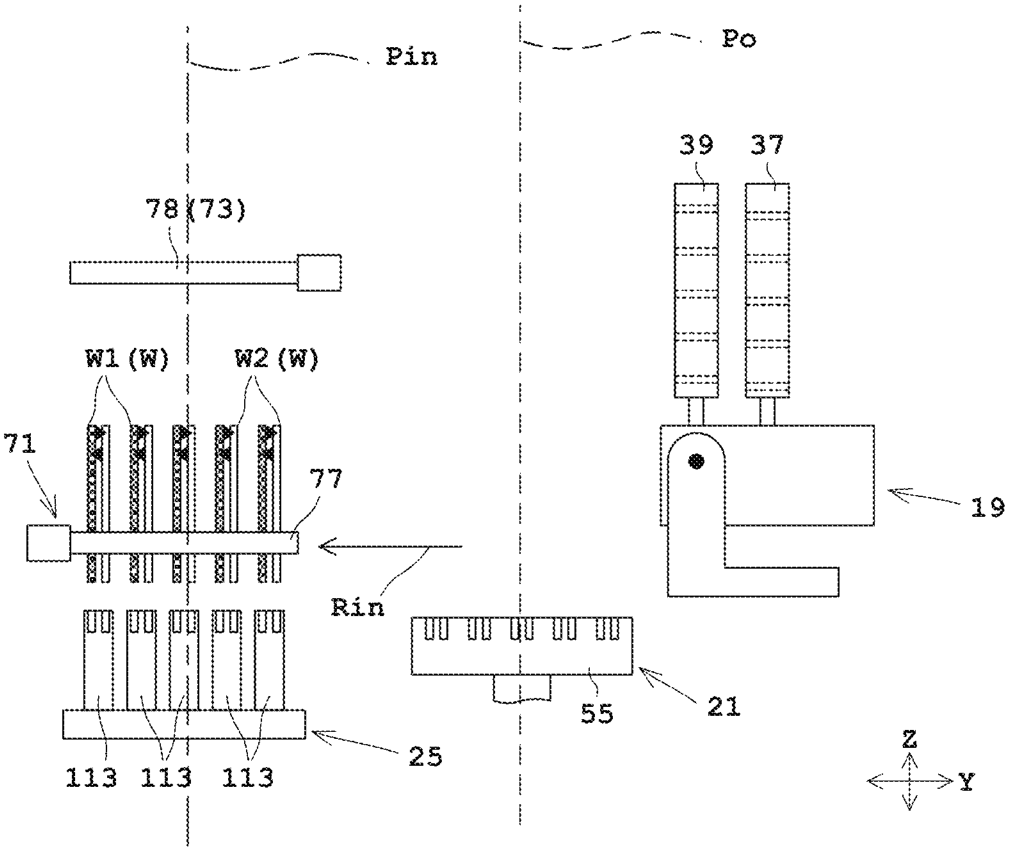
FIGS. 19A and 19B are side views for explaining operations of the substrate processing apparatus.
Figure 19B:
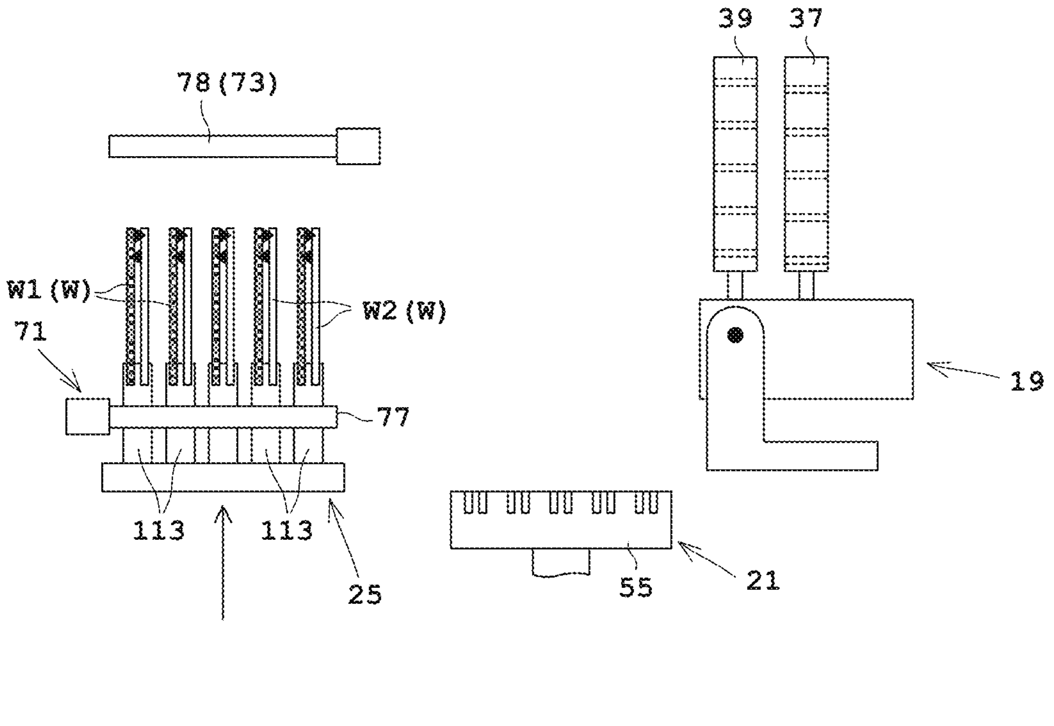

Refer to FIG. 19A. Thereafter, the carry-in mechanism 71 moves the chuck 77 from a position above the pusher member 55 to the position above the first pitch converter 25. In other words, the carry-in mechanism 71 causes the chuck 77 holding the 50 substrates W to traverse from the substrate transfer position Po to the substrate carry-in position Pin along the first traverse path Rin. After the traverse, the first pitch converter 25 is located below the first traverse path Rin. The first pitch converter 25 is located at the substrate carry-in position Pin. The first pitch converter 25 is located below the chuck 77. Further, the pusher member 55 is located at the substrate transfer position Po. The substrate carry-in position is the position above the first pitch converter 25. Refer to FIG. 19B. Thereafter, the lifting portion 141 (see FIG. 7) of the first pitch converter 25 raises the pitch conversion body 111 including 25 holding members 113. Accordingly, the first pitch converter 25 receives the 50 substrates W from the carry-in mechanism 71.

Figure 20A:
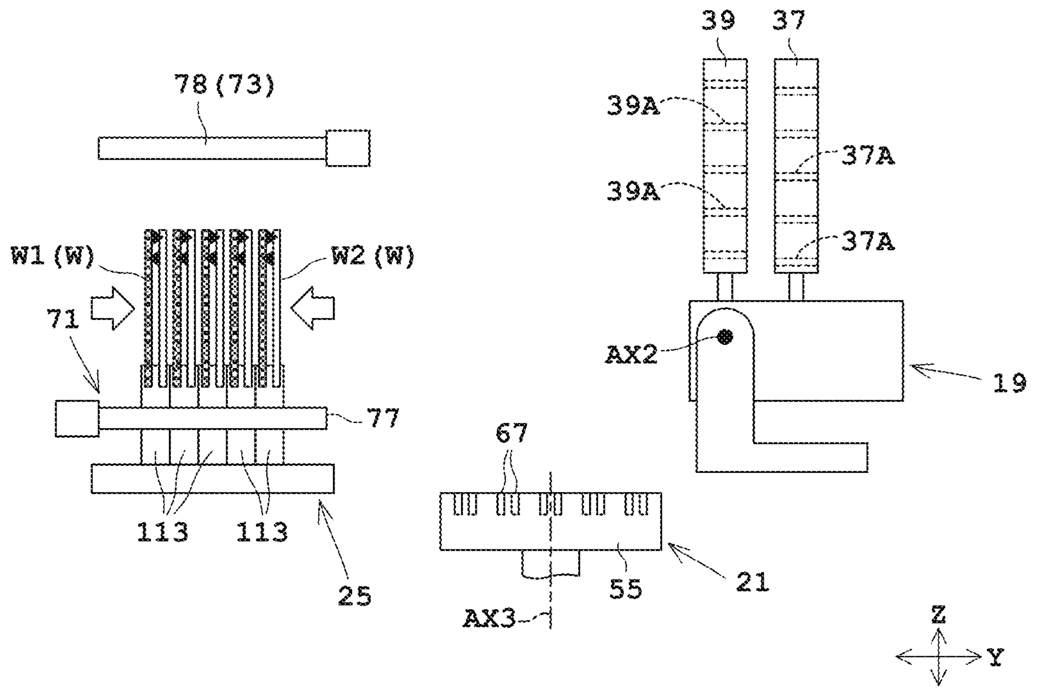
FIGS. 20A and 20B are side views for explaining operations of the substrate processing apparatus.

[Step S07] Pitch Conversion of Processed Substrate Group from Unequal Pitch to Narrow Pitch Refer to FIG. 20A. Thereafter, the first pitch converter 25 converts the pitches of the 50 substrates W from the unequal pitch to the narrow pitch (3.333 mm). In other words, the first pitch converter 25 aligns, at the narrow pitch, the 50 substrates W aligned at the unequal pitch. This operation will be described in details.

The 25 holding members 113 of the first pitch converter 25 each have the two holding grooves 117 separated by the first interval (3.333 mm). The first pitch converter 25 holds two substrates W1, W2 out of the 50 substrates W using the two holding grooves 117 of each of the 25 holding members 113, and holds the 50 substrates W aligned at the unequal pitch using the 25 holding members 113.

Further, the moving portion 115 (see FIG. 10) of the first pitch converter 25 moves the 25 holding members 113 in the alignment direction (a Y direction) of the 50 substrates W so as to change from an unequal pitch state in which the 50 substrates W are aligned at the unequal pitch to a narrow pitch state in which the 50 substrates W are aligned at the narrow pitch. Note that the intermediary mechanism 73 opens the chuck 78.

Figure 20B:
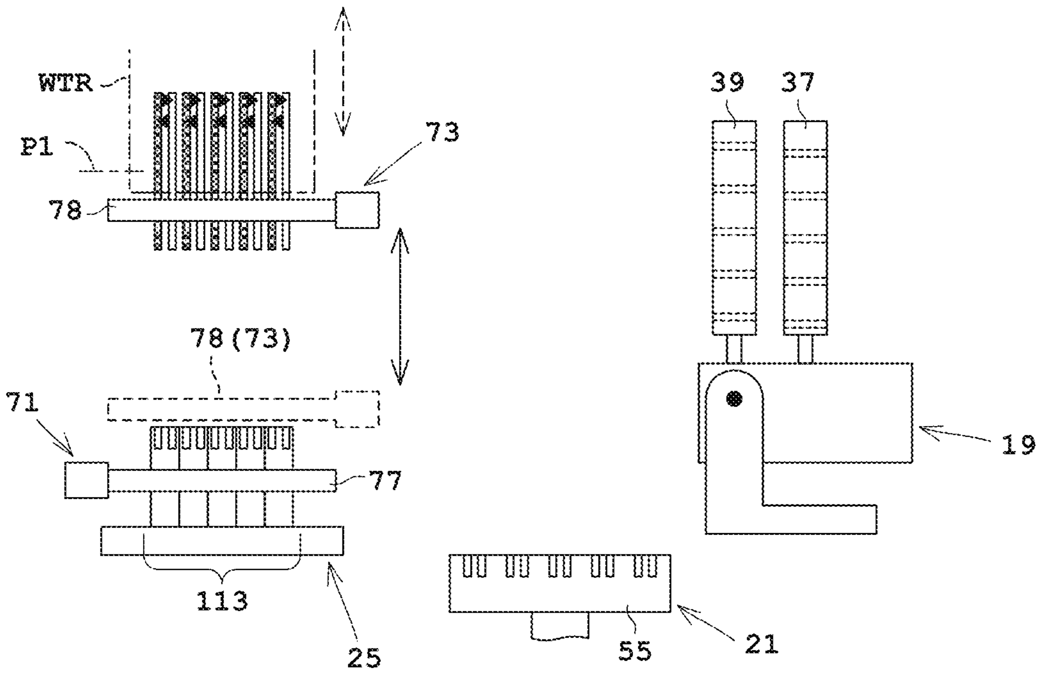

[Step S08] Transport of Processed Substrate Group to First Delivery Position by Intermediary Mechanism Refer to FIG. 20B. Thereafter, the intermediary mechanism 73 lowers the chuck 78 as indicated by a broken line in order to receive the 50 substrates W aligned at the narrow pitch held by the first pitch converter 25. Thereafter, the intermediary mechanism 73 closes the chuck 78. Accordingly, the 50 substrates W can be held by the chuck 78.

Thereafter, the intermediary mechanism 73 raises the chuck 78 to the first delivery position P1. This makes it possible for the intermediary mechanism 73 to receive the 50 substrates W from the first pitch converter 25 and deliver the 50 substrates W to the main transport mechanism WTR. Note that the chuck 78 holds the 50 substrates W aligned at the narrow pitch in the vertical attitude.

[Step S09] Substrate Processing and Drying Processing

Thereafter, the main transport mechanism WTR receives the 50 substrates W from the intermediary mechanism 73 using the chuck 145, and transports the 50 substrates W to one of the two chemical liquid processing tanks BT1, BT3. For example, when the main transport mechanism WTR transports the 50 substrates W to the chemical liquid processing tank BT1, the lifter LF1 receives the 50 substrates W aligned at the narrow pitch from the main transport mechanism WTR at a position above the chemical liquid processing tank BT1. Thereafter, the lifter LF1 immerses the 50 substrates W in the chemical liquid stored in the chemical liquid processing tank BT1 by lowering the 50 substrates W. Accordingly, the 50 substrates W are collectively processed with the chemical liquid.

Further, after a preset chemical liquid processing time has elapsed, the lifter LF1 pulls up the 50 substrates W from the chemical liquid in the chemical liquid processing tank BT1 by raising the 50 substrates W. Thereafter, the lifter LF1 horizontally moves the 50 substrates W from the position above the chemical liquid processing tank BT1 to a position above the cleaning processing tank BT2. Thereafter, the lifter LF1 immerses the 50 substrates W in the pure water stored in the cleaning processing tank BT2 by lowering the 50 substrates W. Accordingly, the 50 substrates W are collectively cleaned. After the preset cleaning processing time has elapsed, the lifter LF1 pulls up the 50 substrates W from the pure water in the cleaning processing tank BT2.

Note that, when the main transport mechanism WTR transports the 50 substrates W to the chemical liquid processing tank BT3, the lifter LF2 receives the 50 substrates W from the main transport mechanism WTR. Then, the lifter LF2 transports the 50 substrates W in order of the chemical liquid processing tank BT3 and the cleaning processing tank BT4.

The main transport mechanism WTR receives the 50 substrates W from one of two lifters LF1, LF2 using the chuck 145 and transports the 50 substrates W to the dryer 143. The dryer 143 dries the 50 substrates W. Thereafter, the main transport mechanism WTR receives the dried 50 substrates W from the dryer 143.

Next, the second half operation from the drying process to the transport of the carriers C from the load ports 9 will be described with reference to FIG. 21.

Figure 22A:
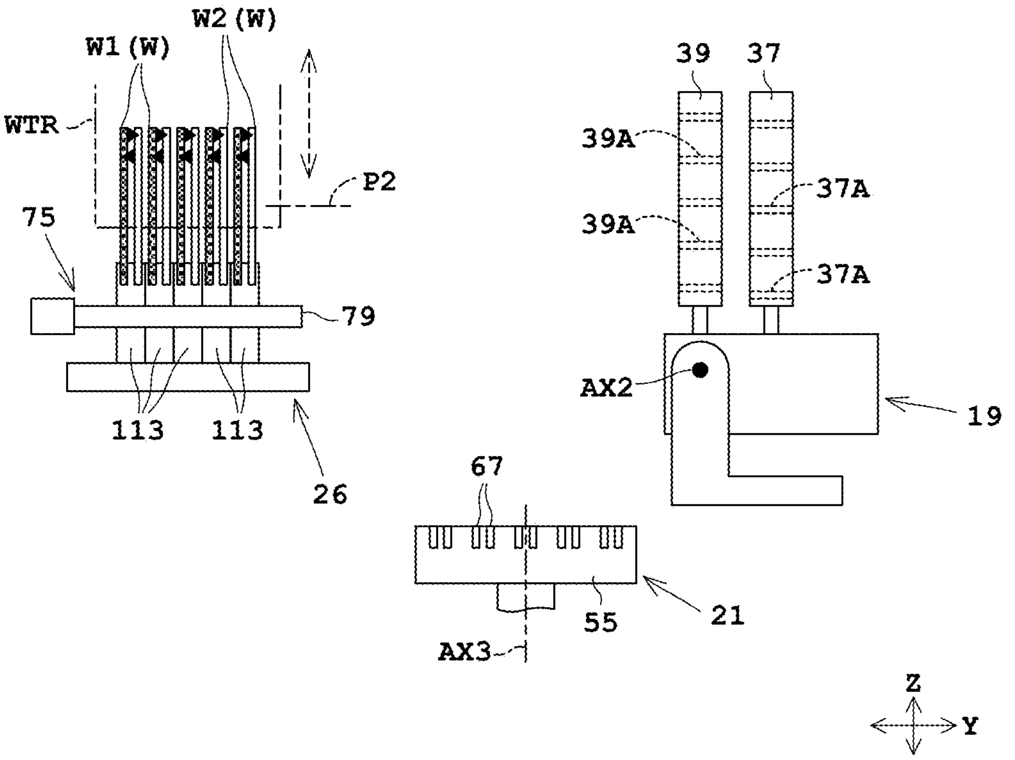
FIGS. 22A and 22B are side views for explaining operations of the substrate processing apparatus.

[Step S11] Transport of Processed Substrate Group to Second Delivery Position by Main Transport Mechanism Refer to FIGS. 2 and 22A. The main transport mechanism WTR transports the 50 substrates W in the vertical attitude, which are collectively processed in the chemical liquid processing tank BT1 or the like and aligned at the narrow pitch, to a position above the second pitch converter 26. In other words, the main transport mechanism WTR transports the 50 substrates W dried by the dryer 143 to the position above the second pitch converter 26.

Thereafter, the main transport mechanism WTR lowers the 50 substrates W held by the chuck 145 to the delivery position P2. Accordingly, the main transport mechanism WTR transports the 50 substrates W in the vertical attitude aligned at the narrow pitch to the second pitch converter 26. Further, the second pitch converter 26 receives the 50 substrates W in the vertical attitude aligned at the narrow pitch from the main transport mechanism WTR. Note that, when receiving the 50 substrates W, the second pitch converter 26 moves 25 holding members 113 such that 50 holding grooves 117 are arranged at the narrow pitch.

Figure 22B:
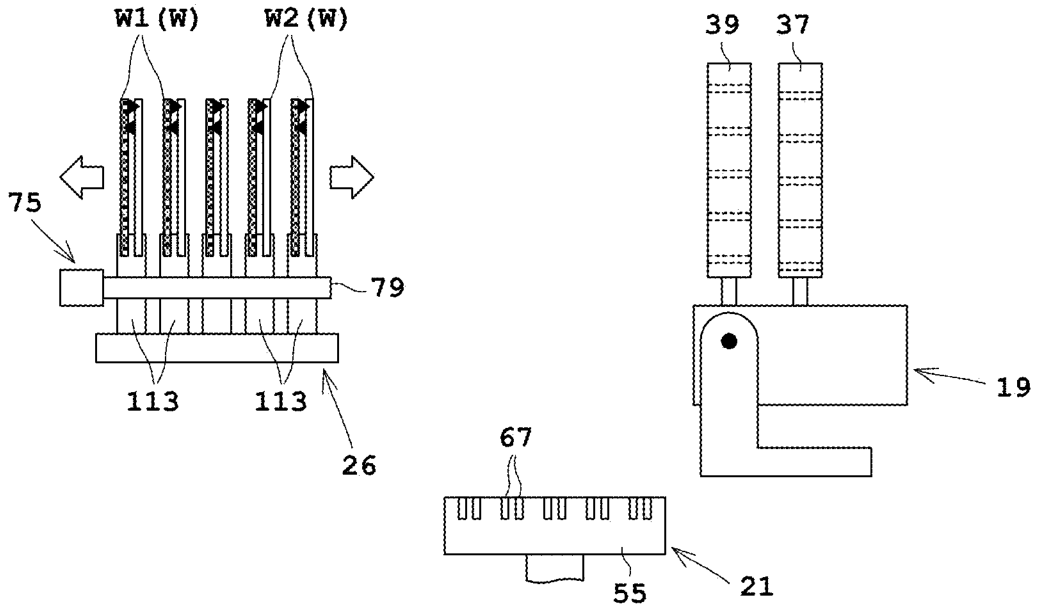

[Step S12] Pitch Conversion of Processed Substrate Group from Narrow Pitch to Unequal Pitch Refer to FIG. 22B. Thereafter, the second pitch converter 26 converts the pitches of the 50 substrates W from the narrow pitch to the unequal pitch. This operation will be described in details. The second pitch converter 26 holds the 50 substrates W aligned at the narrow pitch using the 25 holding members 113 while holding two substrates W at the first interval TN1 using the two holding grooves 117 separated by the first interval TN1, the two holding grooves 117 being included in each of the 25 holding members 113. The moving portion 115 (see FIG. 10) moves the 25 holding members 113 in the alignment direction (the width direction Y) of the 50 substrates W to change from the narrow pitch state to the unequal pitch state.

Figure 23A:
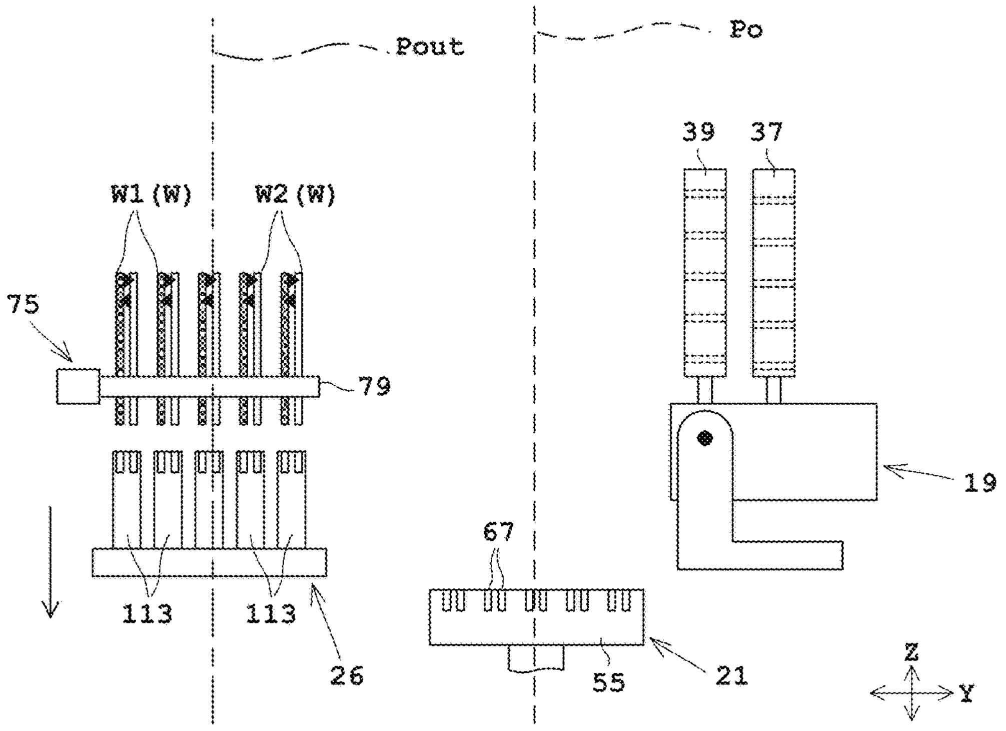
FIGS. 23A and 23B are side views for explaining operations of the substrate processing apparatus.

[Step S13] Transport of Processed Substrate Group to Pusher Member by Carry-Out Mechanism Refer to FIG. 23A. Thereafter, the carry-out mechanism 75 of the delivery mechanism 23 transports the 50 substrates W aligned at the unequal pitch in the vertical attitude from the second pitch converter 26 to the pusher member 55. This operation will be described in details. The chuck 79 of the carry-out mechanism 75 is closed. First, the lifting portion 141 (see FIG. 7) of the second pitch converter 26 lowers the pitch conversion body 111 including the 25 holding members 113. During the lowering, the carry-out mechanism 75 receives and holds the 50 substrates W in the vertical attitude aligned at the unequal pitch using the chuck 79.

Figure 23B:
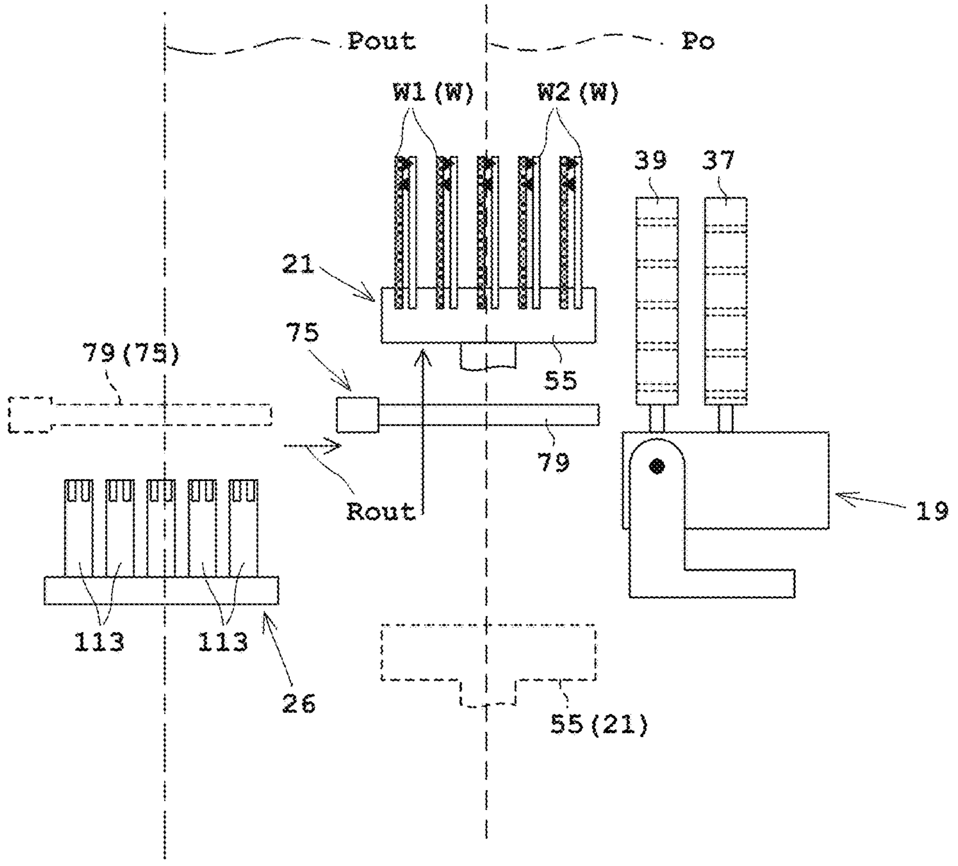

Refer to FIG. 23B. Thereafter, the carry-out mechanism 75 transports the 50 substrates W held by the chuck 79 from the position above the second pitch converter 26 to the position above the pusher member 55. In other words, the carry-out mechanism 75 causes the chuck 79 holding the 50 substrates W to traverse from the substrate carry-out position Pout to the substrate transfer position Po along the second traverse path Rout. Before the traverse of the chuck 79, the second pitch converter 26 is located below the second traverse path Rout. The second pitch converter 26 is located at the substrate carrying-out position Pout. The second pitch converter 26 is located below the chuck 79. Further, the pusher member 55 is located at the substrate transfer position Po. Thereafter, the pusher mechanism 21 raises the pusher member 55 to a position higher than the chuck 79. During the raising, the pusher mechanism 21 receives and holds the 50 substrates W from the chuck 79 of the carry-out mechanism 75 using the pusher member 55. The pusher member 55 holds the 50 substrates W aligned at the unequal pitch in the vertical attitude.

[Step S14] Reception of Second Substrate Group by Attitude Changer

Figure 24A:
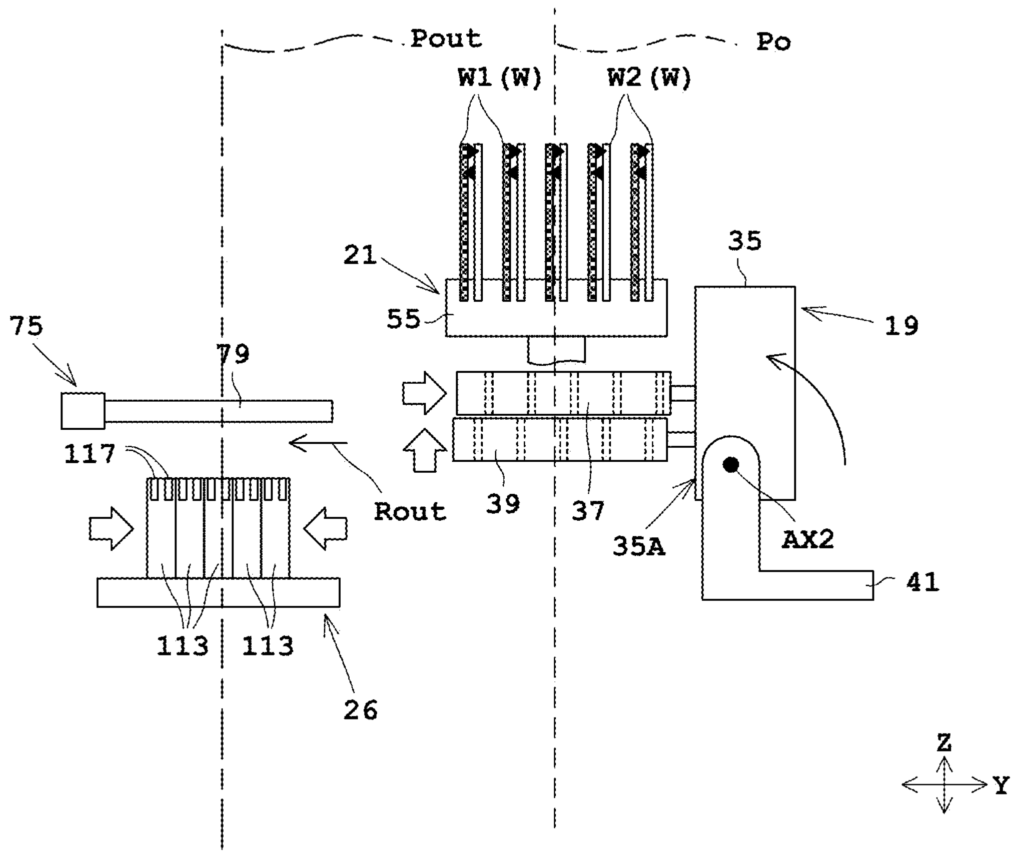
FIGS. 24A and 24B are side views for explaining operations of the substrate processing apparatus.

Refer to FIG. 24A. Thereafter, the carry-out mechanism 75 moves the chuck 79 to the position above the second pitch converter 26. In other words, the carry-out mechanism 75 causes the chuck 79 without holding the substrates W to traverse from the substrate carry-out position Pout to the substrate transfer position Po along the second traverse path Rout. After the traverse of the chuck 79, the second pitch converter 26 is located below the second traverse path Rout. The second pitch converter 26 is located at the substrate carrying-out position Pout. The second pitch converter 26 is located below the chuck 79. Further, the pusher member 55 is located at the substrate transfer position Po. Thereafter, the rotation driver 41 of the attitude changer 19 rotates the pair of horizontal holders 37 and the like by 90 degrees about the horizontal axis AX2 in order for the pair of vertical holders 39 to receive the 25 substrates W2 (the second substrate group). Accordingly, the pair of horizontal holders 37 and the pair of vertical holders 39 are in a laid-down state. Further, the axial moving portion 51 brings the pair of horizontal holders 37 close to the support face 35A, and the accommodation moving portion 53 brings the pair of vertical holders 39 close to the pair of horizontal holders 37.

Figure 24B:
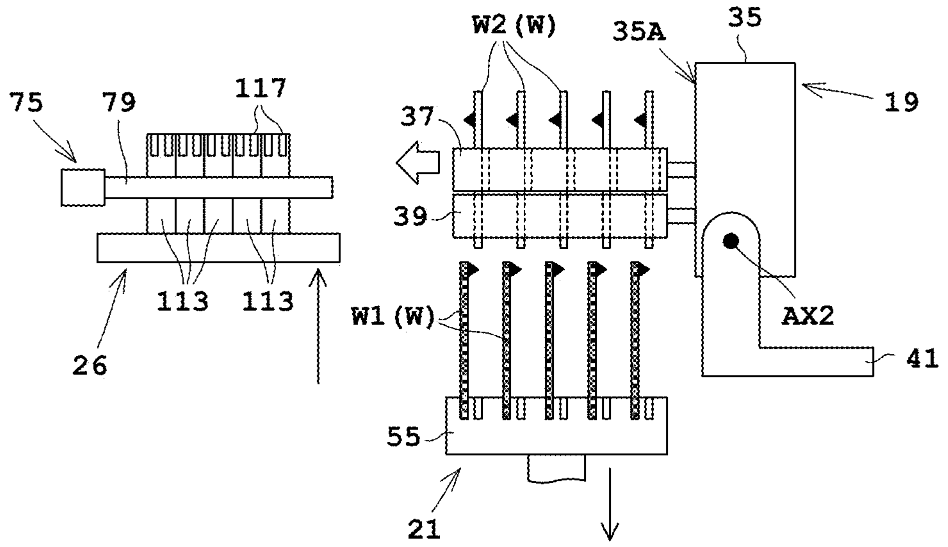

Refer to FIG. 24B.

Thereafter, the pusher mechanism 21 lowers the pusher member 55 from a position above the pair of vertical holders 39 to a position below the pair of vertical holders 39. During the lowering, the attitude changer 19 receives the 25 substrates W2 (the second substrate group) out of the 50 substrates W (the processed substrate group) from the pusher member 55 using the pair of horizontal holders 37 and the pair of vertical holders 39. The pair of vertical holders 39 holds the 25 substrates W2 aligned at the reference pitch (10 mm). Thereafter, the axial moving portion 51 moves the pair of horizontal holders 37 away from the support face 35A. Accordingly, the 25 pairs of shelves 37A of the pair of horizontal holders 37 come into contact with back surfaces of the 25 substrates W2, respectively.

Note that, as illustrated in FIG. 24A, the moving portion 115 of the second pitch converter 26 moves 25 (24) holding members 113 such that the 50 holding grooves 117 are arranged at the narrow pitch. As illustrated in FIG. 24B, the lifting portion 141 of the second pitch converter 26 raises the pitch conversion body 111 including the 25 holding members 113 such that the 50 holding grooves 117 are disposed at positions higher than the chuck 79.

[Step S15] Vertical Attitude Changing of Second Substrate Group

Figure 25A:
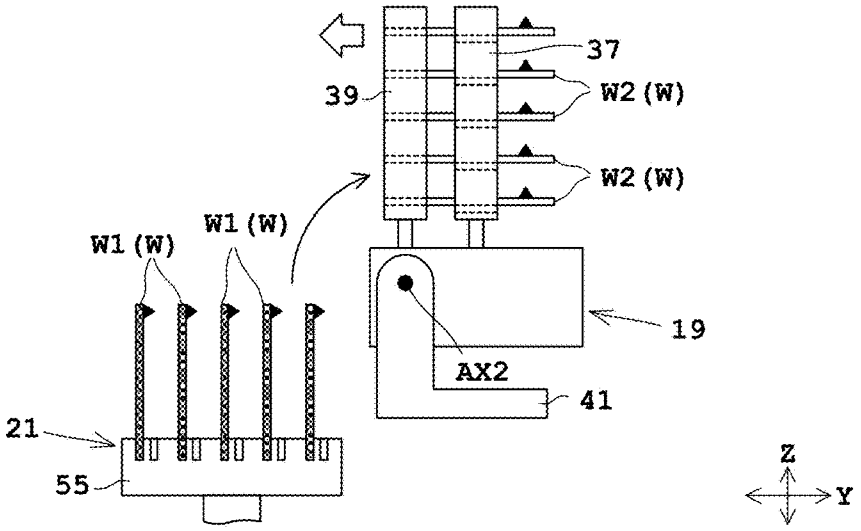
FIGS. 25A, 25B, and 25C are side views for explaining operations of the substrate processing apparatus.

Refer to FIG. 25A.

The attitude changer 19 rotates the pair of horizontal holders 37 and the like by 90 degrees about the horizontal axis AX2. Accordingly, the attitude changer 19 changes the 25 substrates W2 from the vertical attitude to the horizontal attitude.

Thereafter, the accommodation moving portion 53 moves the pair of vertical holders 39 away from the pair of horizontal holders 37. Accordingly, peripheral edges of the 25 substrates W2 are taken out from the 25 pairs of holding grooves 39A of the pair of vertical holders 39.

The carrier transport robot 13 illustrated in FIG. 1 transports the empty second carrier C from the storage shelf 11 to the placement shelf 3. The substrate handling mechanism HTR takes out, from the attitude changer 19, the 25 substrates W2 which are changed to the horizontal attitude by the attitude changer 19 and aligned at the reference pitch (see FIG. 25B). Thereafter, the substrate handling mechanism HTR transports the 25 substrates W2 into the second carrier C placed on the placement shelf 3. Thereafter, the carrier transport robot 13 transports the second carrier C storing the processed 25 substrates W2 from the placement shelf 3 to the load ports 9.

[Step S16] Movement of First Substrate Group by First Interval

Figure 25B:
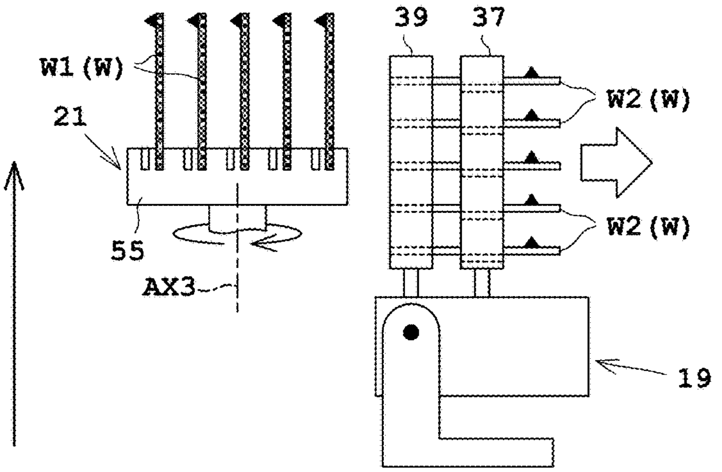

Refer to FIG. 25B. After the attitude changer 19 changes the 25 substrates W2 to the horizontal attitude, the pusher mechanism 21 raises the pusher member 55 holding the 25 substrates W1 (the first substrate group).

Further, the pusher mechanism 21 moves the 25 substrates W1 held by the pusher member 55 by the first interval TN1 (3.333 mm) in the alignment direction of the 25 substrates W1. Specifically, the pusher rotator 59 (see FIG. 5) of the pusher mechanism 21 rotates the pusher member 55 by 180 degrees about the vertical axis AX3. Accordingly, the 25 substrates W1 held by the pusher member 55 are moved rightward by the first interval TN1. Note that the movement by the first interval TN1 may be performed by rotation of the pusher member 55 by 180 degrees by the pusher rotator 59 and movement of the pusher member 55 in the width direction Y by the pusher horizontal moving portion 61 (see FIG. 5).

[Step S17] Reception of First Substrate Group by Attitude Changer

Figure 25C:
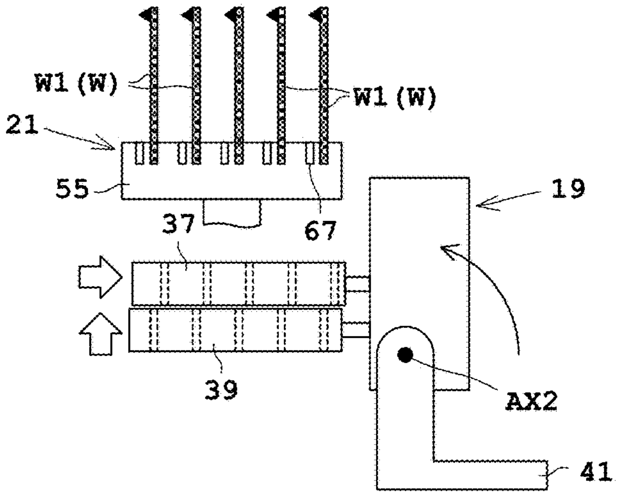

Refer to FIG. 25C. The attitude changer 19 brings the pair of horizontal holders 37 and the pair of vertical holders 39 into the laid-down state. Further, the axial moving portion 51 brings the pair of horizontal holders 37 close to the support face 35A, and the accommodation moving portion 53 brings the pair of vertical holders 39 close to the pair of horizontal holders 37.

Figure 26A:
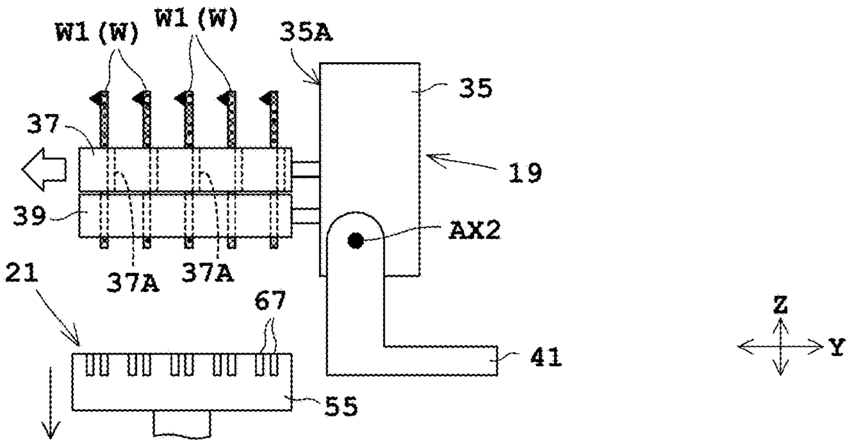
FIGS. 26A, 26B, and 26C are side views for explaining operations of the substrate processing apparatus.

Refer to FIG. 26A. Thereafter, the pusher mechanism 21 lowers the pusher member 55 from the position above the pair of vertical holders 39 to the position below the pair of vertical holders 39. During the lowering, the attitude changer 19 receives the remaining 25 substrates W1 from the pusher member 55 using the pair of horizontal holders 37 and the pair of vertical holders 39. The pair of vertical holders 39 holds the 25 substrates W1 aligned at the reference pitch (for example, 10 mm). Thereafter, the axial moving portion 51 brings the 25 pairs of shelves 37A of the pair of horizontal holders 37 into contact with the back surfaces of the 25 substrates W1, respectively.

[Step S18] Vertical Attitude Changing of First Substrate Group

Figure 26B:
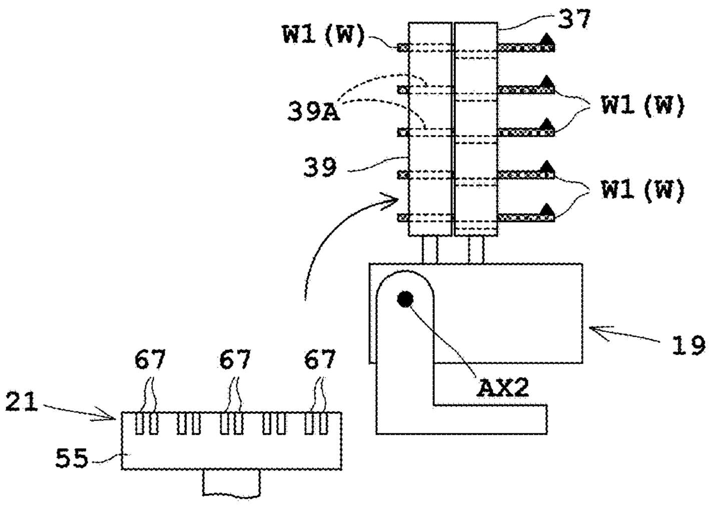
Figure 26C:
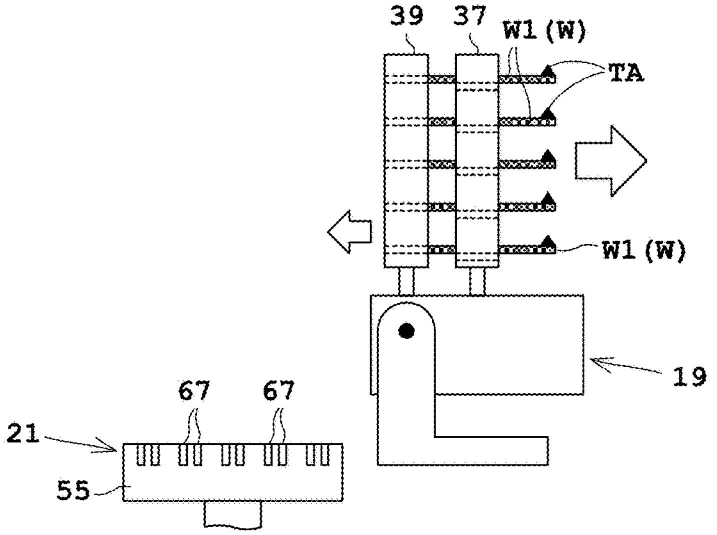

Refer to FIG. 26B. The attitude changer 19 rotates the pair of horizontal holders 37 and the like by 90 degrees about the horizontal axis AX2. Accordingly, the attitude changer 19 changes the 25 substrates W1 from the vertical attitude to the horizontal attitude. Refer to FIG. 26C. Thereafter, the accommodation moving portion 53 moves the pair of vertical holders 39 away from the pair of horizontal holders 37.

The carrier transport robot 13 illustrated in FIG. 1 transports the empty first carrier C from the storage shelf 11 to the placement shelf 3. The substrate handling mechanism HTR takes out, from the attitude changer 19, the 25 substrates W1 which are changed to the horizontal attitude by the attitude changer 19 and aligned at the reference pitch (10 mm) (see FIG. 26C). Thereafter, the substrate handling mechanism HTR transports the 25 substrates W1 into the first carrier C placed on the placement shelf 3. Thereafter, the carrier transport robot 13 transports the first carrier C storing the processed 25 substrates W1 from the placement shelf 3 to the load ports 9. Thereafter, the external transport robot not illustrated sequentially transports the two carriers C from the load ports 9 to the next destination.

The chuck 77 described above corresponds to the “first traverse holder” of the present invention. The carry-in mechanism 71 described above corresponds to the “first traverse mechanism” of the present invention. The chuck 79 described above corresponds to the “second traverse holder” of the present invention. The carry-out mechanism 75 described above corresponds to the “second traverse mechanism” of the present invention. The chuck 78 described above corresponds to the “intermediary holder” of the present invention.

According to Example 1, the attitude changer 19 changes the attitudes of the substrates to the horizontal holding attitude in which the substrate group of the substrates in the horizontal attitude aligned at the reference pitch in the vertical direction is held, and the vertical holding attitude in which the substrate group of the substrates in the vertical attitude aligned at the reference pitch in the horizontal direction is held. The pusher mechanism 21 includes the pusher member 55 that combines the substrates W2 (the second substrate group) in the vertical holding attitude held by the attitude changer 19 and the substrates W1 (the first substrate group) in the vertical holding attitude delivered in advance from the attitude changer 19 to hold the plurality of substrates aligned at the unequal pitch narrower than the reference pitch. The first pitch converter 25 receives the plurality of substrates aligned at the unequal pitch, and aligns, at the narrow pitch narrower than the reference pitch, the plurality of substrates aligned at the unequal pitch. The processing block 7 collectively processes the plurality of substrates aligned at the narrow pitch. The main transport mechanism WTR collectively transports the plurality of substrates aligned at the narrow pitch to the processing block 7. The first pitch converter 25 and the second pitch converter 26 are disposed on the main transport mechanism WTR side (a left side in a left-right direction Y) of the pusher mechanism 21.

In this way, the pusher mechanism 21 combines the substrates W2 (the second substrate group) in the vertical holding attitude held by the attitude changer 19 and the substrates W1 (the first substrate group) in the vertical holding attitude delivered in advance from the attitude changer 19 to hold the plurality of substrates aligned at the unequal pitch narrower than the reference pitch. A process of making the plurality of substrates aligned at the unequal pitch from the substrate group at the reference pitch is referred to as first-stage pitch conversion. The first pitch converter 25 receives the plurality of substrates aligned at the unequal pitch, and aligns, at the narrow pitch narrower than the reference pitch, the plurality of substrates aligned at the unequal pitch. A process of making the plurality of the substrates aligned at the narrow pitch from the plurality of the substrates aligned at the unequal pitch is referred to as second-stage pitch conversion. In the present invention, the second-stage pitch conversion is not performed by the pusher mechanism 21, but is performed by the first pitch converter 25 disposed on the main transport mechanism WTR side of the pusher mechanism 21. In other words, the second-stage pitch conversion is performed at a position where throughput of the second-stage pitch conversion is not reduced. This makes it possible to efficiently process the substrates W.

Further, the plurality of substrates aligned at the unequal pitch is the plurality of substrates W aligned at the unequal pitch where the first interval TN1 narrower than the reference pitch and the second interval TN2 narrower than the reference pitch and wider than the first interval TN1 are alternately repeated. The equal pitch is equal to the sum of the first interval TN1 and the second interval TN2. The plurality of substrates W aligned at the narrow pitch is the plurality of substrates W aligned at the first interval TN1 repeated. In this way, the second-stage pitch conversion is performed slowly because the second interval TN2 at the unequal pitch formed by the first-stage pitch conversion is narrowed to the first interval TN1. Accordingly, the second-stage pitch conversion can be slowly performed at the position where the throughput of the first-stage pitch conversion is not reduced.

Further, the carry-in mechanism 71 causes the chuck 77 to traverse along the first traverse path, the chuck 77 collectively holding the plurality of substrates W aligned at the unequal pitch and received from the pusher member 55. The carry-out mechanism 75 causes the chuck 79 to traverse along the second traverse path, the chunk 79 collectively holding the plurality of substrates W aligned at the unequal pitch to be delivered to the pusher member 55. The first pitch converter 25 receives the plurality of substrates W aligned at the unequal pitch, and aligns, at the narrow pitch, the plurality of substrates W aligned at the unequal pitch. The second pitch converter 26 receives the plurality of substrates W aligned at the narrow pitch, and aligns, at the unequal pitch, the plurality of substrates W aligned at the narrow pitch. In this way, the two-stage pitch conversion is performed separately for the pusher mechanism 21, the first pitch converter 25, and the second pitch converter 26. In addition, the pitch conversion is performed separately for the first pitch converter 25 and the second pitch converter 26 before and after the processing in the processing block 7. Therefore, the throughput of the second-stage pitch conversion is not reduced. This makes it possible to efficiently process the Further, the intermediary mechanism 73 raises, along the substrate carry-in position, the chuck 78 that collectively holds the plurality of substrates W aligned at the narrow pitch. The substrate transfer position is a position where the plurality of substrates W aligned at the unequal pitch is collectively carried from the pusher member 55 to the chuck 78. The substrate carry-in position is a position where the plurality of substrates W aligned at the narrow pitch is collectively carried from the chuck 78 to the main transport mechanism WTR. The first pitch converter 25 moves up along the substrate carry-in position to carry in the plurality of substrates W aligned at the unequal pitch from the chuck 77. The chuck 78 moves up along the substrate carry-in position Pin to carry in the plurality of substrates W aligned at the narrow pitch from the first pitch converter 25. The first pitch converter 25 is disposed at the substrate carry-in position Pin. This makes it possible to efficiently perform the pitch conversion by the first pitch converter 25 during the substrate carry-in processing performed among the chuck 77, the first pitch converter 25, the chuck 78, and the main transport mechanism WTR.

Further, the first pitch converter 25 is disposed below the chuck 78. This makes it possible to perform an operation in the first pitch converter 25 and an operation in the chuck 78 at the same time, partially at the same time, or at approximately the same timing.

Further, the first pitch converter 25 is disposed below the first traverse path Pin. This makes it possible to perform an operation in the chuck 77, the operation in the first pitch converter 25, and the operation in the chuck 78 at the same time, partially at the same time, or at approximately the same timing.

Further, the second pitch converter 26 receives the plurality of substrates W aligned at the narrow pitch from the main transport mechanism WTR to carry out the plurality of substrates W aligned at the unequal pitch to the chuck 79. The second pitch converter 26 is disposed at the substrate carry-out position Pout. This makes it possible to efficiently perform the pitch conversion by the second pitch converter 26 during the substrate carry-out processing.

Further, the second pitch converter 26 is disposed below the second traverse path Pout. This makes it possible to perform an operation in the second pitch converter 26 and an operation in the chuck 79 at the same time, partially at the same time, or at approximately the same timing.

Further, the second pitch converter 26 is disposed above the first pitch converter 25. This makes it possible to perform the operation in the first pitch converter 25 and the operation in the second pitch converter 26 at the same time, partially at the same time, or at approximately the same timing.

Further, the second pitch converter 26 is disposed above the chuck 78. This makes it possible to perform the operation in the first pitch converter 25, the operation in the chuck 79, and the operation in the second pitch converter at the same time, partially at the same time, or at approximately the same timing.

Further, the first traverse path Pin and the second traverse path Pout cross each other at the predetermined angle α, the pusher mechanism 21 is disposed at the position (Po) where the first traverse path Pin and the second traverse path Pout cross each other at the predetermined angle α, and the first pitch converter 25 and the second pitch converter 26 are disposed apart from each other at a predetermined angle. This makes it possible to separate the first pitch converter 25 and the second pitch converter 26 from each other at the positions (substrate carry-in position Pin and substrate carry-out position Pout) where the interference is less likely to occur.

Example 2

Next, Example 2 of the present invention will be described with reference to the drawings. Note that description overlapping with that in Example 1 will be omitted.

Figure 27:
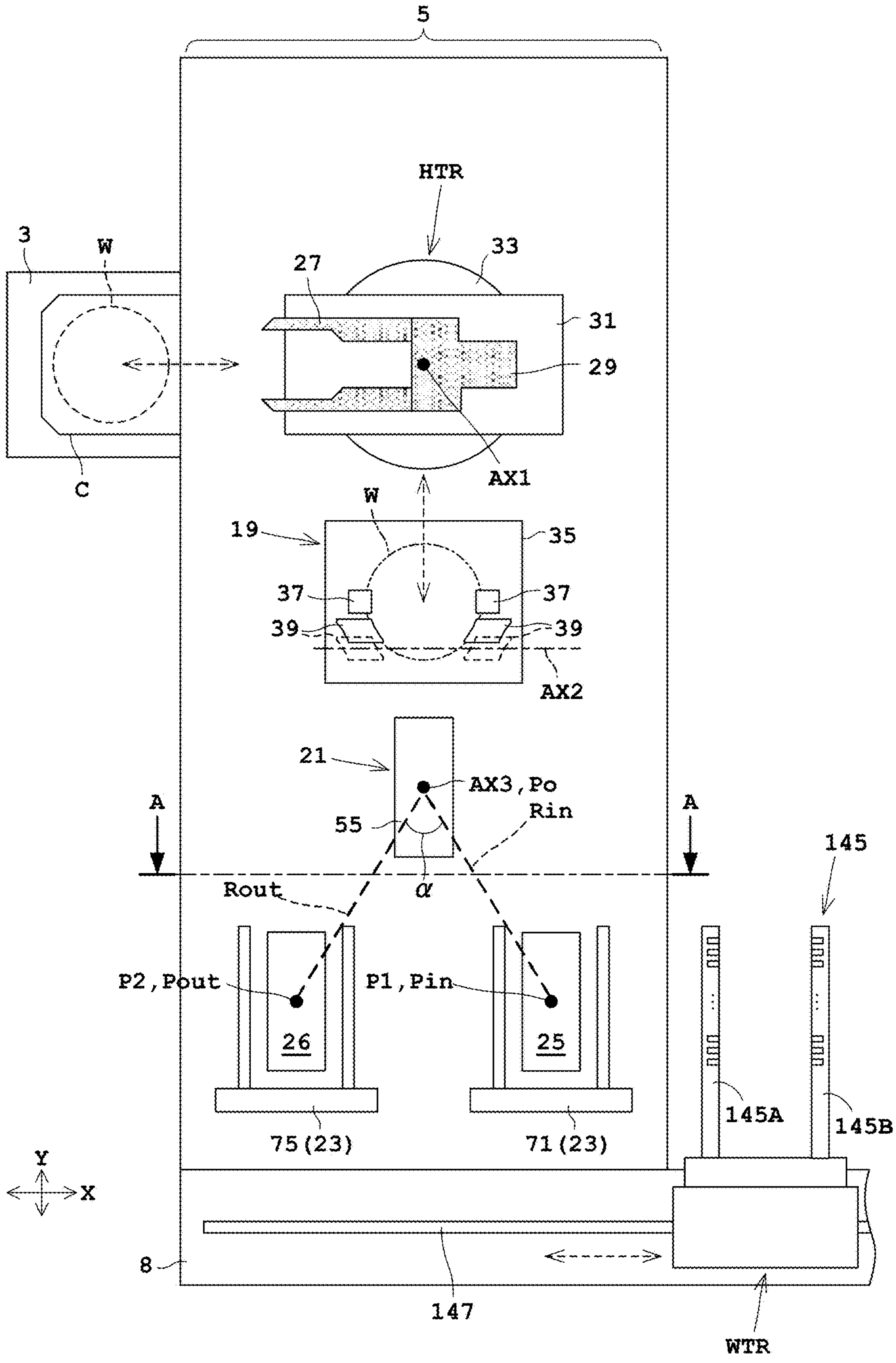
FIG. 27 is a plan view illustrating configurations of a transfer block and a periphery thereof according to Example 2.
Figure 28:
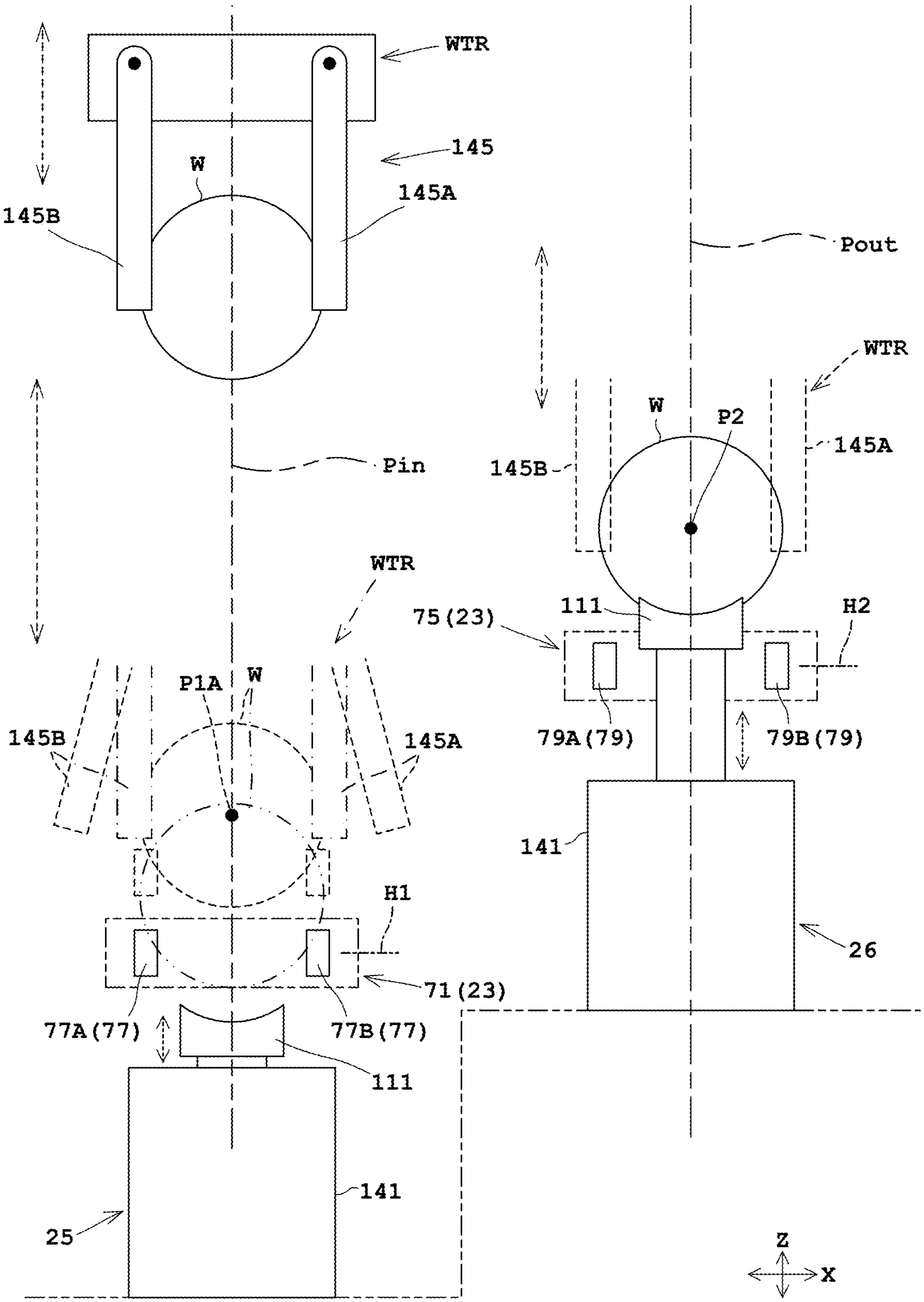
FIG. 28 is a side view illustrating the delivery mechanism, the two pitch converters, and the like when viewed as indicated by arrows A-A in FIG. 27.

FIG. 27 is a plan view illustrating configurations of the transfer block 5 and the periphery thereof according to Example 2. FIG. 28 is a side view illustrating the delivery mechanism 23, the two pitch converters 25, 26, and the like when viewed as indicated by arrows A-A in FIG. 27. The substrate processing apparatus 1 according to Example 2 is different from the substrate processing apparatus 1 according to Example 1 in that the intermediary mechanism 73 is not included.

In other words, the main transport mechanism WTR receives the 50 substrates W aligned at the narrow pitch held by the first pitch converter 25 without the intermediary mechanism 73. For example, the main transport mechanism WTR moves down to a height (a first delivery position P1A in the present example) when the first pitch converter 25 performs the pitch conversion. The first pitch converter 25 carries, into the main transport mechanism WTR, the 50 substrates aligned at the narrow pitch at the height when the pitch conversion is performed. Note that the first delivery position PIA may be higher than the position illustrated in the present example as long as the first pitch converter 25 can move up to a position higher than the height when the pitch conversion is performed.

According to Example 2, the first pitch converter 25 receives the plurality of substrates W aligned at the unequal pitch from the chuck 77 to carry the plurality of substrates W aligned at the narrow pitch into the main transport mechanism WTR. This makes it possible to efficiently carry the substrates W among the chuck 77, the first pitch converter 25, and the main transport mechanism WTR.

Example 3

Next, Example 3 of the present invention will be described with reference to the drawings. Note that description overlapping with those in Examples 1 and 2 will be omitted.

Figure 29:
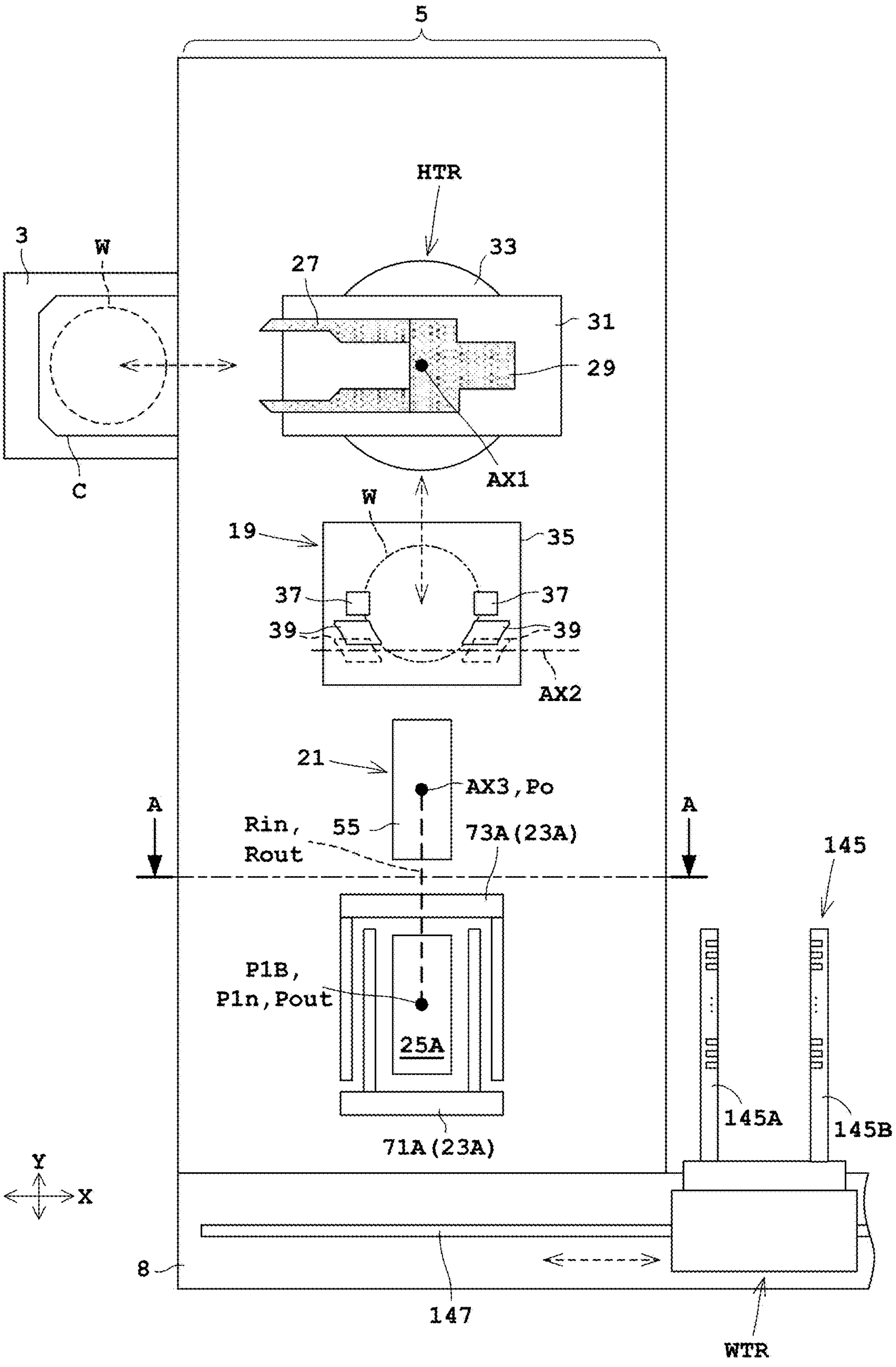
FIG. 29 is a plan view illustrating configurations of a transfer block and a periphery thereof according to Example 3.
Figure 30:
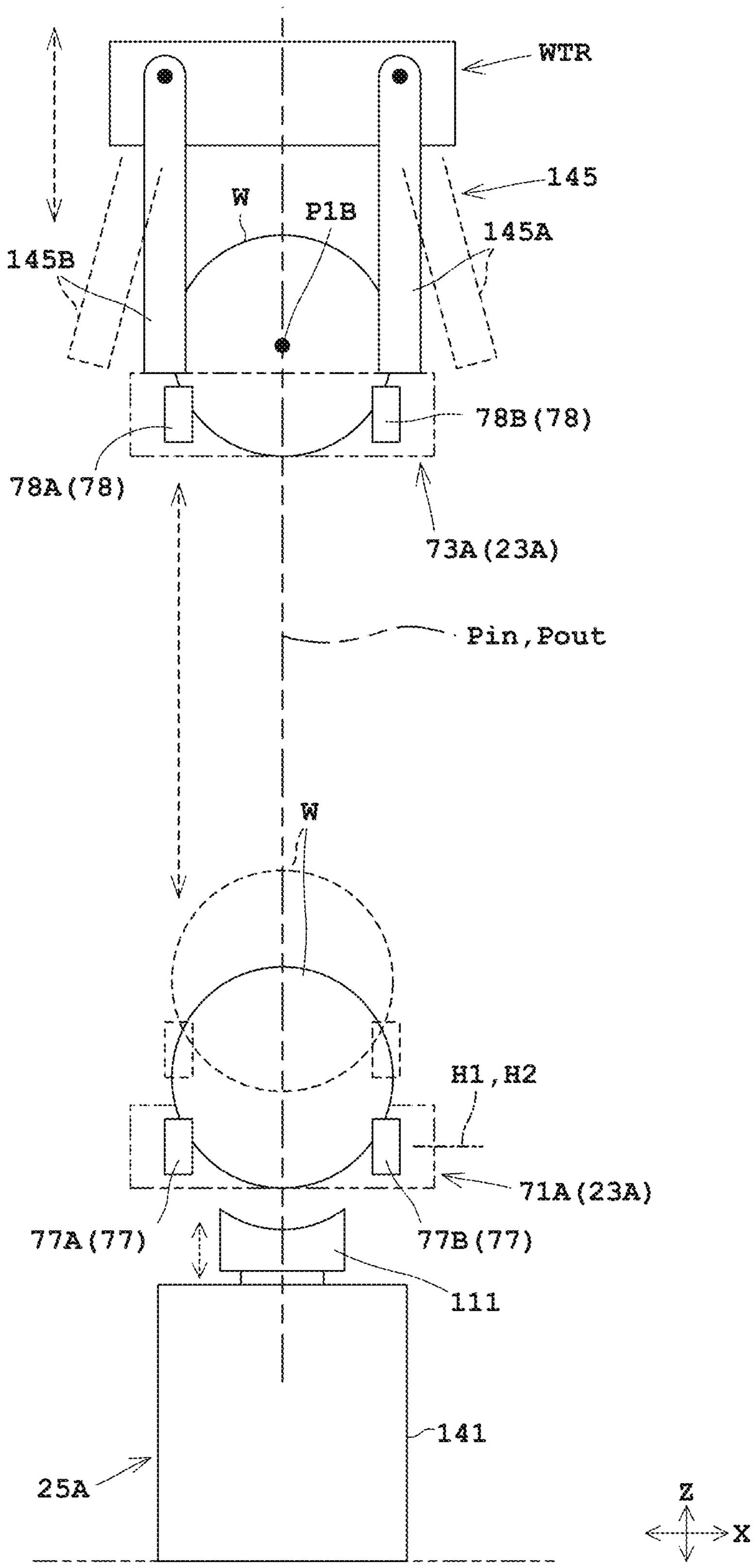
FIG. 30 is a side view illustrating the delivery mechanism, the two pitch converters, and the like when viewed as indicated by arrows A-A in FIG. 29.

FIG. 29 is a plan view illustrating configurations of the transfer block 5 and the periphery thereof according to Example 3. FIG. 28 is a side view illustrating a delivery mechanism 23A, one pitch converter 25A, and the like when viewed as indicated by arrows A-A in FIG. 30.

The substrate processing apparatus 1 according to Example 1 includes the delivery mechanism 23 having two pitch converter 25, 26. In this regard, the substrate processing apparatus 1 according to Example 3 includes the delivery mechanism 23A having one pitch converter 25A.

In other words, the delivery mechanism 23A includes a carry-in/carry-out mechanism 71A and an intermediary mechanism 73A. The carry-in/carry-out mechanism 71A carries the plurality of substrates W aligned at the unequal pitch from the pusher member 55 to the pitch converter 25A, and carries the plurality of substrates W aligned at the unequal pitch from the pitch converter 25A to the pusher member 55. The intermediary mechanism 73A carries the plurality of substrates W aligned at the narrow pitch from the pitch converter 25A to a delivery position P1B, and carries the plurality of substrates W aligned at the narrow pitch from the delivery position P1B to the pitch converter 25A.

The carry-in/carry-out mechanism 71A is disposed at a carry-in height position H1 or a carry-in height position H3. The carry-in height position H1 and the carry-in height position H3 are at the same height.

The carry-in/carry-out mechanism 71A includes the chuck 77, the opening/closing portion 81, the front-back moving portion 83, and the widthwise moving portion 85. The chuck 77, the opening/closing portion 81, the front-back moving portion 83, and the widthwise moving portion 85 are used for both carrying in and out the plurality of substrates W aligned at the unequal pitch.

The intermediary mechanism 73A includes the chuck 78, the opening/closing portion 101, the arm 103, and the lifting portion 105. The chuck 78, the opening/closing portion 101, the arm 103, and the lifting portion 105 are used for both carrying in and out the plurality of substrates W aligned at the narrow pitch. Note that the intermediary mechanism 73A may be used only for carrying in the substrates W.

The pitch converter 25 is used for both conversion of the plurality of substrates W from being aligned at the unequal pitch to being aligned at the narrow pitch and conversion of the plurality of substrates W from being aligned at the narrow pitch to being aligned at the unequal pitch.

The chuck 77 described above corresponds to the "traverse holder" of the present invention. The traverse mechanism 71A described above corresponds to the "traverse mechanism" of the present invention. The chuck 78 described above corresponds to the "intermediary holder" of the present invention.

In the substrate processing apparatus 1 according to Example 3, a traverse carry-out mechanism 71A causes the chuck 77 that collectively holds the plurality of substrates W aligned at the unequal pitch and received from the pusher member 55 to traverse along the traverse paths Rin, Rout between the substrate transfer position Po and the substrate delivery positions Pin, Pout. The intermediary mechanism 73A raises and lowers the chuck 78 that collectively holds the plurality of substrates W aligned at the narrow pitch along the substrate delivery positions Pin, Pout. The substrate transfer position Po is a position where the plurality of substrates W aligned at the unequal pitch is collectively delivered between the pusher member 55 and the chuck 77. The substrate delivery positions Pin, Pout are positions where the plurality of substrates W aligned at the narrow pitch is collectively delivered between the chuck 78 and the main transport mechanism WTR. The pitch converter 25A moves up and down along the substrate delivery positions Pin, Pout to deliver the plurality of substrates W aligned at the unequal pitch to and from the chuck 77. The chuck 77 moves up and down along the substrate delivery positions Pin, Pout to deliver the plurality of substrates W aligned at the narrow pitch to and from the pitch converter 25A. The pitch converter 25A is disposed at the substrate delivery positions Pin, Pout. This makes it possible to separate a position of the pitch converter 25 that performs the second-stage pitch conversion from the pusher mechanism 21 that performs the first-stage pitch conversion. In other words, the second-stage pitch conversion is performed at the position where the throughput of the first-stage pitch conversion is not reduced. This makes it possible to efficiently process the substrates W.

Further, the pitch converter 25A is disposed below the chuck 78.

This makes it possible to perform an operation in the pitch converter 25A and the operation in the chuck 78 at the same time, partially at the same time, or at approximately the same timing.

Further, the pitch converter 25A is disposed below the traverse path. This makes it possible to perform the operation in the chuck 77, the operation in the pitch converter 25A, and the operation in the chuck 78 at the same time, partially at the same time, or at approximately the same timing.

Example 4

Next, Example 4 of the present invention will be described with reference to the drawings. Note that description overlapping with those in Examples 1 to 3 will be omitted.

Figure 31:
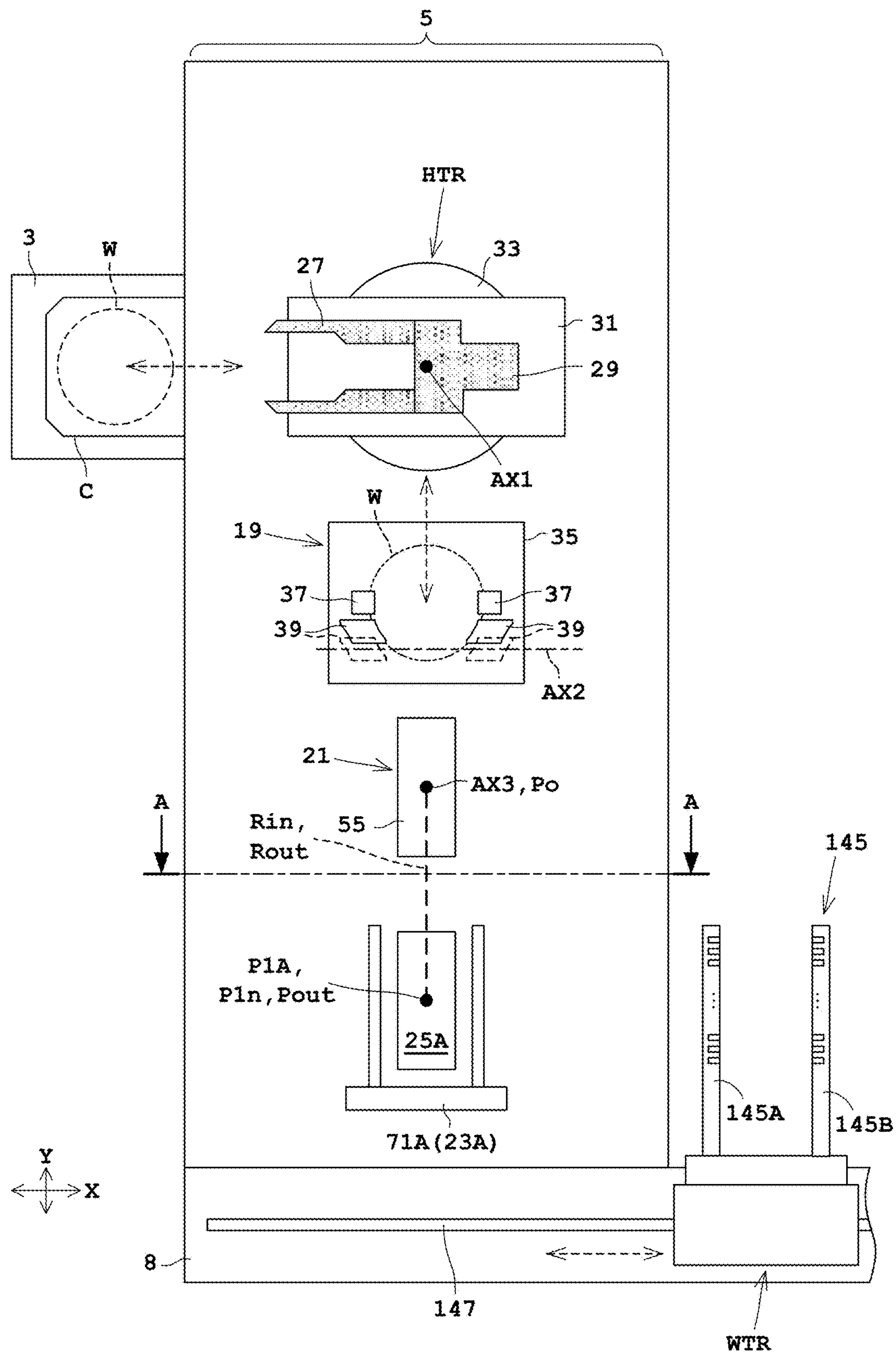
FIG. 31 is a plan view illustrating configurations of a transfer block and a periphery thereof according to Example 4.
Figure 32:
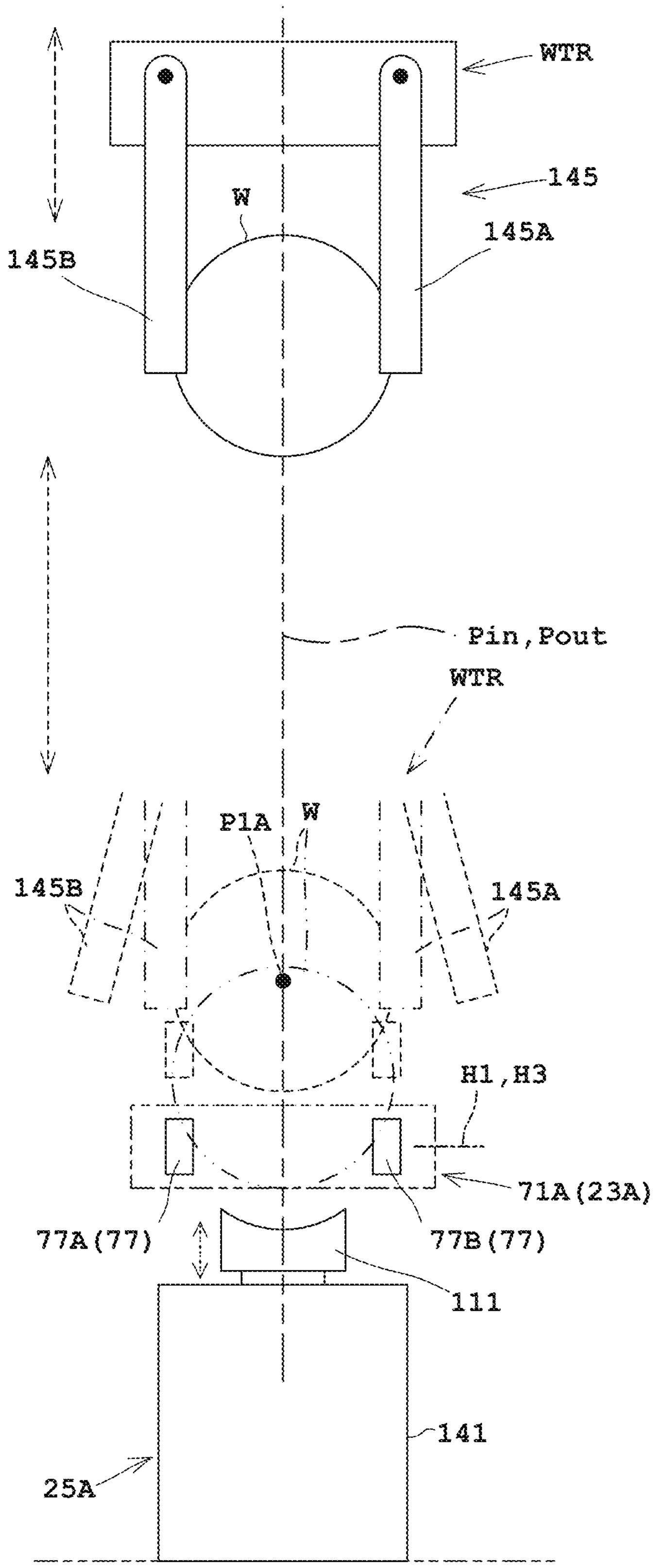
FIG. 32 is a side view illustrating the delivery mechanism, the two pitch converters, and the like when viewed as indicated by arrows A-A in FIG. 31.

FIG. 31 is the plan view illustrating configurations of the transfer block and the periphery thereof according to Example 4. FIG. 32 is the side view illustrating the delivery mechanism, the two pitch converters, and the like when viewed as indicated by arrows A-A in FIG. 31.

The substrate processing apparatus 1 according to Example 4 includes the delivery mechanism 23A having one pitch converter 25A as in Example 3. The substrate processing apparatus 1 according to Example 4 is different from the substrate processing apparatus 1 according to Example 3 in that the intermediary mechanism 73A is not included.

In other words, the main transport mechanism WTR receives the 50 substrates W aligned at the narrow pitch held by the pitch converter 25A without the intermediary mechanism 73A. For example, the main transport mechanism WTR moves down to a height (the first delivery position P1A in the present example) when the pitch converter 25A performs the pitch conversion. The pitch converter 25A carries, into the main transport mechanism WTR, the 50 substrates aligned at the narrow pitch at the height when the pitch conversion is performed.

In the substrate processing apparatus 1 according to Example 4, a carry-in/carry-out mechanism 71A causes the chuck 77 that collectively holds the plurality of substrates W aligned at the unequal pitch and received from the pusher member 55 to traverse along the traverse paths Rin, Rout between the substrate transfer position Po and the substrate delivery positions Pin, Pout. The substrate transfer position Po is a position where the plurality of substrates W aligned at the unequal pitch is collectively delivered between the pusher member 55 and the chuck 77. The substrate delivery positions Pin, Pout are positions where the plurality of substrates aligned at the narrow pitch is collectively delivered between the pitch converter 25A and the main transport mechanism WTR. The pitch converter 25A moves up and down along the substrate delivery positions Pin, Pout to deliver the plurality of substrates W aligned at the unequal pitch to and from the chuck 77. The pitch converter 25A is disposed at the substrate delivery positions Pin, Pout. This makes it possible to separate a position of the pitch converter 25A that performs the second-stage pitch conversion from the pusher mechanism 21 that performs the first-stage pitch conversion. In other words, the second-stage pitch conversion is performed at the position where the throughput of the first-stage pitch conversion is not reduced. This makes it possible to efficiently process the Further, the pitch converter 25A is disposed below the traverse paths Rin, Rout. This makes it possible to perform the operation in the chuck 77 and the operation in the pitch converter 25A at the same time, partially at the same time, or at approximately the same timing.

Example 5

Next, Example 5 of the present invention will be described with reference to the drawings. Note that description overlapping with those in Examples 1 to 4 will be omitted.

Figure 33:
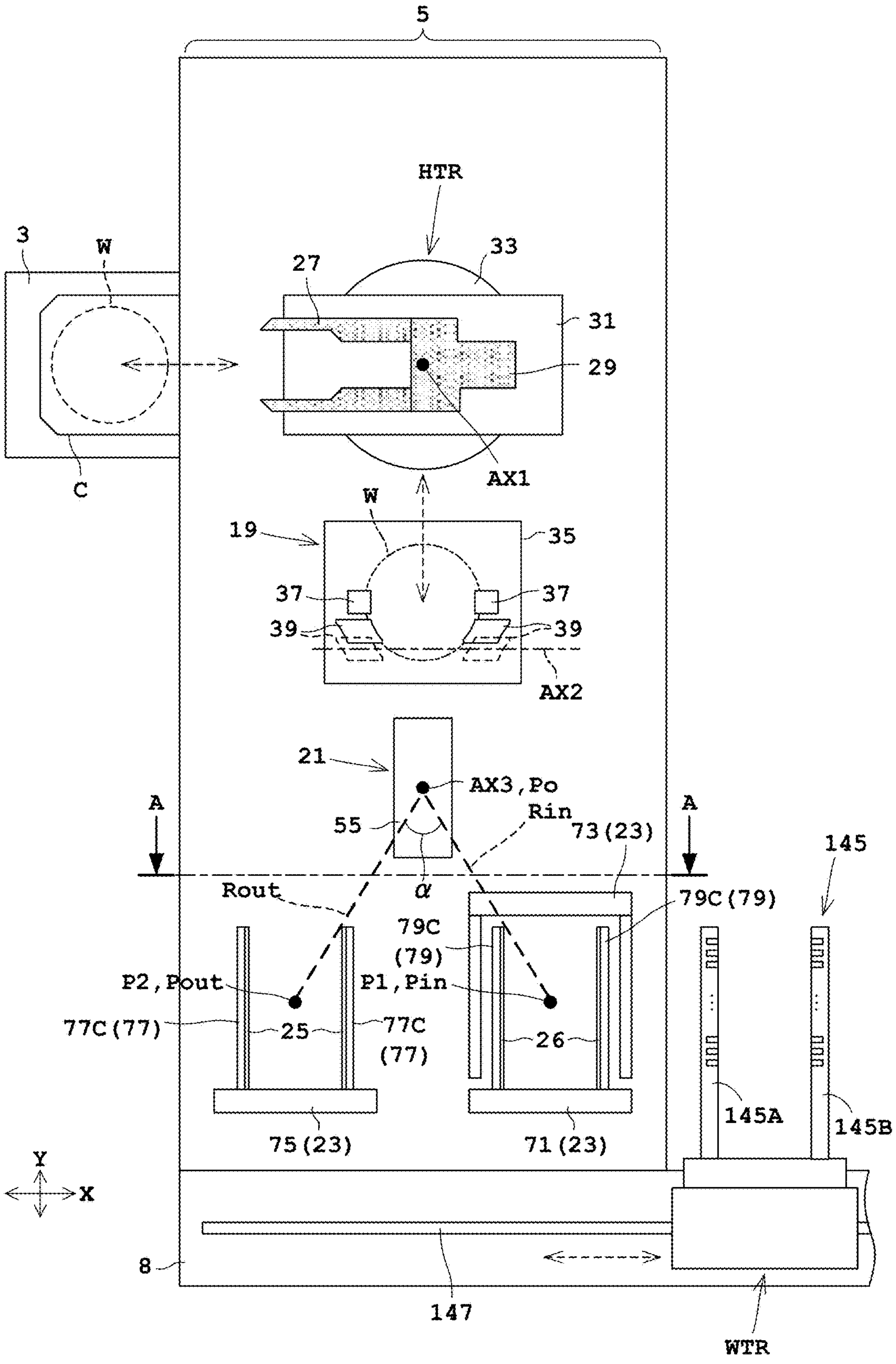
FIG. 33 is a plan view illustrating configurations of a transfer block and a periphery thereof according to Example 5.
Figure 34:
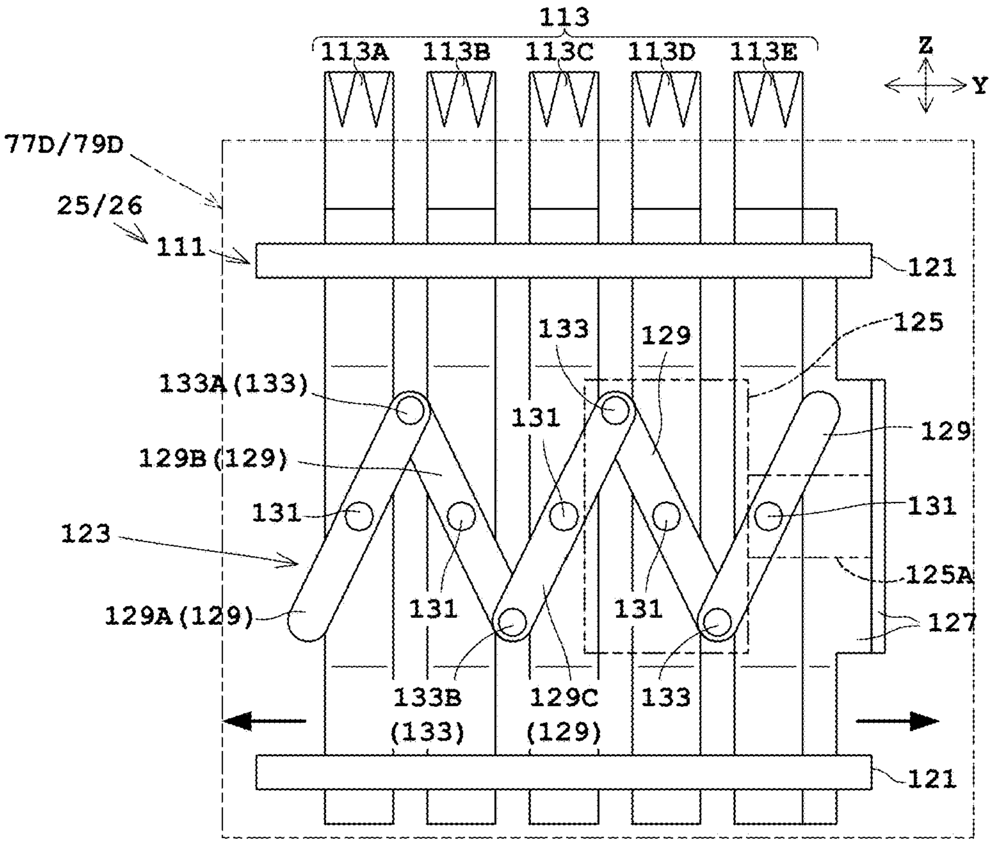
FIG. 34 is a side view illustrating an expansion/contraction mechanism of the pitch converter included in a pair of chuck members of the carry-in mechanism and a pair of chuck members of the carry-out mechanism.
Figure 35:
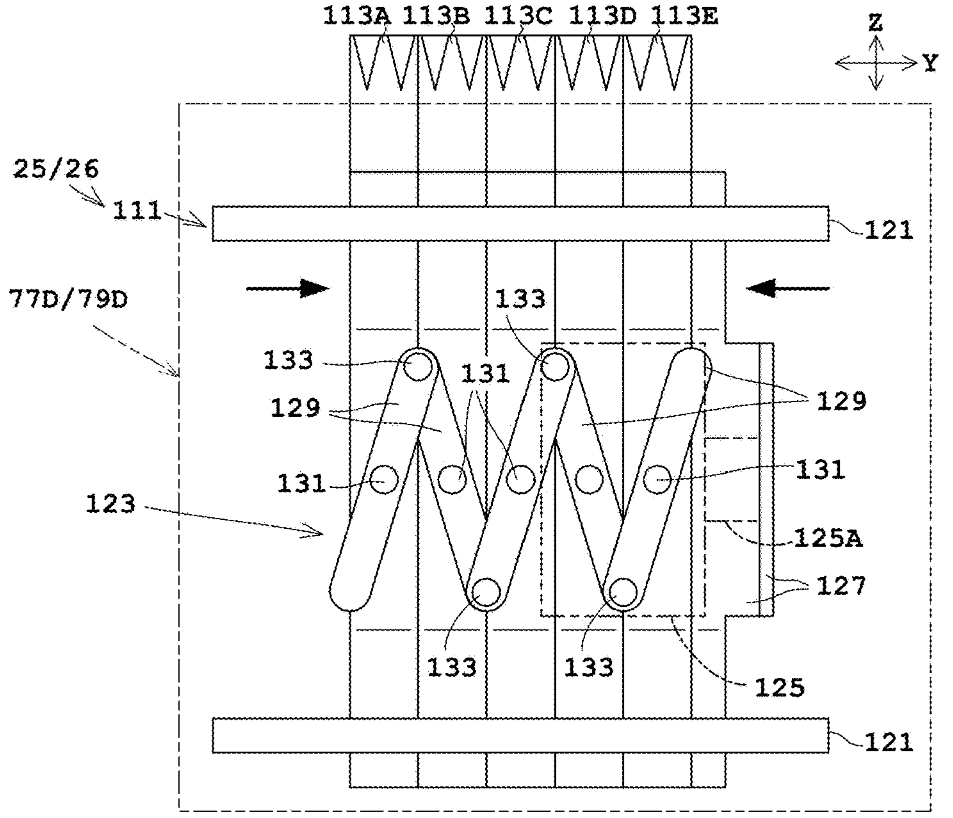
FIG. 35 is a side view illustrating the expansion/contraction mechanism of the pitch converter included in the pair of chuck members of the carry-in mechanism and the pair of chuck members of the carry-out mechanism.

FIG. 33 is a plan view illustrating configurations of the transfer block 5 and the periphery thereof according to Example 5. FIG. 34 is a side view illustrating expansion/contraction mechanisms of the pitch converters 25, 26 included in the pair of chuck members 77C, 77D of the carry-in mechanism 71 and the pair of chucks 79C, 79D of the carry-out mechanism 75. FIG. 34 is the side view illustrating the expansion/contraction mechanisms of the pitch converters 25, 26 included in the pair of chuck members 77C, 77D of the carry-in mechanism 71 and the pair of chucks 79C, 79D of the carry-out mechanism 75.

In Example 5, the first pitch converter 25 is integrally attached to the pair of chuck members 77C, 77D of the carry-in mechanism 71. The second pitch converter 26 is attached to the pair of chucks 79C, 79D of the carry-out mechanism 75. Specifically, the first pitch converter 25 is integrally attached to a side face of the pair of chuck members 77C, 77D of the carry-in mechanism 71. The second pitch converter 26 is attached to a side face of the pair of chucks 79C, 79D of the carry-out mechanism 75.

Expansion/contraction structures of the first pitch converter 25 and the second pitch converter 26 are the same as those in Example 1. In Example 1, the pitch converters 25, 26 are placed horizontally, while in Example 5, the pitch converters 25, 26 are placed vertically.

The holding grooves 113 of the carry-in mechanism 71 are attached to upper sides of the chuck members 77C, 77D, respectively. The holding grooves 113 of the carry-out mechanism 75 are attached to upper sides of the chucks 79C, 79D, respectively. Accordingly, in the carry-in mechanism 71, the substrates W are held on the upper sides of the chuck members 77C, 77D, respectively. In the carry-out mechanism 75, the substrates W are held on the upper sides of the chucks 79C, 79D, respectively.

According to Example 5, the first pitch converter 25 is included in the carry-in mechanism 71, and the second pitch converter 26 is included in the carry-out mechanism 75. This makes it possible to suppress the height of the substrate processing apparatus 1 as the first pitch converter 25 is integrated with the carry-in mechanism 71 and the second pitch converter 26 is integrated with the carry-out mechanism 75.

Note that this can also apply to the substrate processing apparatus 1 in which the carry-in mechanism 71 and the carry-out mechanism 75 are arranged vertically. This is because the height of the substrate processing apparatus 1 can be suppressed as the first pitch converter 25 is integrated with the carry-in mechanism 71 and the second pitch converter 26 is integrated with the carry-out mechanism 75.

Note that the present example can also be applied to the substrate processing apparatus 1 in which the carry-in mechanism 71 and the carry-out mechanism 75 are used in one mechanism (the carry-in/carry-out mechanism 71A). The present invention is not limited to the above examples, and can be implemented in a modified manner as follows.

(1) In the examples described above, in a case where the reference interval TN9 is, for example, 10 mm, the first interval TN1 is, for example, 3.333 mm, and the second interval TN2 is, for example, 6.666 mm. In this case, the first interval TN1 is equal to half of the second interval TN2. In this regard, the first interval TN1 may be smaller than half of the second interval TN2. For example, in the case where the reference interval TN9 is, for example, 10 mm, the first interval TN1 may be 3 mm, and the second interval TN2 may be 7 mm. Further, the first interval TN1 may be 2.5 mm, and the second interval TN2 may be 7.5 mm. Further, the second interval TN2 is preferably 2 to 3 times the first interval TN1.

For example, the two holding grooves 117 of each of the holding members 113 may be configured to be separated by the first interval TN1 (for example, 3 mm) that is smaller than half of the second interval TN2 (for example, 7 mm) and is larger than 0 mm. Further, the two holding grooves 117 of each of the holding members 113 may be configured to be separated by the first interval TN1 (for example, 3 mm) that is an interval larger than or equal to ⅓ times and smaller than or equal to ½ times the second interval TN2 (for example, 7 mm). Further, the two holding grooves 117 of each of the holding members 113 may be configured to be separated by the first interval TN1 (for example, 3.333 mm) that is an interval half of the second interval TN2 (for example, 6.666 mm).

(2) In each of the examples and Modification (1) described above, in the case where the reference interval TN9 is, for example, 10 mm, the first interval TN1 is, for example, 3.333 mm, and the second interval TN2 is, for example, 6.666 mm. In this regard, the first interval TN1 may be larger than an interval ⅓ times the reference interval TN9 (for example, 3.333 mm) and smaller than an interval ½ times the reference interval TN9 (for example, 5 mm).

(3) In the examples described above, in the pitch converters 25, 26, one holding member 113 is provided with two holding grooves 117, but one holding groove 117 may be configured to be provided for each of the holding members 113. In such configuration, two-stage pitch conversion different from that in the examples described above can be adopted. In other words, the pusher mechanism 21 combines the substrates W1 of the first substrate group and the substrates W2 of the second substrate group to form the plurality of substrates W aligned at a first narrow pitch narrower than the reference pitch. The first pitch converter 25 converts the plurality of substrates W from being aligned at the first narrow pitch to being aligned at a second narrow pitch narrower than the first narrow pitch. Since one holding groove 117 is provided for each of the holding members 113, the first pitch converter 25 can convert the first narrow pitch to the second narrow pitch.

According to this example, the plurality of substrates W aligned at the narrow interval is the plurality of substrates W aligned at the first narrow pitch narrower than the reference pitch. The plurality of substrates W aligned at the narrow pitch is the plurality of substrates W aligned at the second narrow pitch narrower than the first narrow pitch. In this way, the second-stage pitch conversion is performed slowly because the first narrow pitch formed by the first-stage pitch conversion is narrowed to the second narrow pitch. The second-stage pitch conversion is performed at the position where the throughput is not reduced. This makes it possible to efficiently process the substrates.

(4) In each of the examples and each of the modifications described above, the carry-in mechanism 71 is provided behind the carry-out mechanism 75, but the carry-in mechanism 71 may be provided before the carry-out mechanism 75. In other words, arrangements of the carry-in mechanism 71 and the carry-out mechanism 75 may be reversed. In this case, the carry-in mechanism 71 transports the plurality of substrates W from the pusher member 55 to the second pitch converter 26, and the carry-out mechanism 73 transports the plurality of substrates W from the first pitch converter 25 to the pusher member 55.

(5) In each of the examples and each of the modifications described above, the intermediary mechanism 73 transports the plurality of substrates W aligned at the narrow pitch from the first pitch converter 25 to the main transport mechanism WTR. In this regard, the intermediary mechanism 73 may transport the plurality of substrates W aligned at the narrow pitch from the main transport mechanism WTR to the second pitch converter 26.

(6) In each of the examples and each of the modifications described above, the chuck 77 (the pair of chuck members 77A, 77B) of the carry-in mechanism 71 is opened and closed by the opening/closing portion 81. In this regard, the chuck 77 may not be configured to be opened and closed.

(7) In each of the examples and each of the modifications described above, the chuck 79 (the pair of chuck members 79A, 79B) of the carry-out mechanism 75 is opened and closed by the opening/closing portion 89. In this regard, the chuck 79 may not be configured to be opened and closed.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate processing apparatus processing substrates, the substrate processing apparatus comprising:

an attitude changing mechanism configured to change attitudes of the substrates between a horizontal holding attitude in which a substrate group of the substrates in a horizontal attitude aligned at an equal pitch in a vertical direction is held and a vertical holding attitude in which a substrate group of the substrates in a vertical attitude aligned at the equal pitch in a horizontal direction is held;

a pusher mechanism including a pusher member configured to combine a second substrate group in the vertical holding attitude held by the attitude changing mechanism and a first substrate group in the vertical holding attitude delivered in advance from the attitude changing mechanism to hold a plurality of the substrates aligned at a narrow interval narrower than the equal pitch;

a pitch converter configured to receive the plurality of the substrates aligned at the narrow interval, and align, at a narrow pitch narrower than the equal pitch, the plurality of the substrates aligned at the narrow interval;

a substrate processor configured to collectively process the plurality of the substrates aligned at the narrow pitch; and a main transport mechanism configured to collectively transport the plurality of the substrates aligned at the narrow pitch to the substrate processor, wherein the pitch converter is disposed on the main transport mechanism side of the pusher mechanism.

2. The substrate processing apparatus according to claim 1, wherein the plurality of the substrates aligned at the narrow interval is a plurality of the substrates aligned at an unequal pitch where a first interval narrower than the equal pitch and a second interval narrower than the equal pitch and wider than the first interval are alternately repeated, the equal pitch is equal to a sum of the first interval and the second interval, and the plurality of the substrates aligned at the narrow pitch is a plurality of the substrates aligned at the first interval repeated.

3. The substrate processing apparatus according to claim 1, wherein the plurality of the substrates aligned at the narrow interval is a plurality of the substrates aligned at a first narrow pitch narrower than the equal pitch, and the plurality of the substrates aligned at the narrow pitch is a plurality of the substrates aligned at a second narrow pitch narrower than the first narrow pitch.

4. The substrate processing apparatus according to claim 1, comprising a traverse mechanism configured to cause a traverse holder collectively holding the plurality of the substrates aligned at the narrow interval and received from the pusher member to traverse along a traverse path between a substrate transfer position and a substrate delivery position, wherein the substrate transfer position is a position where the plurality of the substrates aligned at the narrow interval is collectively delivered between the pusher member and the traverse holder, the substrate delivery position is a position where the plurality of the substrates aligned at the narrow pitch is collectively delivered between the pitch converter and the main transport mechanism, the pitch converter moves up and down along the substrate delivery position to deliver the plurality of the substrates aligned at the narrow interval to and from the traverse holder, and the pitch converter is disposed at the substrate delivery position.

5. The substrate processing apparatus according to claim 4, wherein the pitch converter is disposed below the traverse path.

6. The substrate processing apparatus according to claim 1, comprising:

a traverse mechanism configured to cause a traverse holder collectively holding the plurality of the substrates aligned at the narrow interval and received from the pusher member to traverse along a traverse path between a substrate transfer position and a substrate delivery position; and an intermediary mechanism configured to raise and lower, along the substrate delivery position, an intermediary holder collectively holding the plurality of the substrates aligned at the narrow pitch, wherein the substrate transfer position is a position where the plurality of the substrates aligned at the narrow interval is collectively delivered between the pusher member and the traverse holder, the substrate delivery position is a position where the plurality of the substrates aligned at the narrow pitch is collectively delivered between the intermediary holder and the main transport mechanism, the pitch converter moves up and down along the substrate delivery position to deliver the plurality of the substrates aligned at the narrow interval to and from the traverse holder, the intermediary holder moves up and down along the substrate delivery position to deliver the plurality of the substrates aligned at the narrow pitch to and from the pitch converter, and the pitch converter is disposed at the substrate delivery position.

7. The substrate processing apparatus according to claim 6, wherein the pitch converter is disposed at a position below the intermediary holder.

8. The substrate processing apparatus according to claim 6, wherein the pitch converter is disposed below the traverse path.

9. The substrate processing apparatus according to claim 1, comprising:

a first traverse mechanism configured to cause, to traverse along a first traverse path, a first traverse holder collectively holding the plurality of the substrates aligned at the narrow interval and received from the pusher member; and a second traverse mechanism configured to cause, to traverse along a second traverse path, a second traverse holder collectively holding the plurality of the substrates aligned at the narrow interval and to be delivered to the pusher member, wherein the pitch converter includes:

a first pitch converter configured to receive the plurality of the substrates aligned at the narrow interval, and align, at the narrow pitch, the plurality of the substrates aligned at the narrow interval; and a second pitch converter configured to receive the plurality of the substrates aligned at the narrow pitch, and align, at the narrow interval, the plurality of the substrates aligned at the narrow pitch.

10. The substrate processing apparatus according to claim 9, wherein the first traverse path is a path between a substrate transfer position and a substrate carry-in position, the second traverse path is a path between a substrate carry-out position and a substrate transfer position, the first traverse path and the second traverse path are provided at positions apart from each other in a lateral direction, the first pitch converter is disposed at the substrate carry-in position, and the second pitch converter is disposed at the substrate carry-out position.

11. The substrate processing apparatus according to claim 10, wherein the first pitch converter receives the plurality of the substrates aligned at the narrow interval from the first traverse holder to carry the plurality of the substrates aligned at the narrow pitch into the main transport mechanism.

12. The substrate processing apparatus according to claim 10, comprising an intermediary mechanism configured to raise, along the substrate carry-in position, an intermediary holder collectively holding the plurality of the substrates aligned at the narrow pitch, wherein the substrate transfer position is a position where the plurality of the substrates aligned at the narrow interval is collectively carried from the pusher member to the first traverse holder, the substrate carry-in position is a position where the plurality of the substrates aligned at the narrow pitch is collectively carried from the intermediary holder to the main transport mechanism, the first pitch converter moves up along the substrate carry-in position to carry in the plurality of the substrates aligned at the narrow interval from the first traverse holder, the intermediary holder moves up along the substrate carry-in position to carry in the plurality of the substrates aligned at the narrow pitch from the pitch converter, and the first pitch converter is disposed at the substrate carry-in position.

13. The substrate processing apparatus according to claim 12, wherein the first pitch converter is disposed below the intermediary holder.

14. The substrate processing apparatus according to claim 13, wherein the first pitch converter is disposed below the first traverse path.

15. The substrate processing apparatus according to claim 10, wherein the second pitch converter receives the plurality of the substrates aligned at the narrow pitch from the main transport mechanism to carry out the plurality of the substrates aligned at the narrow interval to the second traverse holder, and is disposed at the substrate carry-out position.

16. The substrate processing apparatus according to claim 15, wherein the second pitch converter is disposed below the second traverse path.

17. The substrate processing apparatus according to claim 9, wherein the second pitch converter is disposed above the first pitch converter.

18. The substrate processing apparatus according to claim 10, wherein the second pitch converter is disposed above the intermediary holder.

19. The substrate processing apparatus according to claim 9, wherein the first traverse path and the second traverse path cross each other at a predetermined angle, the pusher mechanism is disposed at a position where the first traverse path and the second traverse path cross each other at the predetermined angle, and the first pitch converter and the second pitch converter are disposed apart from each other at the predetermined angle.

20. The substrate processing apparatus according to claim 1, comprising a traverse mechanism configured to cause a traverse holder collectively holding the plurality of the substrates aligned at the narrow interval and received from the pusher member to traverse along a traverse path between a substrate transfer position and a substrate delivery position, wherein the pitch converter is included in the traverse mechanism.

21. The substrate processing apparatus according to claim 9, wherein the first pitch converter is included in the first traverse mechanism, and the second pitch converter is included in the second traverse mechanism.

* * * * *